United States Patent
Ang et al.

(10) Patent No.: US 10,269,860 B2
(45) Date of Patent: Apr. 23, 2019

(54) SENSOR ELEMENT, IMAGE SENSOR, METHODS OF FORMING AND OPERATING THE SAME

(71) Applicant: NANYANG TECHNOLOGICAL UNIVERSITY, Singapore (SG)

(72) Inventors: Diing Shenp Ang, Singapore (SG); Yu Zhou, Singapore (SG)

(73) Assignee: NANYANG TECHNOLOGICAL UNIVERSITY, Singapore (SG)

( * ) Notice: Subject to any disclaimer, the term of this patent is extended or adjusted under 35 U.S.C. 154(b) by 0 days.

(21) Appl. No.: 15/579,307

(22) PCT Filed: Jul. 19, 2016

(86) PCT No.: PCT/SG2016/050343
§ 371 (c)(1),
(2) Date: Dec. 4, 2017

(87) PCT Pub. No.: WO2017/018933
PCT Pub. Date: Feb. 2, 2017

(65) Prior Publication Data
US 2018/0166495 A1  Jun. 14, 2018

(30) Foreign Application Priority Data
Jul. 24, 2015 (SG) .......................... 10201505778X

(51) Int. Cl.
*H01L 27/146* (2006.01)
*G11C 13/00* (2006.01)
(Continued)

(52) U.S. Cl.
CPC .... *H01L 27/14683* (2013.01); *G11C 13/0007* (2013.01); *G11C 13/047* (2013.01);
(Continued)

(58) Field of Classification Search
CPC ......... H01L 27/14683; H01L 27/14601; H01L 45/08; H01L 45/085; H01L 45/1233;
(Continued)

(56) References Cited

U.S. PATENT DOCUMENTS

2010/0097838 A1* 4/2010 Tanaka ................. G11C 13/047
365/112
2012/0205649 A1* 8/2012 Hattori .............. H01L 27/14632
257/43

OTHER PUBLICATIONS

E. R. Fossum, "CMOS Image Sensors: Electronic Camera-On-A-Chip", IEEE Trans. Electron Devices, vol. 44, No. 10, pp. 1689-1698, Oct. 1997 (10 pages total).
(Continued)

*Primary Examiner* — Sitaramarao S Yechuri
(74) *Attorney, Agent, or Firm* — Sughrue Mion, PLLC

(57) ABSTRACT

A sensor element for sensing optical light may be provided. The sensor element may include a first electrode for electrically coupling to a first supply voltage, a second electrode for electrically coupling to a second supply voltage, and an oxide dielectric element between the first electrode and the second electrode. The oxide dielectric element may be configured to form a conductive filament upon a potential difference between the first supply voltage and the second supply voltage exceeding a threshold level, thereby decreasing a resistance of the oxide dielectric element. The sensor element may also include a detector. The first electrode may be configured to allow the optical light to pass through the first electrode to the oxide dielectric element. The detector may be configured to detect an increase in the resistance of the oxide dielectric element upon the oxide dielectric element receiving the optical light.

11 Claims, 62 Drawing Sheets

(51) Int. Cl.
*H01L 45/00* (2006.01)
*G11C 13/04* (2006.01)
*H01L 51/44* (2006.01)

(52) U.S. Cl.
CPC ........ *H01L 27/14601* (2013.01); *H01L 45/08* (2013.01); *H01L 45/085* (2013.01); *H01L 45/1233* (2013.01); *H01L 45/145* (2013.01); *H01L 45/146* (2013.01); *H01L 45/147* (2013.01); *H01L 45/1641* (2013.01); *H01L 51/441* (2013.01); *G11C 2013/0083* (2013.01); *G11C 2213/32* (2013.01)

(58) Field of Classification Search
CPC ... H01L 45/145; H01L 45/146; H01L 45/147; H01L 45/1641; H01L 51/441; G11C 13/0007; G11C 13/047
See application file for complete search history.

(56) References Cited

OTHER PUBLICATIONS

A. El Gamal and H. Eltoukhy, "CMOS image sensors", IEEE Circuits and Devices, vol. 21, No. 3, pp. 6-20, May-Jun. 2005 (15 pages total).
M. Bigas, E. Cabruja, J. Forest, and J. Salvi, "Review of CMOS image sensors", Microelectronics. J., vol. 37, No. 5, pp. 433-451, May 2006 (19 pages total).
G. Agranov, S. Smith, R.Mauritzson, S. Chieh, U. Boettiger, X. Li, X. Fan, A. Dokoutchaev, B. Gravelle, H. Lee, W. Qian, and R. Johnson, "Pixel continues to shrink . . . small pixels for novel CMOS image sensors", Proc. Int. Image Sensor Workshop, 2011, pp. 1-4 (4 pages total).
S. G. Wuu, C. C. Wang, B. C. Hseih, Y. L. Tu, C. H. Tseng, T. H. Hsu, R. S. Hsiao, S. Takahashi, R. J. Lin, C. S. Tsai, Y. P. Chao, K. Y. Chou, P. S. Chou, H. Y. Tu, F. L. Hsueh, and L. Tran, "A leading-edge 0.9 μm pixel CMOS image sensor technology with backside illumination: Future challenges for pixel scaling (Invited)", IEDM Tech. Dig., 2010, pp. 332-335 (4 pages total).
R. Harris, "Is ReRAM the end of NAND flash?", Storage Bits, Jul. 2012. Available online: http://www.zdnet.com/is-reram-the-end-of-nand-flash-7000001070/ (8 pages total).
M. Lanza, "A review on resistive switching in high-k dielectrics: A nanoscale point of view using conductive atomic force microscope", Materials, vol. 7, No. 3, pp. 2155-2182, Mar. 2014 (28 pages total).
H.-S. P. Wong, H. Y. Lee, S. M. Yu, Y. S. Chen, Y. Wu, P. S. Chen, B. Lee, F. T. Chen, and M. J. Tsai, "Metal-oxide RRAM", Proc. IEEE, vol. 100, No. 6, pp. 1951-1970, Jun. 2012 (20 pages total).
B. Govoreanu, G. S. Kar, Y- Y. Chen, V. Paraschiv, S. Kubicek, A. Fantini, I. P. Radu, L. Goux, S. Clima, R. Degraeve, N. Jossart, O. Richard, T. Vandeweyer, K. Seo, P. Hendrickx, G. Pourtois, H. Bender, L. Altimime, D. J. Wouters, J. A. Kittl, and M. Jurczak, "10x10nm2 Hf/HfOx Crossbar Resistive RAM with Excellent Performance, Reliability and Low-Energy Operation" in IEDM Tech. Dig., 2011, pp. 729-732 (4 pages total).
M. Ungureanu, R. Zazpe, F. Golmar, P. Stoliar, R. Llopis, F. Casanova, and L. E. Hueso, "A light-controlled resistive switching memory", Adv. Mater., vol. 24, No. 18, pp. 2496-2500, May 2012 (5 pages total).
A. Bera, H. Peng, J. Lourembam, Y. Shen, X. W. Sun and T. Wu, "A versatile light-switchable nanorod memory: Wurtzite ZnO on perovskite SrTiO3", Adv. Funct. Mater., vol. 23, No. 39, pp. 4977-4984, Oct. 2013 (8 pages total).
J. Park, S. Lee and K. Yong, "Photo-stimulated resistive switching of ZnO nanorods", Nanotechnology, vol. 23, No. 38, Sep. 2012 (7 pages total).
W. X. Zhao, B. Sun, Y. H. Liu, L. J. Wei, H. W. Li, and P. Chen, "Light-controlled resistive switching of ZnWO4 nanowires array", AIP Advances, vol. 4, No. 7, Jul. 2014 (8 pages total).
B. Sun and C. M. Li, "Light-controlled resistive switching memory of multiferroic BiMnO3 nanowire arrays", Phys. Chem. Chem. Phys., vol. 17, No. 10, pp. 6718-6721, Mar. 2015 (4 pages total).
E. Ajenifuja, A. Y. Fasasi, and G. A. Osinkolu, "Sputtering-pressure dependent optical and microstructural properties variations in DC reactive magnetron sputtered titanium nitride thin films", Trans. Indian Ceramic Soc., vol. 71, No. 4, pp. 181-188, Oct.-Dec. 2012 (9 pages total).
S. Privitera, G. Bersuker, B. Butcher, A. Kalantarian, S. Lombardo, C. Bongiorno, R. Geer, D. C. Gilmer, and P. D. Kirsch, "Microscopy study of the conductive filament in HfO2 resistive switching memory devices", Microelectronic Engineering, vol. 109, pp. 75-78, Sep. 2013 (4 pages total).
B. Butcher, G. Bersuker, L. Vandelli, A. Padovani, L. Larcher, A. Kalantarian, R. Geer, and D. C. Gilmer, "Modeling the effects of different forming conditions on RRAM conductive filament stability", Proc. Int. Memory Workshop, 2013 (4 pages total).
G. Bersuker and D. C. Gilmer, "Metal oxide resistive random access memory (RRAM) technology", Advances in Non-volatile Memory and Storage Technology, Ed. Y. Nishi, pp. 288-340, Woodhead Publishing Series in Electronic and Optical Materials, vol. 64, Elsevier, 2014 (53 pages total).
K. P. McKenna and A. L. Shluger, "Electronic properties of defects in polycrystalline dielectric materials", Microelectronic Engineering, vol. 86, No. 7-9, pp. 1751-1755, Jul.-Sep. 2009 (5 pages total).
D. M. Duffy, S. L. Daraszewicz, and J. Mulroue, "Modelling the effects of electronic excitations in ionic-covalent materials", Nuclear Instruments and Method in Phys. Res. B, vol. 277, pp. 21-27, Apr. 2012 (7 pages total).
F. Monsieur, E. Vincent, D. Roy, S. Bruyere, J. C. Vildeuil, G. Pananakakis, and G. Ghibaudo, "A thorough investigation of progressive breakdown in ultra-thin oxides. Physical understanding and application for industrial reliability assessment.", Proc. Int. Reliab. Phys. Symp., 2002, pp. 45-54 (10 pages total).
J. S. Suehle, "Ultrathin gate oxide reliability: Physical models, statistics, and characterization", IEEE Trans. Electron Devices, vol. 49, No. 6, pp. 958-971, Jun. 2002 (14 pages total).
M. Depas, T. Nigam, and M. M. Heyns, "Soft breakdown of ultra-thin gate oxide layers", IEEE Trans. Electron Devices, vol. 43, No. 9, pp. 1499-1504, Sep. 1996 (6 pages total).
G. Ribes et al., "Review on high-k dielectrics reliability issues", IEEE Trans. Device and Materials Reliability, vol. 5, No. 1, pp. 5-19, Mar. 2005 (15 pages total).
A. Crespo-Yepes et al., "Recovery of the MOSFET and circuit functionality after the dielectric breakdown of ultrathin high-k gate stacks", IEEE Electron Device Lett., vol. 31, No. 6, pp. 543-545, Jun. 2010 (3 pages total).
F. El Kamel et al., "Voltage-induced recovery of dielectric breakdown (high current resistance switching) in HfO2", Appl. Phys. Lett., vol. 98, No. 2, Jan. 2011, (4 pages total).
N. Raghavan et al., "Oxygen-soluble gate electrodes for prolonged high-k gate-stack reliability", IEEE Electron Device Lett., vol. 32, No. 3, pp. 252-254, Mar. 2011 (3 pages total).
B. Cappella and G. Dietler, "Force-distance curves by atomic force microscopy", Surf. Sci. Rep., vol. 34, Nos. 1-3, pp. 1-3 and 5-104,1999 (103 pages total).
E. Cartier and A. Kerber, "Stress-induced leakage current and defect generation in nFETs with HfO2/TiN gate stacks during positive-bias temperature stress", Proc. IEEE Int. Rel. Phys. Symp., Apr. 2009, pp. 486-492 (7 pages total).
X. Li, C. H. Tung, and K. L. Pey, "The nature of dielectric breakdown", Appl. Phys. Lett., vol. 93, No. 7, Aug. 2008, (4 pages total).
J. J. Yang et al., "The mechanism of electroforming of metal oxide memristive switches", Nanotechnology, vol. 20, No. 21, May 2009, (10 pages total).
B. Sun, Q. L. Li, W. X. Zhao, H. W. Li, L. J. Wei, and P. Chen, "White-light-controlled resistance switching in TiO2/α-Fe2O3 composite nanorods array", J. Nanopart Res. 16:2389 (2014) (7 pages total).

(56) References Cited

OTHER PUBLICATIONS

R. Waser and M. Aono, "Nanoionics-based resistive switching memories", Nature Materials, vol. 6, pp. 833-840, Nov. 2007 (9 pages total).
K. Kita and A. Toriumi, "Intrinsic origin of electric dipoles formed at high-k/SiO2 interface", IEDM Tech. Dig., Dec. 2008, pp. 1-4 (4 pages total).
F. A. Selim et al., "Positron lifetime measurements of hydrogen passivation of cation vacancies in yttrium aluminum oxide garnets", Phys. Rev. B, vol. 88, No. 17, Nov. 2013, (5 pages total).
C. Yu and H. Wang, "Light-Induced Bipolar-Resistance Effect Based on Metal-Oxide-Semiconductor Structures of Ti/SiO2/Si", Adv. Mat., vol. 22, pp. 966-970, 2010 (5 pages total).
L. Wang, K.-J. Jin, G. Chen, C. Wang, H.-Z. Guo, H.-B. Lu, and G.-Z. Yang,"Electro-photo double modulation on the resistive switching behavior and switchable photoelectric effect in BiFeO3 film", Appl. Phys. Lett. vol. 102, 252907, 2013 (5 pages total).
Y. Cui, W. Liu, and R. Wang,"Visible light initiated and collapsed resistive switching in TbMnO3/Nb:SrTiO3 heterojunctions", Phys. Chem. Chem. Phys., vol. 15, 6804, 2013 (5 pages total).
J. J .Yang, D. B. Strukov, and D. R. Stewart, "Memristive devices for computing", Nat. Nanotechnology, vol. 8, pp. 13-24, 2013 (13 pages total).
S. B. Long, X. J. Lian, C. Cagli, L. Perniola, E. Miranda, M. Liu, and J. Sune,"A Model for the Set Statistics of RRAM Inspired in the Percolation Model of Oxide Breakdown", IEEE Electron Dev. Lett. vol. 34, No. 8, pp. 999-1001, Aug. 2013 (total 3 pages).
M. Ziegler, R. Soni, T. Patelczyk, M. Ignatov, T. Bartsch, P. Meuffels, and H. Kohlstedt, "An Electronic Version of Pavlov's Dog", Adv. Funct. Mater, vol. 22, pp. 2744-2749, 2012 (6 pages total).
A. Tebano, E. Fabbri, D. Pergolesi, G. Balestrino, and E. Traversa,"Room-Temperature Giant Persistent Photoconductivity in SrTio3/LaAlO3 Heterostructures", ACS Nano, vol. 6, No. 2, pp. 1278-1283, 2012 (6 pages total).
M. Lanza, K. Zhang, M. Porti, M. Nafria, Z. Y. Shen, L. F. Liu, J. F. Kang, D. Gilmer, and G. Bersuker, "Grain boundaries as preferential sites for resistive switching in the HfO2 resistive random access memory structures", Applied Physics Letter, vol. 100, 123508, 2012 (5 pages total).
G. Bersuker, D. C. Gilmer, D. Veksler, P. Kirsch, L. Vandelli, A. Padovani, and L. Larcher, K. McKenna, A. Shluger, V. Iglesias, M. Porti, and M. Nafria,"Metal oxide resistive memory switching mechanism based on conductive filament properties", J. Appl. Phys., vol. 110, 124518, 2011 (13 pages total).
Shih, C-C. et al., "Resistive Switching Modification by Ultraviolet Illumination in Transparent Electrode Resistive Random Access Memory", IEEE Electron Device Letters, Jun. 6, 2014, vol. 35, No. 6, pp. 633-635 (3 pages total).
Zhou, Y. et al., "White-Light Induced Disruption of Nanoscale Conducting Filament in Hafnia", Applied Physics Letters, Aug. 18, 2015, vol. 107, No. 7, 072107, pp. 1-5 (6 pages total).

* cited by examiner

FIG. 3

300 electrically couple a first electrode to a first supply voltage
⎯302 electrically couple a second electrode to a second supply voltage
⎯304 form a conductive filament in an oxide dielectric element between the first electrode and the second electrode to decrease a resistance of the oxide dielectric element by applying a potential difference between the first supply voltage and the second supply voltage that exceeds a threshold voltage
⎯306 detect an increase in resistance of the oxide dielectric element upon the oxide dielectric element receiving optical light through the first electrode
⎯308

FIG. 4

400 direct optical light to the oxide dielectric
element to increase said resistance

402

1500a

1500b after repeated negative-voltage sweeps

FIG. 22D 2200d
( ) ~ SiO₂ thickness

| | Normal | Cu | Ni | Ti | Al |
|---|---|---|---|---|---|
| Negative forming | | | | | |
| Set Voltage | -13V (5nm)<br>-18V (10nm) | -2 to -3V (5nm)<br>-5.7V (10nm)<br>-16.5V (20nm) | -7.8V (5nm)<br>-14V (10nm) | -9.5V (5nm) | -9.9V (5nm) |
| Electrical Reset<br>Voltage Recovery rate | No<br>3% (5nm)<br>3% (10nm) | Yes<br>89% (10nm)<br>44% (20nm) | Sometimes (10/40)<br>40% (5nm)<br>40% (10nm) | No<br>12% | No<br>25% |
| Light-induced Reset<br>Complete probability | Yes<br>95% (1.5V)<br>33% (3V) | Yes<br>77% (1V, 10nm)<br>45% (2V, 20nm) | Sometimes<br>57% (1V, 5nm)<br>37% (1.5V, 5nm) | Sometimes<br>87% (1.5V)<br>35% (2V) | Yes<br>100% (1.5V)<br>40% (3V) |
| Positive forming | | | | | |
| Set Voltage | 10.8V (5nm) | 4 to 5V (5nm)<br>9.3V (10nm)<br>18.3V (20nm) | 7.5V (5nm)<br>13.5V (10nm) | 9.4V (5nm) | 10.6V (5nm) |
| Electrical Reset | No | No | No | No | No |
| Light-induced Reset (Complete) | Yes<br>75% (+1.5V)<br>10% (+3V) | No data | No data | No data | Yes<br>100% (+1.5V)<br>0% (+3V) |
| Gibbs free energy | SiO₂<br>-856.6 kJ/mol | CuO<br>-129.7 kJ/mol | NiO<br>-211.7 kJ/mol | TiO₂<br>-884.5 kJ/mol | Al₂O₃<br>-1582.3 kJ/mol |

More than 20 random locations were measured for each sample for the case of negative forming.

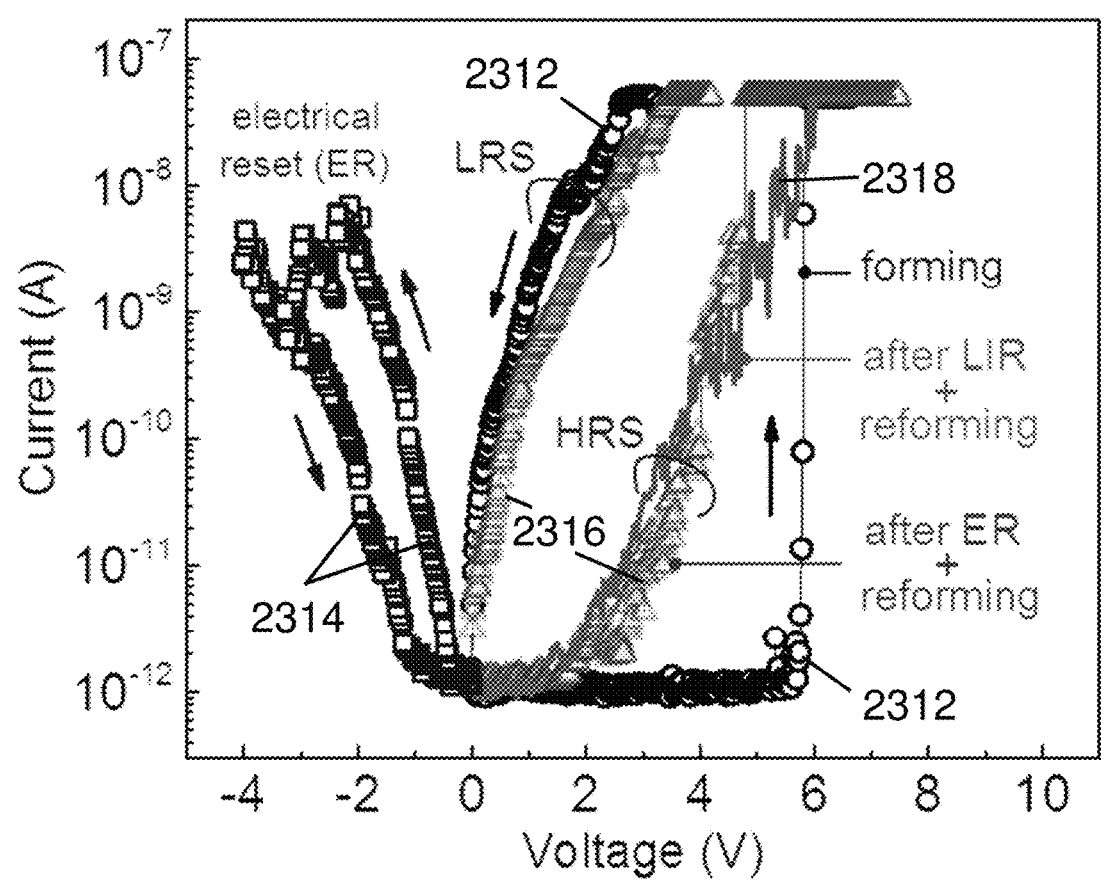

SENSOR ELEMENT, IMAGE SENSOR, METHODS OF FORMING AND OPERATING THE SAME

CROSS-REFERENCE TO RELATED APPLICATIONS

This application is a National Stage of International Application No. PCT/SG2016/050343 filed Jul.19, 2016, claiming priority based on Singapore Patent Application No. 10201505778X filed Jul. 24, 2015, the contents of all of which are incorporated by reference herein in their entirety.

TECHNICAL FIELD

Various aspects of this disclosure relate to sensor elements for sensing optical light, methods of forming the sensor elements, as well as methods of operating the sensor elements. Various aspects of this disclosure relate to image sensors for sensing optical light, methods of forming the image sensors, as well as methods of operating the image sensors.

BACKGROUND

The widespread of smart consumer electronic devices of which we are in incessant contact with in our daily lives has boosted huge market opportunities in recent times. One of the common features of these smart devices lies in their ability to instantly capture digital images of objects of interest. At present, this imaging capability is achieved via an integrated complementary metal oxide semiconductor (CMOS) image sensor, which is essentially made up of an array of minute optically sensitive electronic elements (p-n semiconductor junctions or photodiodes). The captured image is then transferred and stored in an on-board memory chip for further manipulation. Here, the NAND flash memory is also made up of an array of electronic elements called floating gate transistor. For both the sensor and memory components, information is represented in terms of either the absence or presence of electronic charges. The primary success of the CMOS image sensor and NAND flash memory technologies hinges on the use of well-established CMOS fabrication processes, which allow for integration of the image sensor and memory circuits, along with other control circuits on a given chip at a relatively low cost. Moving forward, the current technologies are unlikely to fulfill the future need for higher resolution image sensing devices. This is because the quantity of charges that individual sensor and memory components can store is fast reducing as their dimensions are being scaled down to achieve higher sensing resolution and storage capacity. With minimal charge storage, the loss of charges can induce substantial parameter variability issues and shrink the program/erase memory window beyond the acceptable range. In addition, due to the large difference in aspect ratios of the sensing and memory elements, direct on-chip integration of the image sensor and NAND flash memory circuits cannot usually be achieved. With integration made at the component level, the overall operating speed is limited by the external data buses.

SUMMARY

In various embodiments, a sensor element for sensing optical light may be provided. The sensor element may include a first electrode for electrically coupling to a first supply voltage. The sensor element may further include a second electrode for electrically coupling to a second supply voltage. The sensor element may additionally include an oxide dielectric element between the first electrode and the second electrode. The oxide dielectric element may be configured to form a conductive filament upon a potential difference between the first supply voltage and the second supply voltage exceeding a threshold level, thereby decreasing a resistance of the oxide dielectric element. The sensor element may also include a detector. The first electrode may be configured to allow the optical light to pass through the first electrode to the oxide dielectric element. The detector may be configured to detect an increase in the resistance of the oxide dielectric element upon the oxide dielectric element receiving the optical light.

In various embodiments, a method of forming a sensor element for sensing optical light may be provided. The method may include forming a first electrode for electrically coupling to a first supply voltage. The method may also include forming a second electrode for electrically coupling to a second supply voltage. The method may further include forming an oxide dielectric element between the first electrode and the second electrode. The oxide dielectric element may be configured to form a conductive filament upon a potential difference between the first supply voltage and the second supply voltage exceeding a threshold level, thereby decreasing a resistance of the oxide dielectric element. The method may additionally include providing a detector. The first electrode may be configured to allow the optical light to pass through the first electrode to the oxide dielectric element. The detector may be configured to detect an increase in the resistance of the oxide dielectric element upon the oxide dielectric element receiving the optical light.

In various embodiments, a method of operating a sensor element for sensing optical light may be provided. The method may include electrically coupling a first electrode to a first supply voltage. The method may also include electrically coupling a second electrode to a second supply voltage. The method may further include forming a conductive filament in an oxide dielectric element between the first electrode and the second electrode to decrease a resistance of the oxide dielectric element, by applying a potential difference between the first supply voltage and the second supply voltage that exceeds a threshold voltage across the oxide dielectric element. The method may additionally include detecting, by using a detector, an increase in the resistance of the oxide dielectric element upon the oxide dielectric element receiving the optical light to sense the optical light which passes through the first electrode to the oxide dielectric element.

In various embodiments, an image sensor may be provided. The image sensor may include a plurality of first electrodes for electrically coupling to a first supply voltage. The image sensor may also include a plurality of second electrodes for electrically coupling to a second supply voltage. The image sensor may further include an oxide dielectric layer between the plurality of first electrodes and the plurality of second electrodes. The oxide dielectric layer may include a plurality of oxide dielectric elements, each respective oxide dielectric element configured to form a conductive filament upon a potential difference between the first supply voltage and the second supply voltage exceeding a threshold level, thereby decreasing a resistance of the respective oxide dielectric element. The image sensor may additionally include a detector. The plurality of first electrodes may be configured to allow the optical light to pass through the plurality of first electrodes to the oxide dielectric layer. The detector may be configured to detect an increase in the resistance of the respective oxide dielectric element upon the respective oxide dielectric element receiving the optical light.

In various embodiments, a method of forming an image sensor may be provided. The method may include forming a plurality of first electrodes for electrically coupling to a first supply voltage. The method may also include forming a plurality of second electrode for electrically coupling to a second supply voltage. The method may additionally include forming an oxide dielectric layer between the plurality of first electrodes and the plurality of second electrodes, the oxide dielectric layer including a plurality of oxide dielectric elements, each respective oxide dielectric element configured to form a conductive filament upon a potential difference between the first supply voltage and the second supply voltage exceeding a threshold level, thereby decreasing a resistance of the respective oxide dielectric element. The method may additionally include providing a detector. The plurality of first electrodes may be configured to allow the optical light to pass through the plurality of first electrodes to the oxide dielectric layer. The detector may be configured to detect an increase in the resistance of the respective oxide dielectric element upon the respective oxide dielectric element receiving the optical light.

In various embodiments, a method of operating an image sensor may be provided. The method may include electrically coupling a plurality of first electrodes to a first supply voltage. The method may also include electrically coupling a plurality of second electrodes to a second supply voltage. The method may further include forming a conductive filament in each respective oxide dielectric element of the oxide dielectric layer between the plurality of first electrodes and the plurality of second electrodes to decrease a resistance of the respective oxide dielectric element, by applying a potential difference between the first supply voltage and the second supply voltage that exceeds a threshold voltage across the respective oxide dielectric element. The method may additionally include detecting, by using a detector, an increase in the resistance of the respective oxide dielectric element upon the respective oxide dielectric element receiving the optical light to sense the optical light which passes through the plurality of first electrodes to the oxide dielectric layer.

BRIEF DESCRIPTION OF THE DRAWINGS

The invention will be better understood with reference to the detailed description when considered in conjunction with the non-limiting examples and the accompanying drawings, in which:

FIG. 3 shows a schematic illustrating a method of operating a sensor element for sensing optical light according to various embodiments.

FIG. 4 is a schematic illustrating a method of increasing a resistance of an oxide dielectric element according to various embodiments.

FIG. 22D is a table illustrating the likelihood of the breakdown path exhibiting electrical and light induced increase in resistance in samples with different electrodes according to various embodiments.

FIG. 23B is a plot of current (amperes or A) as a function of voltage (volts or V) showing the formation of a conducting filament, as indicated by the abrupt current increase, during the first positive-voltage sweep, followed by electrical reset using a negative-voltage sweep, filament reformation by using a positive-voltage sweep and filament reformation again after infra-red light induced reset (LIR) according to various embodiments.

DETAILED DESCRIPTION

Figure 1:
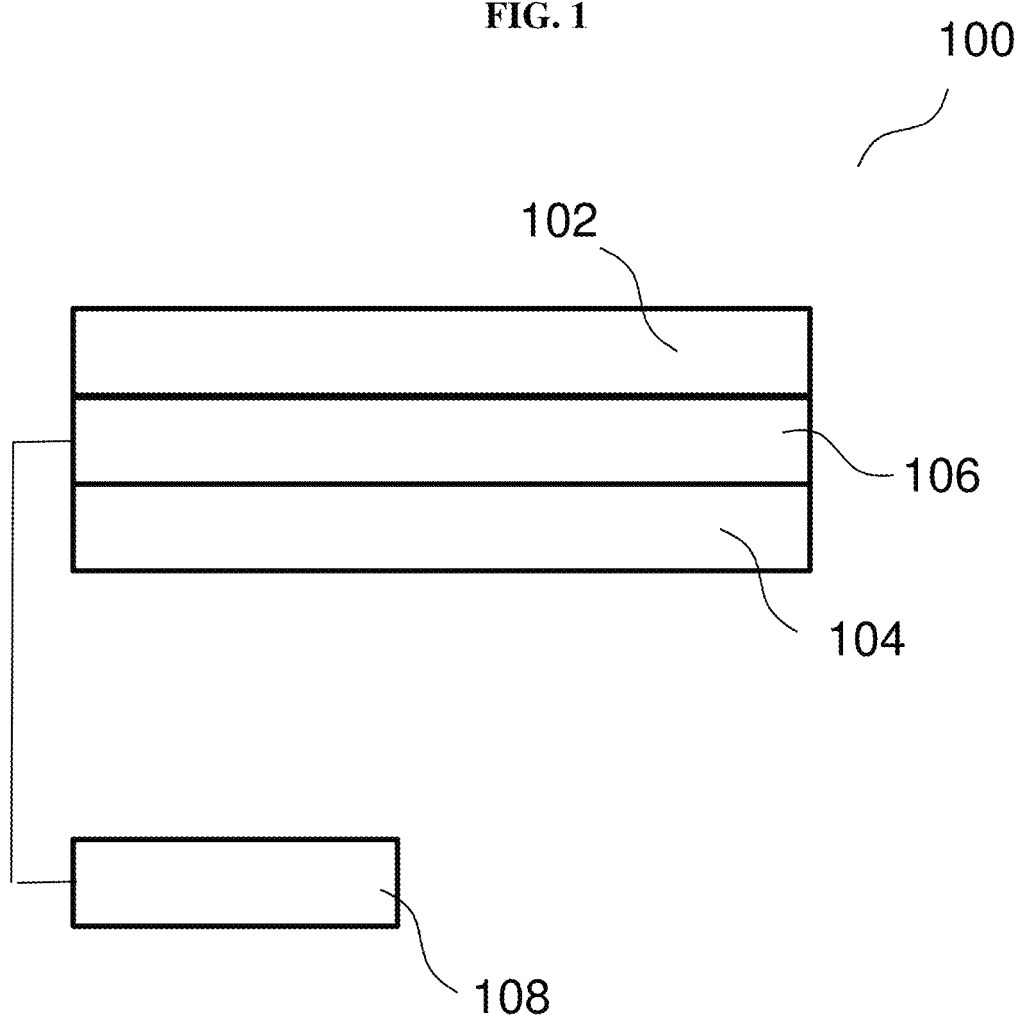
FIG. 1 is a schematic illustrating a sensor element for sensing optical light according to various embodiments.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, and logical changes may be made without departing from the scope of the invention. The various embodiments are not necessarily mutually exclusive, as some embodiments can be combined with one or more other embodiments to form new embodiments.

Embodiments described in the context of one of the methods or devices (e.g. sensor elements or sensors) are analogously valid for the other methods or devices. Similarly, embodiments described in the context of a method are analogously valid for a device, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

In the context of various embodiments, the articles "a", "an" and "the" as used with regard to a feature or element include a reference to one or more of the features or elements.

In the context of various embodiments, the term "about" or "approximately" as applied to a numeric value encompasses the exact value and a reasonable variance.

As used herein, the term "and/or" includes any and all combinations of one or more of the associated listed items.

Various embodiments may seek to address or mitigate the abovementioned issues. Various embodiments may provide a smaller imaging or sensing device.

There has already been a lot of effort to develop an alternative memory technology that could replace the present NAND Flash memory technology. Resistive Random Access Memory, or RRAM, has been at the forefront of non-volatile memory technology research for the past few years and is touted to be the most suitable candidate. The popularity of RRAM lies in its simple structure and design, use of standard CMOS compatible materials, fast operating speed (on the order of nanoseconds) and low power consumption. Most importantly, RRAM makes use of a very localized change of the insulator resistance to denote binary information storage and thus is able to be scaled down to much smaller dimensions. Numerous materials have been tested so far for RRAM devices, including transition and rare-earth metal oxides, various electrolytes, semiconductor materials, and even some organic compounds. Among the many materials examined, transition metal oxides, such as the hafnium dioxide ($HfO_2$), are particularly promising due to their established compatibility with the CMOS technology. A recent study reported excellent performance metrics for a $HfO_2$ RRAM (10 nm×10 nm cell size, excellent endurance up to $10^9$ cycles, fast switching speed in the nanosecond range, and power consumption per transition of ~0.1 pJ. Most of the leading institutions in microelectronic manufacturing and research areas have been researching on the RRAM.

Basically, a RRAM device operates by alternating the resistance of a conducting filament embedded in the oxide dielectric between a high ("0") and a low level ("1"). Typically, such changes are induced by applying voltages of different polarities across the device, following a high-voltage procedure that created the conducting filament in the oxide.

Apart from the electrical means, it is found that visible light may also cause the filament embedded in oxide dielectrics such as $HfO_2$, $ZrO_2$, $SiO_2$, etc. to change from a low to high resistance state, i.e. light may partially or totally eliminate the filament. This observation may pave the way for the inclusion of novel optical functionalities in CMOS-based integrated circuits (e.g. a new oxide-based image sensor with built-in non-volatile memory capability, i.e. a RRAM array performing dual memory and light sensing roles). As will also be shown, the ability for the filament to be eliminated by light may also enable the reliability of oxide dielectrics to be extended significantly. This is extremely crucial for basic circuit elements such as the metal-oxide-semiconductor field-effect transistor (MOSFET), for which such oxide dielectrics play an integral role on its operation.

Most of the present research on the RRAM has thus far focused mainly on the enhancement of electrical performance through optimization of various design metrics (e.g. material, process, architecture and operational). The relatively large bandgap energy of $HfO_2$, $ZrO_2$, and $SiO_2$ (>5 eV) may make them non-responsive to the visible light spectrum (which has photon energy ranging from 1.8-3 eV). Therefore, all studies reported to-date on RRAM based on these oxide dielectrics have only focused on electrical stimulation, and photo-induced effect has not been considered.

Various embodiments relate to a new negative photoconductivity behavior in soft-breakdown large bandgap dielectric materials such as $HfO_2$, $ZrO_2$ and $SiO_2$. Soft-breakdown of the oxide dielectric, via an electrical stressing means during which a nanoscale conducting filament may be created in the oxide network, forms the basis for the operation of the RRAM. Via an electrical method, the resistance of this nanoscale conducting filament may be made to repeatedly toggle between a high and low level, which are used to represent the binary memory states. Our newly discovered negative photoconductivity effect makes it possible to incorporate optical functionality into the RRAM based on large-bandgap oxide dielectrics (e.g. a light-mediated multi-level memory cell, an image sensor with built-in non-volatile memory capability, etc.). As these oxide materials are already widely used in mainstream integrated circuit (IC) manufacturing, it may also be possible to integrate novel optical functionalities directly into such ICs and therefore has a widespread impact.

In the last few years, there have been several studies on the effect of light on the conduction behavior of MIM (metal-insulator-metal) or MOS (metal-oxide-semiconductor) structures. For instance, in Ungureanu et al., ("A light-controlled resistive switching memory," Adv. Mater., vol. 24, no. 18, pp. 2496-2500, May 2012.), light was used to enhance the injection of optically generated electrons from a p-type Si substrate into a dielectric stack comprising $Al_2O_3$ and $SiO_2$ layers. Subsequent trapping of electrons in the dielectric stack induced a current hysteresis (which appeared only in the presence of light) that could be potentially exploited for memory encryption. Numerous studies were focused on the positive photoconductivity behavior of ZnO nanorod and $ZnWO_4$ nanowires and multiferroic dielectrics. The main reason attention has been put on alternative oxide materials is because conventional ICs have so far been fabricated using wide bandgap oxides (such as $SiO_2$, $HfO_2$, and $ZrO_2$) which are non-photo-responsive. The motivation is therefore to identify suitable alternative photo-responsive oxides that could be integrated with the mainstream IC technology to enhance its functionalities. It should be noted that although the approach described in Ungureanu et al. makes use of the conventional MOS structure (which is a basic building block of ICs), its operating principle is the same as that used in current memory technology, in that different memory states are distinguished through varying the amount of charge trapped or stored. As mentioned earlier, this approach is already facing difficult challenges in addressing the needs of future memory technology due to the diminishing amount of charge stored as a result of device dimension scaling.

The most important benefit of our finding lies in resistance modulation, by visible light, of a nanoscale conducting filament created in an oxide dielectric (such as $HfO_2$, $ZrO_2$ and $SiO_2$) by electrical stress induced breakdown. The basic operating principle entirely differs from that which the current image sensing technology is based on. In particular, the resistance of the nanoscale conducting filament can be increased, by several orders of magnitude upon exposure to visible light. In RRAM terminology, the resistance increase is referred to as reset. Since the resistance is increased in the presence of light, we termed this behavior negative photoconductivity, as opposed to the typical positive conductivity behavior of photo-responsive, narrow bandgap materials where increased conductivity (or decreased resistivity) results from light-induced generation of excess charges. Furthermore, the light-induced resistance modulation phenomenon does not interfere with the conventional electrical operation of the RRAM device.

The observed impact of visible light on RRAM resistance reset opens the door to many opportunities where optical functions could be directly incorporated into present mainstream ICs without the need for foreign-material integration. One such potential application is the direct engagement of a RRAM array in digital imaging application. In this case, one has an entirely new oxide-based image sensor with built-in non-volatile memory capability. This should be distinguished from the present CMOS image sensor which relies on a p-n junction to store the charges created by light and then transfer the charges out of the imaging array to be stored in another memory array. In various embodiments, an image sensor may be provided. The image sensor directly leverages the main advantages already identified with the RRAM technology. One very important advantage is scalability, by virtue of the fact that resistance switching is determined by a minute conductive filament (having a cross-sectional area on the order of several tens of nanometer square) embedded in the oxide layer. Hence, the dimensions of individual RRAM device may be reduced down to a level which may not be possible to achieve by the present CMOS imaging technologies, offering a quantum jump in spatial resolution improvement. It should also be highlighted that such scalability may be achieved without a loss of sensitivity, because the resistance of the nanoscale conducting filament can be modulated over several orders of magnitude. In fact, sensitivity may be independently enhanced by adjusting the thickness of the oxide layer, thus eliminating the size-sensitivity tradeoff of the current technology. Moreover, integrity of the image captured may be preserved over a longer period without requiring an intermediate data transfer to a separate memory storage, since RRAM device itself functions as a non-volatile memory device. In comparison, in the current CMOS image sensor, the generated charges must be quickly transferred out before they are lost through recombination.

Various embodiments may relate to multi-level or continuous resistance tuning using light. The ability to achieve different resistance levels may not only allow multiple memory states to be stored in a single filament, it may be very crucial for neuromorphic computing applications which require the basic computing element to exhibit a considerable amount of plasticity. Achieving different resistance values of a nanoscale conducting filament via an electrical means is challenging as it requires very precise control of electrical pulse timings. On the other hand, through adjusting the exposure period and light intensity, a nearly continuous variation of resistance may be achieved.

Various embodiments may relate to gate oxide reliability rejuvenation. The gate oxide is the heart of the MOSFET, the basic building block of nearly all ICs. Being an extremely thin oxide (comprising only several atomic layers) that is constantly subjected to electrical voltage biasing, defect generation over time may cause the gate oxide to lose its insulating property when the generated defects line up in a path that directly shorts the gate to the channel. When this happens, the functionality of the MOSFET may be compromised and this would in turn trigger IC failure. Thus, oxide breakdown is a pressing reliability issue in advanced ICs. Since light can eliminate a nanoscale conducting filament, various embodiments may offer an opportunity to reverse oxide breakdown and extend the gate oxide reliability significantly.

FIG. 1 is a schematic illustrating a sensor element 100 for sensing optical light according to various embodiments. The sensor element 100 may include a first electrode 102 for electrically coupling to a first supply voltage. The sensor element 100 may further include a second electrode 104 for electrically coupling to a second supply voltage. The sensor element 100 may additionally include an oxide dielectric element 106 between the first electrode 102 and the second electrode 104. The oxide dielectric element 106 may be configured to form a conductive filament upon a potential difference between the first supply voltage and the second supply voltage exceeding a threshold level, thereby decreasing a resistance of the oxide dielectric element 106. The sensor element 100 may also include a detector 108. The first electrode 102 may be configured to allow the optical light to pass through the first electrode 102 to the oxide dielectric element 106. The detector 108 may be configured to detect an increase in the resistance of the oxide dielectric element 106 upon the oxide dielectric element 106 receiving the optical light.

In other words, the sensor element 100 may include an oxide dielectric element 106 sandwiched between a first electrode 102 and a second electrode 104. A potential difference may be applied between the first electrode 102 and the second electrode 104 to form a conductive filament in the oxide dielectric element 106 so that the electrical resistance of the oxide dielectric element 106 is decreased. Optical light may then be provided to increase the electrical resistance of the oxide dielectric element 106. The first electrode 102 may allow the optical light to pass through to reach the oxide dielectric element 106. The increase in the electrical resistance may be detected or determined by the detector 108.

The phenomenon of increasing electrical resistance of element 106 upon exposure to optical light may be referred to as negative photoconductivity.

A sensor element 100 may be referred to as a sensor cell or an optical sensor. A sensor element 100 may have a metal-insulator-metal (MIM) structure, wherein the oxide dielectric element 106 is the insulator and the electrodes 102, 104 are the metal structures sandwiching the insulator.

The first electrode 102 may be in direct contact with the oxide dielectric element 106 or may be separated from the oxide dielectric element 106 by one or more electrically conductive layers or elements. The second electrode 104 may be in direct contact with the oxide dielectric element 106 or may be separated from the oxide dielectric element 106 by one or more electrically conductive layers or elements. In various embodiments, the oxide dielectric element 106 may be between a portion of the first electrode 102 and a portion of the second electrode 104. The oxide dielectric element 106 may be in contact with a portion of the first electrode 102 and may be in contact with a portion of the second electrode 104.

In various embodiments, the first electrode 102 may be translucent or transparent (to the optical light). The first electrode 102 may include indium-doped tin oxide (ITO) glass or any other suitable transparent conducting oxide (e.g. IGZO which denotes indium gallium zinc oxide) .

In various embodiments, the second electrode 104 may be opaque, while in other embodiments, the second electrode 104 may be transparent or translucent. In various embodiments, the second electrode may include any suitable electrically conductive material. In various embodiments, the second electrode 104 may include any suitable material selected from a group consisting of titanium nitride, copper, titanium, nickel, aluminum, silicon or polysilicon.

The first electrode 102, the second electrode 104, and the oxide dielectric element 106 may form a vertical stacked arrangement. The oxide dielectric element 106 may be on or over the second electrode 104, and the first electrode 102 may be on or over the oxide dielectric element 106.

The oxide dielectric element 106 may include any one oxide selected from a group consisting of zirconium oxide, silicon oxide, hafnium oxide, aluminum oxide, yttrium oxide, scandium oxide, zinc oxide, a bismuth based oxide, and any combination thereof. The oxide dielectric element 106 may be or may include a wide bandgap oxide such as of zirconium oxide, silicon oxide, hafnium oxide, aluminum oxide, yttrium oxide or scandium oxide. It may also be envisioned that the oxide dielectric element 106 may be or may include a photoconductive, narrow bandgap oxide such as zinc oxide or a perovskite such as $BiMnO_3$ or $BiFeO_3$.

In various embodiments, the oxide dielectric element 106 may have a thickness selected from a range of about 5 nm to about 10 nm for wide bandgap oxides, or a thickness selected from a range of more than about 10 nm for narrow bandgap oxides.

In various embodiments, the optical light may be or may include visible light and/or ultraviolet light and/or infrared light. In other words, the optical light may include visible light, ultraviolet light, infrared light, or any combination thereof. In various embodiments, the optical light may have a single wavelength or range of wavelengths (e.g. between about 400 nm and about 780 nm for visible light). The optical light may additionally or alternatively have a single wavelength or range of wavelengths corresponding to the regime of infrared light or ultraviolet light.

The threshold level may be any suitable non-zero value. The threshold value may be a positive voltage or a negative voltage, which may be determined by the thickness and/or processing conditions of the oxide dielectric element. In various embodiments, the threshold level may be any value selected from a range of between about 0.5 V to about 5 V. In various embodiments, the conductive filament may be formed in the oxide dielectric element 106 when the oxide dielectric element 106 is subjected to a potential difference above the threshold level.

In various embodiments, a current flowing through the oxide dielectric element to form the conductive filament may be below a predetermined compliance limit, for instance below 200 nA, or below 150 nA. In various embodiments, the predetermined compliance limit may be any suitable value selected from a range between about 10 nA to about 100 nA.

The detector 108 may be configured to determine or detect the increase in the resistance by applying a sensing voltage across the oxide dielectric element and determining the current flowing through the oxide dielectric element.

The sensing voltage may be smaller than the potential difference applied across the oxide dielectric element to form the conductive filament.

In various embodiments, the first supply voltage may be either positive or negative, depending on the structure of the sensor element. For example, for the silicon dioxide/copper/titanium/silicon ($SiO_2$/Cu/Ti/Si) structure, a negative first supply voltage may be needed to effect the photoconductivity modulation described herein, whereas a positive or negative first supply voltage may be suitable for the hafnium oxide/titanium nitride ($HfO_2$/TiN) structure). The second supply voltage may be at ground or 0 V. The first supply voltage may be chosen such that the potential difference between the first supply voltage and the second supply voltage exceeds the threshold level to form or reform the conductive filament.

In various embodiments, an image sensor may be provided. The image sensor may include a plurality of sensor elements as described herein.

In various embodiments, the image sensor may be a cross-bar array image sensor.

The image sensor may include a plurality of first electrodes for electrically coupling to a first supply voltage. The image sensor may also include a plurality of second electrode for electrically coupling to a second supply voltage. The image sensor may further include an oxide dielectric layer between the plurality of first electrodes and the plurality of second electrodes. The oxide dielectric layer may include a plurality of oxide dielectric elements, each respective oxide dielectric element configured to form a conductive filament upon a potential difference between the first supply voltage and the second supply voltage exceeding a threshold level, thereby decreasing a resistance of the respective oxide dielectric element. The image sensor may additionally include a detector. The plurality of first electrodes may be configured to allow the optical light to pass through the plurality of first electrodes to the oxide dielectric layer. The detector may be configured to detect an increase in the resistance of the respective oxide dielectric element upon the respective oxide dielectric element receiving the optical light.

In other words, the image sensor may include a number of first electrodes electrically coupled or connected to a first surface of an oxide dielectric layer, and a number of second electrodes electrically coupled or connected to a second surface of the oxide dielectric layer. During operation, a conductive filament may be formed in a portion of the oxide dielectric layer between a particular first electrode, or a portion of the particular first electrode, and a particular second electrode, or a portion of the particular second electrode, when a potential difference between the first electrode and the second electrode exceeds a particular threshold value. The potential difference between corresponding first electrodes and second electrodes may be increased to beyond the threshold value, so that a conductive filament is formed in the corresponding portions of the oxide dielectric layer between the corresponding first electrodes and second electrodes. The resistance of the different portions of the dielectric layer may be of an initial common or substantially equal resistance value. Optical light from an object may be incident on the different portions of the oxide dielectric layer. Different amounts of optical light may be on different portions, leading to different increase in resistance between the individual portions of the oxide dielectric layer. By sensing the resistance of the individual portions of oxide dielectric layer, the amount of light incident on the different portions of the oxide dielectric layer may be determined. Consequently, an image of the object may be determined.

The plurality of first electrodes may extend in parallel to one another along a first direction in a first plane. The plurality of second electrodes may extend in parallel to one another along a second direction in a second plane parallel to the first plane. The second direction (in the second plane) may be substantially perpendicular to the first direction (in the first plane).

Each oxide dielectric element may be a portion of the oxide dielectric layer between a portion of the second electrode and a portion of the first electrode over the portion of the second electrode.

The image sensor may further include a lens system for directing the optical light to the plurality of sensor elements.

The image sensor may also include a plurality of selectors, such as diodes. Each of the plurality of selectors may be electrically coupled to a sensor element. A particular selector may be activated to determine a resistance value of a corresponding oxide dielectric element at a time. The remaining selectors may be deactivated so that effects of parasitic leakage current from nearby sensor elements or corresponding oxide dielectric elements may be reduced or prevented.

The image sensor may additionally include a colour filter over the plurality of sensor elements for achieving colour imaging. The image sensor may also include an antireflection coating layer over the plurality of sensor elements for enhancing light transmission to the oxide dielectric layer.

Figure 2:
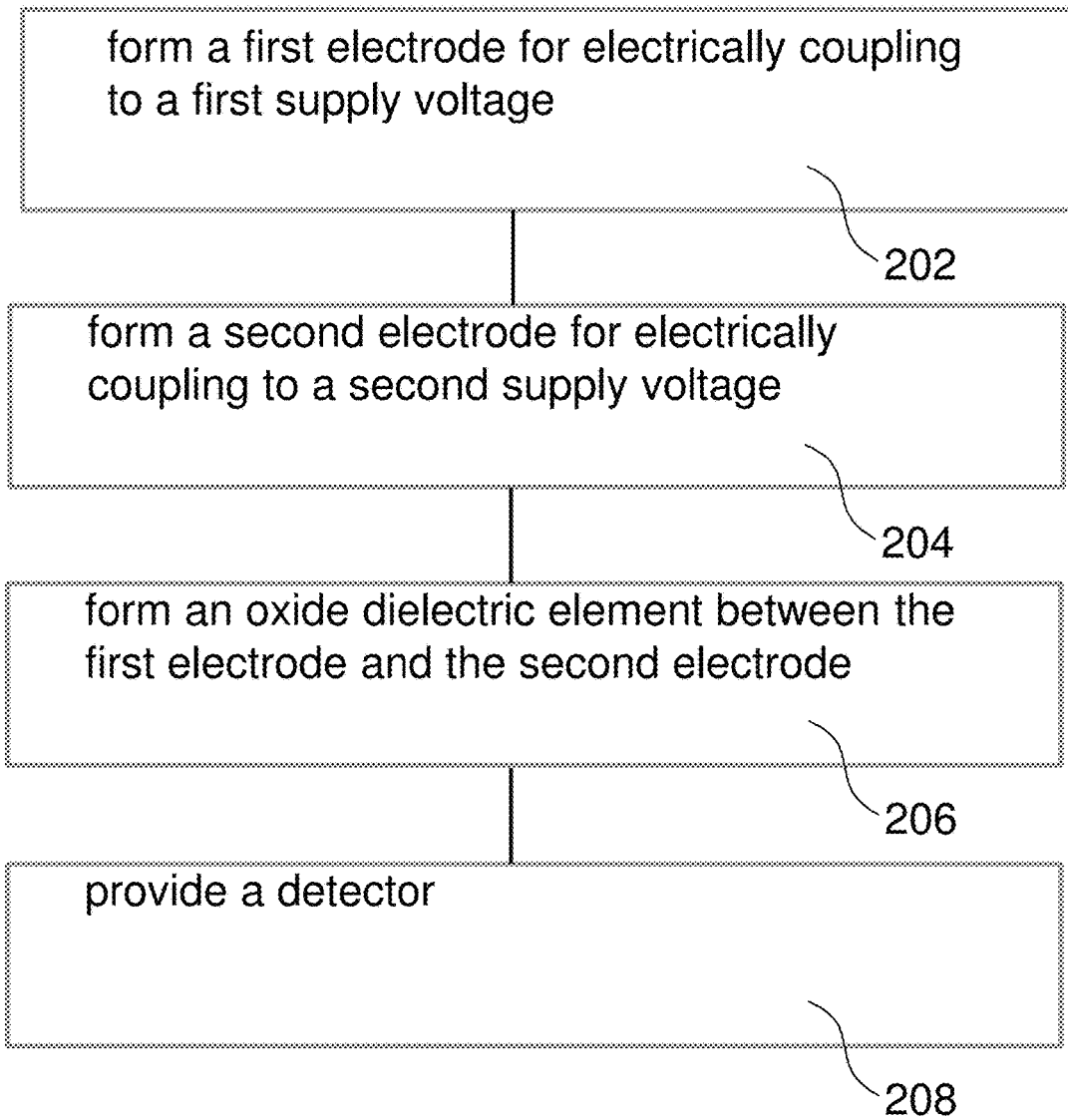
FIG. 2 shows a schematic illustrating a method of forming a sensor element for sensing optical light according to various embodiments.

FIG. 2 shows a schematic 200 illustrating a method of forming a sensor element for sensing optical light according to various embodiments. The method may include, in 202, forming a first electrode for electrically coupling to a first supply voltage. The method may also include, in 204, forming a second electrode for electrically coupling to a second supply voltage. The method may further include, in 206, forming an oxide dielectric element between the first electrode and the second electrode. The oxide dielectric element may be configured to form a conductive filament upon a potential difference between the first supply voltage and the second supply voltage exceeding a threshold level, thereby decreasing a resistance of the oxide dielectric element. The method may additionally include, in 208, providing a detector. The first electrode may be configured to allow the optical light to pass through the first electrode to the oxide dielectric element. The detector may be configured to detect an increase in the resistance of the oxide dielectric element upon the oxide dielectric element receiving the optical light.

In other words, the method may include forming an arrangement of two electrodes and an oxide dielectric element between the two electrodes. One of the two electrodes may be configured to allow optical light to pass through. A detector may be provided for determining an increase in the resistance of the oxide dielectric element caused by the optical light.

In various embodiments, the first electrode, the second electrode and the oxide dielectric element may form a vertical stacked arrangement. The method may include forming the second electrode, forming the oxide dielectric element on or over the second electrode, and forming the first electrode on or over the oxide dielectric element.

In various embodiments, the first electrode may be transparent or translucent. The first electrode may include indium-doped tin oxide (ITO) glass or any other suitable transparent conducting oxide (e.g. IGZO which denotes indium gallium zinc oxide). The method may include depositing the transparent conductive oxide (such as ITO or IGZO) on the oxide dielectric element. The second electrode may include any suitable electrically conductive material. The method may also include depositing the suitable electrically conductive material on the oxide dielectric element.

The oxide dielectric element may include any one oxide selected from a group consisting of zirconium oxide, silicon oxide, hafnium oxide, aluminum oxide, yttrium oxide, scandium oxide, zinc oxide, a bismuth based oxide, and any combination thereof. The oxide may be a mixed oxide. The method may include depositing the oxide to form the oxide dielectric element.

In various embodiments, the optical light may be visible light and/or ultraviolet light and/or infrared light. In other words, the optical light may include visible light, ultraviolet light, infrared light, or any combination thereof. In various embodiments, the optical light may have a single wavelength or range of wavelengths (e.g. between about 400 nm and about 780 nm for visible light). The optical light may additionally or alternatively have a single wavelength or range of wavelengths corresponding to the regime of infrared light or ultraviolet light.

The threshold level may be a non-zero voltage. The threshold level may be a positive voltage or negative voltage determined by the thickness and processing conditions of the oxide dielectric element. The threshold level may have a value ranging from 0.5 V to 5V.

In various embodiments, a current flowing through the oxide dielectric element to form the conductive filament may be below a predetermined compliance limit.

In various embodiments, a method of forming an image sensor may be provided. The image sensor may include a plurality of sensor elements. Each sensor element of the plurality of sensor elements may be formed by any method as described herein.

The method may include forming a plurality of first electrodes for electrically coupling to a first supply voltage. The method may also include forming a plurality of second electrode for electrically coupling to a second supply voltage. The method may additionally include forming an oxide dielectric layer between the plurality of first electrodes and the plurality of second electrodes, the oxide dielectric layer including a plurality of oxide dielectric elements, each respective oxide dielectric element configured to form a conductive filament upon a potential difference between the first supply voltage and the second supply voltage exceeding a threshold level, thereby decreasing a resistance of the respective oxide dielectric element.

The method may additionally include providing a detector. The plurality of first electrodes may be configured to allow the optical light to pass through the plurality of first electrodes to the oxide dielectric layer. The detector may be configured to detect an increase in the resistance of the respective oxide dielectric element upon the respective oxide dielectric element receiving the optical light.

In various embodiments, the method of forming the image sensor may include forming the plurality of first electrodes extending in parallel to one another along a first direction in a first plane. The method may also include forming the plurality of second electrodes extends in parallel to one another along a second direction in a second plane parallel to the first plane. The second direction may be substantially perpendicular to the first direction. A plurality of oxide dielectric elements may be included in an oxide dielectric layer between the plurality of first electrodes and the plurality of second electrodes. The method may include forming the oxide dielectric layer.

The method may include forming the plurality of second electrodes, forming the oxide dielectric layer on the plurality of second electrodes, and forming the plurality of first electrodes on the oxide dielectric layer.

Each oxide dielectric element may be a portion of the oxide dielectric layer between a portion of the second electrode and a portion of the first electrode over the portion of the second electrode.

The method may further include forming a lens system for directing the optical light to the plurality of sensor elements. The method may also include forming a plurality of selectors, each of the plurality of selectors electrically coupled to a sensor element. The method may also include forming a colour filter over the plurality of sensor elements. The method may additionally include forming an antireflection coating layer over the plurality of sensor elements.

FIG. 3 shows a schematic 300 illustrating a method of operating a sensor element for sensing optical light according to various embodiments. The method may include, in 302, electrically coupling a first electrode to a first supply voltage. The method may also include, in 304, electrically coupling a second electrode to a second supply voltage. The method may further include, in 306, forming a conductive filament in an oxide dielectric element between the first electrode and the second electrode to decrease a resistance of the oxide dielectric element, by applying a potential difference between the first supply voltage and the second supply voltage that exceeds a threshold voltage across the oxide dielectric element. The method may additionally include, in 308, detecting, by using a detector, an increase in the resistance of the oxide dielectric element upon the oxide dielectric element receiving the optical light to sense the optical light which passes through the first electrode to the oxide dielectric element.

In other words, the method may include applying a potential difference which is above a threshold between the first electrode and the second electrode across the oxide dielectric element to form a conductive filament, which decreases the resistance of the oxide dielectric element. The method may also include applying optical light to the oxide dielectric element, and using a detector to sense an increase in the resistance.

In various embodiments, applying the optical light to the oxide dielectric element may partially or completely remove the conductive filament, thereby increasing the resistance of the oxide dielectric element.

In various embodiments, the optical light may be applied or provided by an optical light source.

In various embodiments, a method of operating an image sensor may be provided. The image sensor may include a plurality of sensor elements. Each sensor element may be operated by a method as described herein.

The method may include electrically coupling a plurality of first electrodes to a first supply voltage. The method may also include electrically coupling a plurality of second electrodes to a second supply voltage. The method may further include forming a conductive filament in each respective oxide dielectric element of the oxide dielectric layer between the plurality of first electrodes and the plurality of second electrodes to decrease a resistance of the respective oxide dielectric element, by applying a potential difference between the first supply voltage and the second supply voltage that exceeds a threshold voltage across the respective oxide dielectric element. The method may additionally include detecting, by using a detector, an increase in the resistance of the respective oxide dielectric element upon the respective oxide dielectric element receiving the optical light to sense the optical light which passes through the plurality of first electrodes to the oxide dielectric layer.

By applying a potential difference that exceeds a threshold voltage across each oxide dielectric element of the plurality of oxide dielectric elements, the resistance of each of the plurality of oxide dielectric elements may be decreased to a common level. In other words, the resistance of one oxide dielectric element may be substantially equal to the resistance of another oxide dielectric element. The plurality of oxide dielectric elements may then be exposed to optical light emitted or directed from an object. The plurality of oxide dielectric elements may be exposed to different amounts of optical light, and the resistance of one oxide dielectric element may increase by a different amount compared to the resistance of another oxide dielectric element. By determining the increase in resistance for each of the plurality of oxide dielectric elements, an image of the object may be sensed or determined.

The resistance or increase in resistance of an oxide electric element may be determined or detected by applying a sensing voltage and determining or detecting the current flowing through the oxide dielectric element. The detector may be configured to apply the sensing voltage, and further configured to determine or detect the current flowing through the oxide dielectric element.

The resistance of one or a few oxide electric elements may be detected or determined at a time. An oxide dielectric element may be selected by activating a corresponding selector or diode in electrical connection with the oxide dielectric element In various embodiments, a method of increasing a resistance of an oxide dielectric element (which may be referred to as a gate oxide) may be provided. FIG. 4 is a schematic 400 illustrating a method of increasing a resistance of an oxide dielectric element according to various embodiments. The method may include, in 402, directing optical light to the oxide dielectric element to increase said resistance from a first resistance value to a second resistance value. The resistance of the oxide dielectric element may be at the first resistance value due to electrical breakdown of the oxide dielectric element.

In various embodiments, the second resistance value may be substantially equal to an initial resistance value of the oxide dielectric element before electrical breakdown.

It has been found that exposure of an oxide dielectric material to optical light may repair the oxide dielectric material.

In various embodiments, the method may further include providing the optical light. The optical light may be provided by an optical light source, such as a light emitting diode (LED). The method may further include determining that the resistance of the oxide dielectric element has been increased. The resistance of the oxide dielectric element may indicate the reliability of the oxide dielectric element. The increase in the resistance of the oxide dielectric element may indicate that the reliability of the oxide dielectric element has been improved.

In various embodiments, a setup for increasing a resistance of an oxide dielectric element may be provided. The setup may include a holder for holding the oxide dielectric element or a sample including the oxide dielectric element, such as a field effect transistor. The method may further include an optical light source. The setup may also include a testing device, such as a device for obtaining a voltage-current characteristic of the oxide dielectric element, for determining the resistance of the oxide dielectric element.

Figure 5:
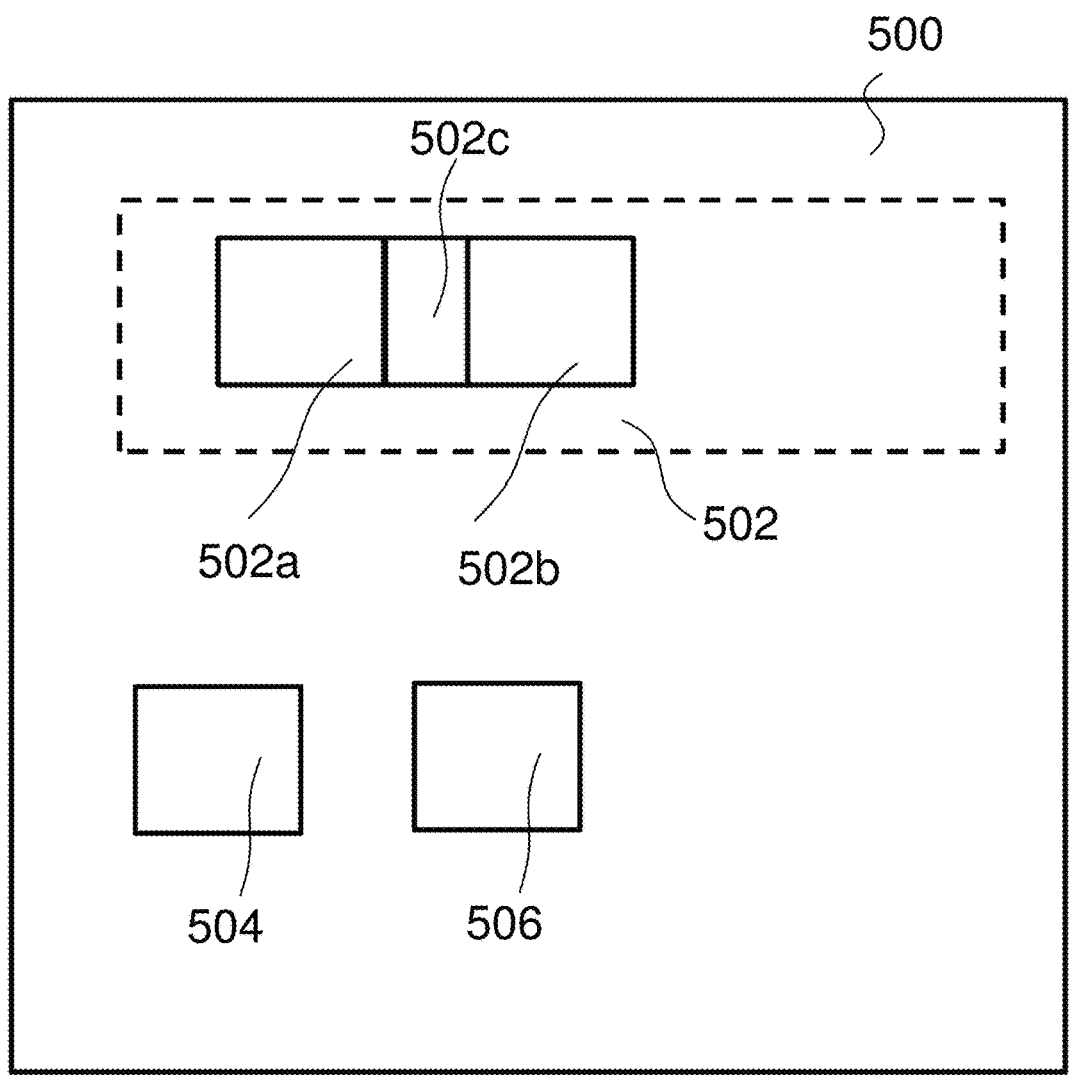
FIG. 5 is a schematic illustrating a memory system according to various embodiments.

FIG. 5 is a schematic illustrating a memory system 500 according to various embodiments. The memory system 500 may include a memory element 502. The memory element 502 may include a first electrode 502a for electrically coupling to a first supply voltage. The memory system 500 may further include a second electrode 502b for electrically coupling to a second supply voltage. The memory element 502 may additionally include an oxide dielectric element 502c between the first electrode 502a and the second electrode 502b. The oxide dielectric element 502c may be configured to form a conductive filament upon a potential difference between the first supply voltage and the second supply voltage exceeding a threshold level, thereby decreasing a resistance of the oxide dielectric element 502c to a first resistance value for representing a first logic state. The memory system 500 may further include an optical source 504 configured to provide optical light to the oxide dielectric element 502c, thereby increasing the resistance of the oxide dielectric element 502c to a second resistance value for representing a second logic state. The memory system 500 may also include a determination circuit arrangement 506 configured to determine the resistance of the oxide dielectric element 502c for determining the logic state.

In various embodiments, the first electrode 502a may be configured to allow the optical light to pass through the first electrode 502a to the oxide dielectric element 502c.

In various embodiments, the resistance of the oxide dielectric element 502c may be changed, i.e. increased or decreased to further resistance values for representing further logic states. In various embodiments, the memory element 502 may be capable of representing more than two logic states.

In various embodiments, the memory element 502 may be a conductive bridge resistive random access memory (CBRAM) element or cell.

EXPERIMENT 1

The negative photoconductivity phenomenon was first discovered on the hafnium oxide ($HfO_x$) and was found to apply to the zirconium oxide ($ZrO_x$) and silicon oxide ($SiO_x$).

Figure 6A:
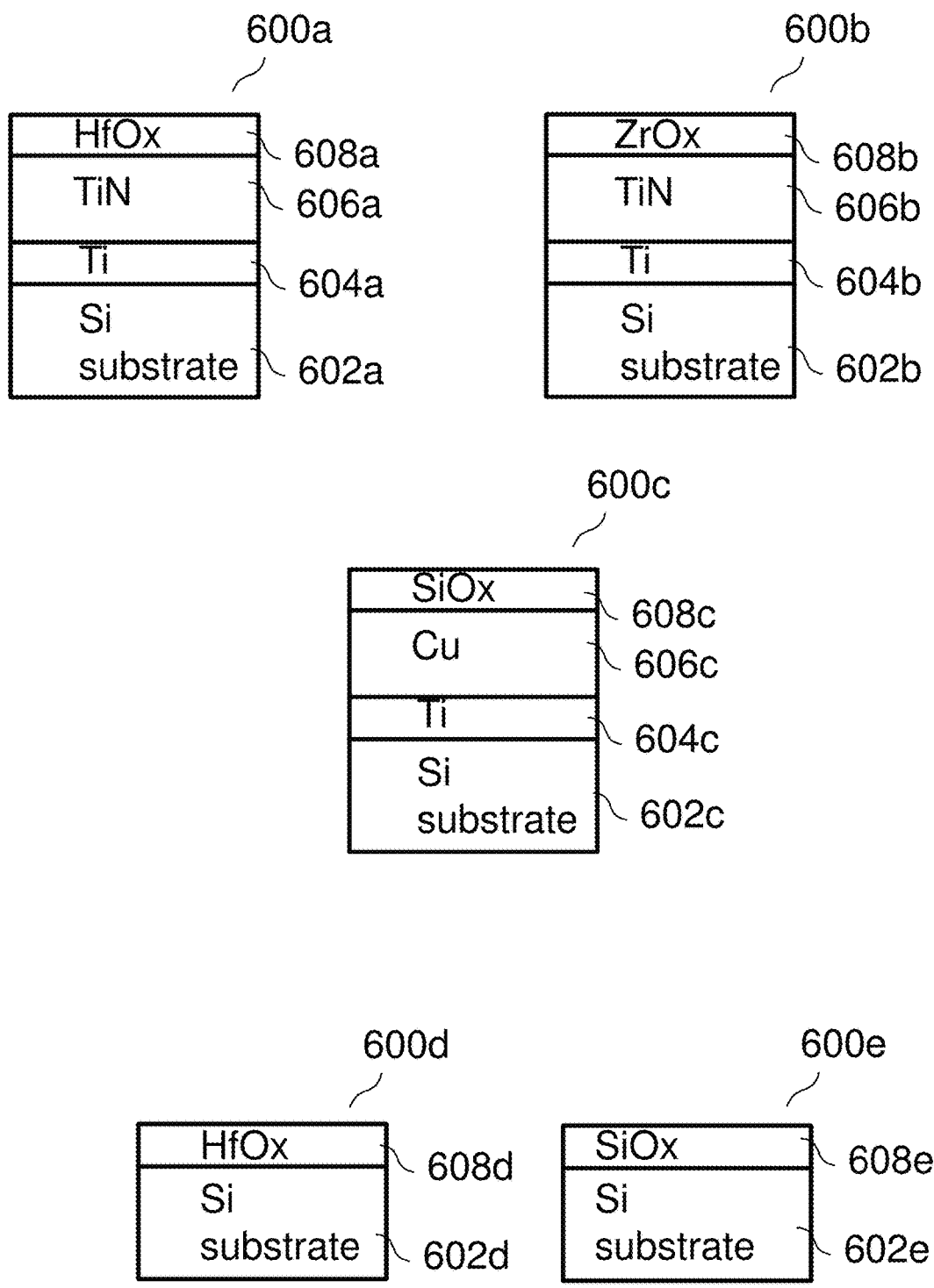
FIG. 6A depicts the test samples used in the study according to various embodiments.

FIG. 6A depicts the test samples used in the study according to various embodiments. As shown in FIG. 6A, RRAM structure 600a includes silicon substrate 602a, a titanium layer 604a on the silicon substrate 602a, a titanium nitride layer 606a on the titanium layer 604a, and a hafnium oxide layer 608a on the titanium nitride layer 606a. RRAM structure 600b includes silicon substrate 602b, a titanium layer 604b on the silicon substrate 602b, a titanium nitride layer 606b on the titanium layer 604b, and a zirconium oxide layer 608b on the titanium nitride layer 606b. RRAM structure 600c includes silicon substrate 602c, titanium layer 604c on the silicon substrate 602c, a copper layer 606c on the titanium layer 604c, and a silicon oxide layer 608c on the copper layer 606c. Gate stack structure 600d includes a silicon substrate 602d and a hafnium oxide layer 608d on the silicon substrate 602d. Gate stack structure 600e includes a silicon substrate 602e and a silicon oxide layer 608e on the silicon substrate 602e.

The sample structures used may be classified as: 1) oxide/metal (RRAM structures 600a, 600b, 600c); 2) oxide/Si (gate stack structures 600d, 600e). Fabrication of the former involves the sputter deposition of a titanium (Ti) adhesion layer 604a, 604b, 604c on a pre-cleaned p-type doped (100)-oriented silicon (Si) wafer 602a, 602b, 602c. This is followed by the deposition of either a titanium nitride (TiN) as the bottom metal electrode 606a, 606b in 600a, 600b, or a copper (Cu) layer as the bottom metal electrode 606c in 600c. The active oxide layer 608a, 608b, 608c may be then grown by atomic-layer deposition (ALD). Other oxide growth methods, such as sputter deposition, chemical vapor deposition (CVD), etc. also give qualitatively similar results although the exact performance (e.g. the chemistry of the nanoscale filament formed and thus its responsivity to illumination) may vary with the oxide growth method. For our study, the $HfO_x$ and $ZrO_x$ were grown by ALD using commercially available metal precursors (e.g. tetrakis (dimethylamino) hafnium for $HfO_x$). The oxidizer was $H_2O$ vapor. The $SiO_x$ was grown by plasma-enhanced CVD.

The choice of TiN or Si as the bottom electrode is guided by its present widespread use in mainstream IC manufacturing. The former is used as the metal gate in the high-k/metal gate stack technology and as a barrier layer in backend interconnect technology. The latter is used as the channel material for the metal-oxide-semiconductor field-effect transistor, the basic building block of almost all ICs. Cu was used in the case of the $SiO_2$ as the $SiO_2$/Cu structure has been investigated for conducting-bridge RRAM application. The choices of the bottom electrode considered in our study, though not exhaustive, are in-line with current options for large-scale manufacturing. In principle, any metal or semiconductor which does not substantially react with the oxide layer of interest over the range of temperatures involved in the fabrication process would be suitable to be used as the bottom electrode.

The oxide stoichiometry was determined using x-ray photoelectron spectroscopy and the metal to oxygen ratio was typically 1:1.8. Other ratios yield qualitatively similar results.

Although the demonstration of the negative photoconductivity phenomenon was made on the $HfO_x$, $ZrO_x$ and $SiO_x$ dielectrics, other oxide materials may also exhibit a similar phenomenon. The negative photoconductivity effect may be a consequence of the recombination between vacancy defects which made up the nanoscale conducting filament and photo-stimulated migrating oxygen species in the proximity of the filament. Thus, anyoxides which obey the breakdown mechanism where the oxygen species dislodged from the breakdown site (filament) by the electrical stress are stored in the vicinity of the vacancy-filled filament may exhibit the negative photoconductivity behavior and may be suitable to be considered for commercial applications based on the concept proposed in this document. These may include other wide bandgap oxides (~5 eV or larger bandgap) such as aluminum oxide ($Al_2O_3$), yttrium oxide ($Y_2O_3$), scandium oxide ($Sc_2O_3$), etc. It should be mentioned that photoconductive, narrow bandgap oxides (such as ZnO) or perovskites (e.g. $BiMnO_3$, $BiFeO_3$) may in principle also be suitable provided the decrease in current is not masked out by the increase contributed by the non-breakdown region surrounding the conducting filament. On the other hand, the surrounding non-breakdown region in a wide bandgap oxide is non-photo-responsive, i.e. conduction through this region is not affected by light and remains at a very low level by virtue of the wide bandgap. This enables the negative photoconductivity effect to be prominently manifested.

In the conventional metal/insulator/metal (MIM) structure used for RRAM application, the top metal electrode is relatively thick and has low optical transmittance. Hence, white light is unable to penetrate the top electrode and interact with the conducting filament in this structure.

Figure 6B:
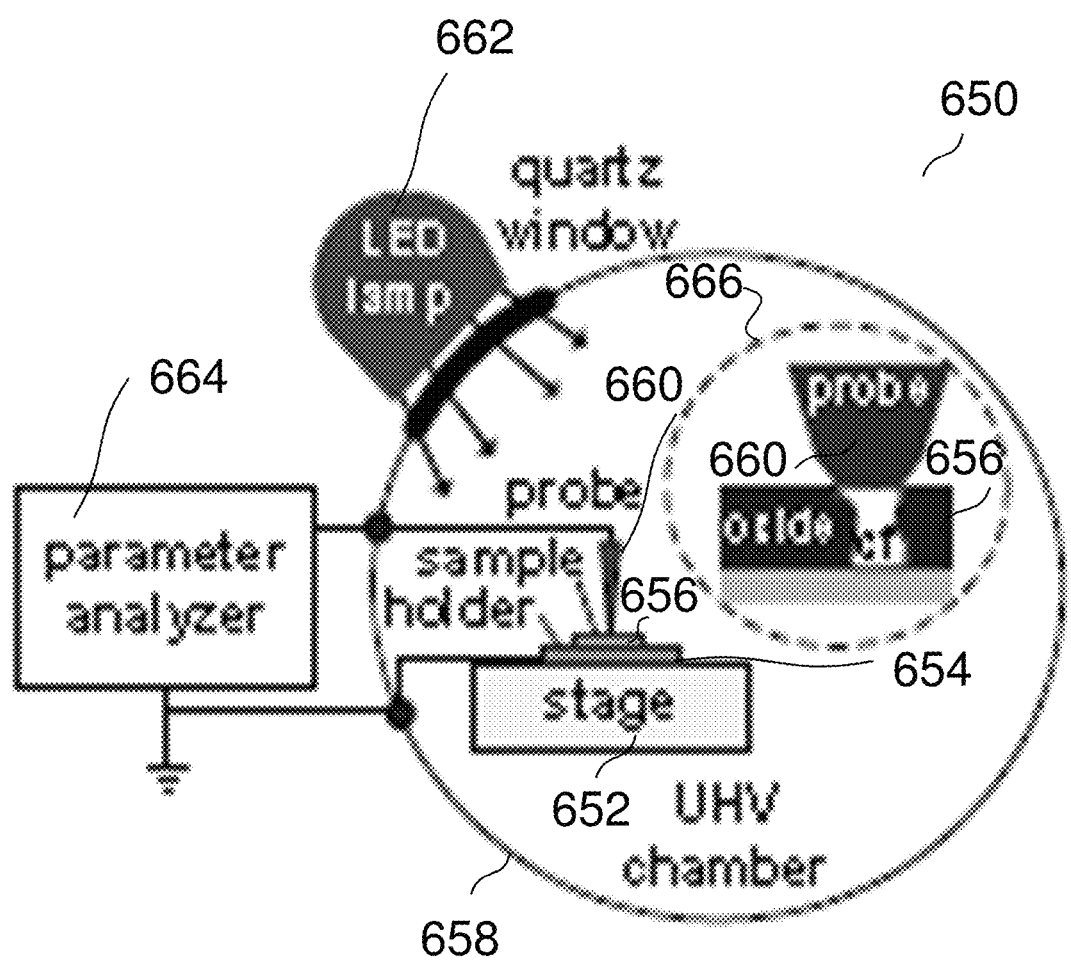
FIG. 6B shows the system for performing the experiment according to various embodiments.

Thus, the experiment was performed on an uncapped HfO$_x$/TiN sample in an ultra-high vacuum (UHV) conductive atomic force microscope (CAFM)/scanning tunneling microscope (STM) system. FIG. 6B shows the system 650 for performing the experiment according to various embodiments. The system 650 may include a stage 652 with an electrically conductive sample holder 654 for holding the sample 656. The experiment is carried out in a chamber 658 having an ultra-high vacuum (UHV) environment. The UHV environment (~$10^{-10}$ Torr) eliminates surface contamination of the uncapped oxide sample 656. The system 650 may also include a probe 660, which may be a CAFM probe or a STM probe. The CAFM or STM probe 660 functions as the top electrode, mimicking a MIM structure of a very small dimension. The former was a silicon (Si) cantilever with a diamond coated tip and the latter is a cut Pt/Ir wire (with 80 atomic percent Pt). The type of probe 660 used may not influence the outcome as the negative photoconductivity effect is observed with the system operating in either the CAFM or STM mode. The probe 660 and the sample holder 654 are coupled to a parameter analyzer 664.

The system 650 may also include a white-light source 662. The white-light source 662, of wavelengths ranging from about 400 nm to about 780 nm, was provided by an ordinary LED (light-emitting diode) lamp, positioned at the quartz window of the UHV chamber 658, at about 25 cm from the sample 656. Interaction between white-light and the conducting filament occurs through the exposed oxide region around the probe 660. The light intensity at the surface of the sample 656 was determined by a Daystar's DS-05A solar meter placed at the same separation from the light source 662 as the sample 656. The inset 666 shows the magnified view of the probe-to-sample contact region, showing the probe 660 contacting a nanoscale conducting filament (cf) formed in the oxide.

It should be mentioned that a UHV environment is not a pre-requisite for the observation of the negative photoconductivity effect. For actual product implementation, an optically transparent top electrode (such as the conductive indium-doped tin oxide (ITO) glass) may be deployed. An alternative may involve high optical transmittance (~80%) TiN sputter-deposited at a relatively high pressure (>10 Pa). In principle, any optically transparent and highly conductive material that remains thermally stable with the oxide of interest could serve as the top electrode. Lithography patterning followed by etching of the top electrode may have to be performed to achieve MIM structures of the desired dimension.

The nanoscale conducting filament was formed by a voltage-ramp applied to the probe by the parameter analyzer 664, e.g. a Keithley SCS4200 parameter analyzer. The polarity of the voltage-ramp is non-essential. The negative photoconductivity effect is observed on filaments formed using both positive and negative polarities.

Figure 6C:
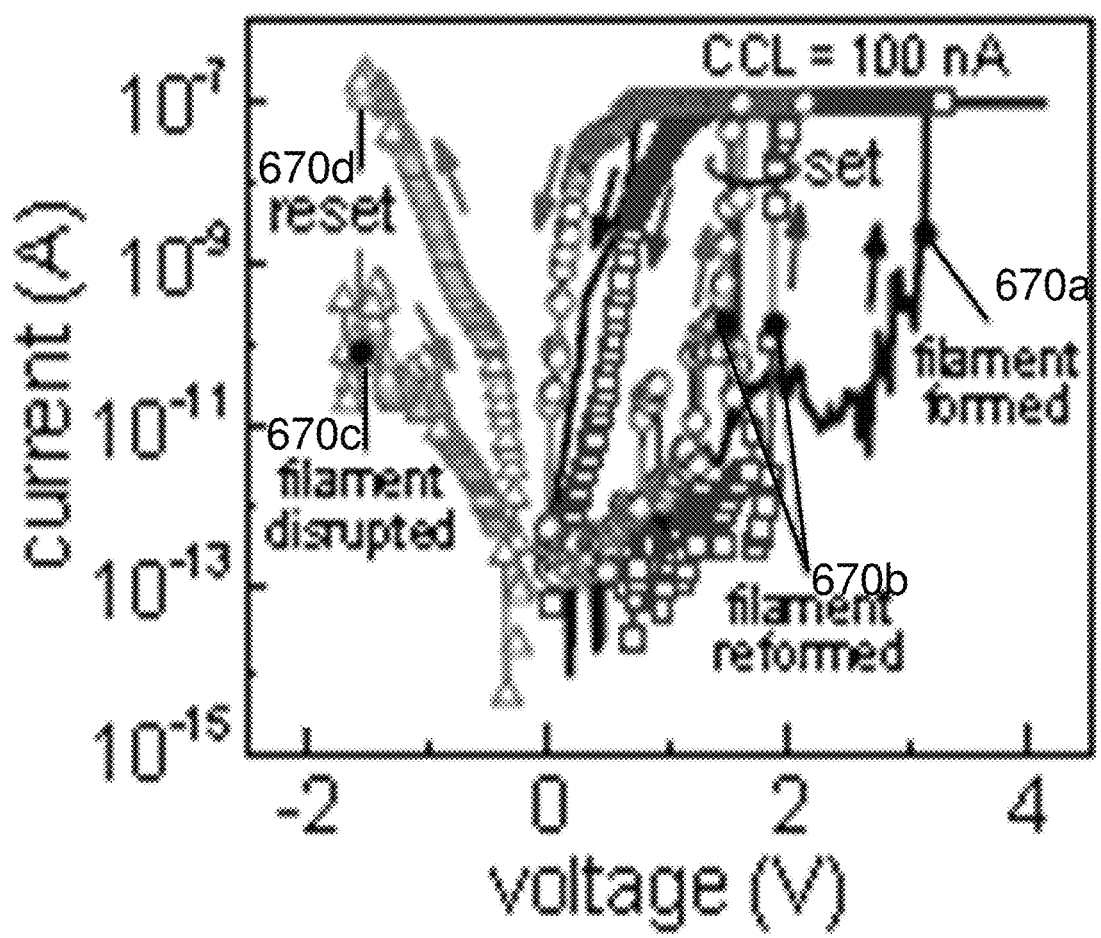
FIG. 6C is a plot illustrating current (amperes or A) as a function of voltage (volts or V) showing dual voltage-sweep measurements performed in the order stated: filament formation, filament reformation (i.e. set) after the light-induced disruption or reset, filament disruption by an opposite-polarity sweep, filament reformation after electrical induced filament disruption according to various embodiments.

FIG. 6C is a plot 670 illustrating current (amperes or A) as a function of voltage (volts or V) showing dual voltage-sweep measurements performed in the order stated: filament formation (670a), filament reformation (i.e. set) after the light-induced disruption or reset (670b), filament disruption by an opposite-polarity sweep (670c); filament reformation after electrical induced filament disruption (670d) according to various embodiments. For illustration purpose, a positive voltage-ramp was used.

The line 670a denotes the current-voltage (I-V) characteristic during the electrical process leading to filament formation. A progressive increase in current with voltage can be seen and filament formation occurs at the instant when an abrupt current increase is detected. The filament formation process may be well controlled in order for the filament formed to exhibit the negative photoconductivity behavior. Allowing the current to rise uncontrollably without any limit may give rise to severe Joule heating which in turn may change the material composition/structure at the breakdown location, leading to a state called hard breakdown. In this circumstance, the negative photoconductivity may not be observed. Thus, filament formation is carried out under a current-limited condition to achieve soft breakdown, with the maximum amount of current allowed to pass through the filament at the instant of its formation capped by the parameter analyzer at a preset level (termed current compliance), e.g. at 100 nA. In other words, when the current reaches this preset level, the parameter analyzer automatically reduces the voltage bias to restrict further evolution towards hard breakdown. In the soft breakdown state, oxygen ions released during the filament formation may populate interstitial sites around the filament—which may be a necessary condition for the negative photoconductivity effect to happen according to theory.

After filament formation at the depicted current compliance of 100 nA, a smaller arbitrary voltage of 1 V was applied to the probe and the current monitored continuously in the dark. The value of the monitoring voltage is large enough to enable the measured current to be distinguished from the noise floor but small enough so as not to induce further breakdown of the oxide region.

Figure 6D:
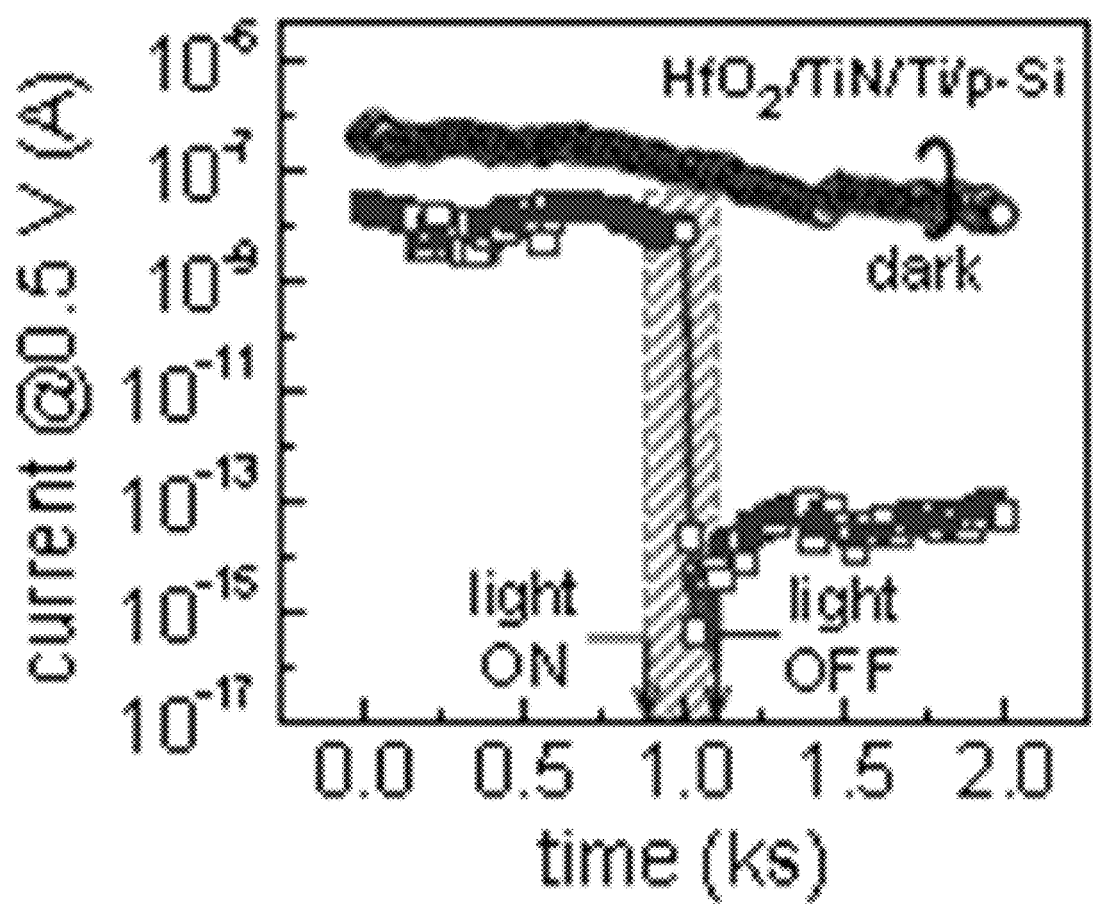
FIG. 6D is a plot of current (amperes or A) as a function of time (kilosecond or ks) showing a disruption in electrical conduction through a nanoscale conducting filament formed in hafnium oxide ($HfO_2$) upon exposure to white light according to various embodiments. No such disruption occurs in the absence of the white light.

FIG. 6D is a plot 680 of current (amperes or A) as a function of time (kilosecond or ks) showing the current-time characteristics of a nanoscale conducting filament formed in hafnium oxide (HfO$_2$) according to various embodiments. The hafnium oxide sample corresponds to sample 600a in FIG. 6A. The circles represent data from a first measurement carried out immediately after filament formation corresponding to 670a in FIG. 6C. The squares represent data from a second measurement with an intermittent white-light exposure at about 875 s. The initial gradual decrease is due to post-electrical-stress relaxation effect, which approaches quasi-saturation after ~2000 s. This can be seen from the constant current when the measurement was restarted in the dark after 2000 s. Upon white-light illumination (at ~875 s), the current decreased abruptly to the measurement floor and it remained at this level after the light was turned off. The estimated intensity of the white light at the sample surface is 1 mW/cm$^2$. The actual light energy entering the oxide layer is further reduced by reflection. Since the current was stable for a long period prior to the white-light exposure, the role of thermal induced probe drift on the current decrease may be excluded. The observation thus shows that electrical conduction through the filament was disrupted upon white-light illumination, i.e. the resistance of the filament was "reset" to a higher level by the light. A positive-voltage sweep measurement performed after the light induced reset (LIR) reveals a current comparable to that before the filament was first formed (square; FIG. 6D), confirming that the breakdown oxide region had been "repaired". However, reformation of the filament now occurred at a lower voltage (~2 V) compared to the first formation (~3 V). This shows that although white light may restore the resistance of the breakdown oxide, the chemistry of the restored oxide region may differ from that present before the first breakdown. After the filament was reformed by the positive-voltage sweep, it was subjected to a negative-voltage sweep during which a significant decrease in current was observed (670c).

This behavior is typical of the bipolar reset characteristic of the HfO$_2$ RRAM device. Following this electrical induced reset, a subsequent positive-voltage sweep resulted in filament reformation at nearly the same voltage (670*d*) as that after LIR. This implies that the effect of LIR is similar to that of an electrical induced reset.

To further confirm the photosensitivity of the breakdown oxide region, current maps of the filament and its surrounding area before and after white-light illumination were obtained.

Figure 7A:
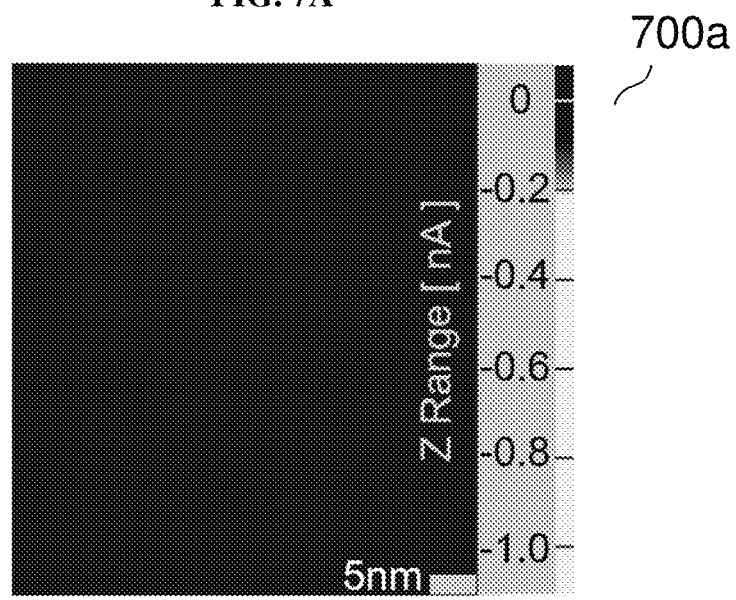
FIG. 7A shows a current map before filament formation according to various embodiments.
Figure 7B:
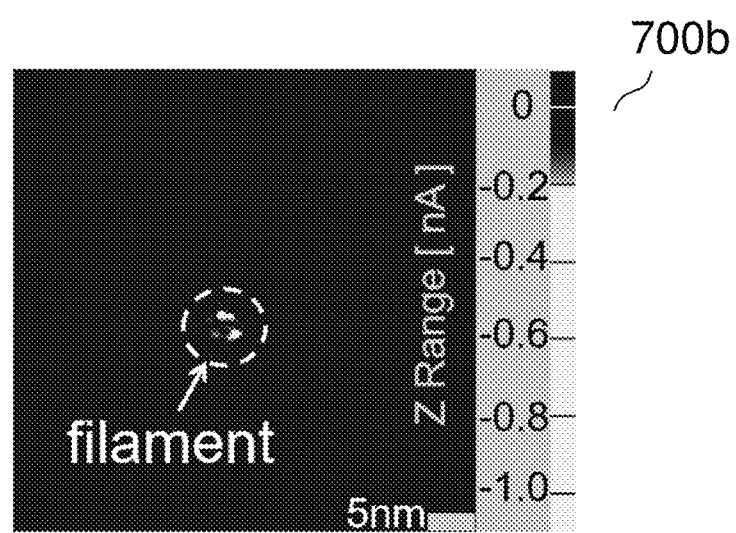
FIG. 7B shows a current map after filament formation according to various embodiments, with the filament denoted by the bright shade (about 4 nm in diameter, peak current >1 nA).
Figure 7C:
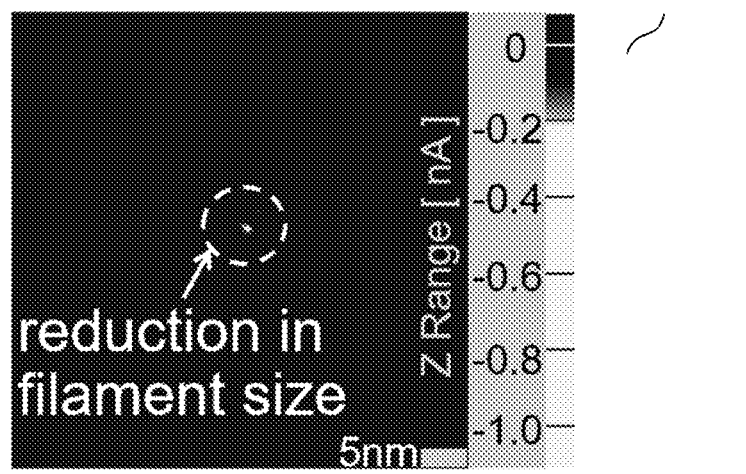
FIG. 7C shows a current map after 30 seconds of white light illumination (light intensity at sample surface is about 1 $mW/cm^2$) according to various embodiments.
Figure 7D:
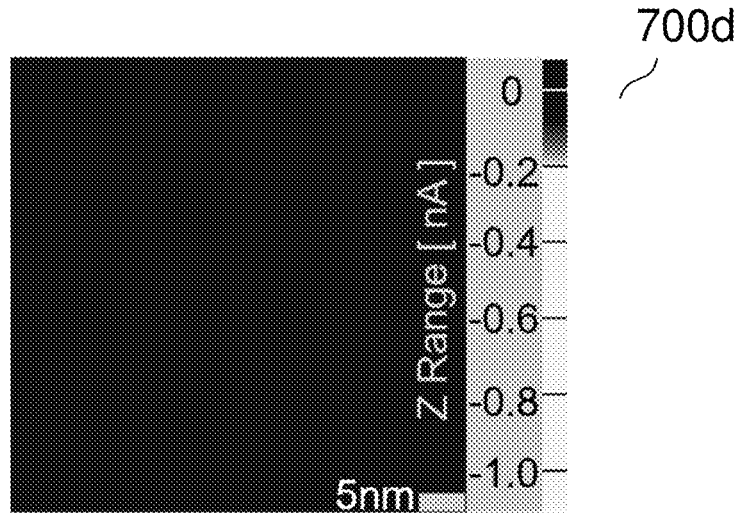
FIG. 7D shows a current map in which the filament has almost completely "disappeared" (i.e. the low resistance of the breakdown oxide is restored to higher resistance) after a further 300 seconds white-light illumination according to various embodiments.
Figure 7E:
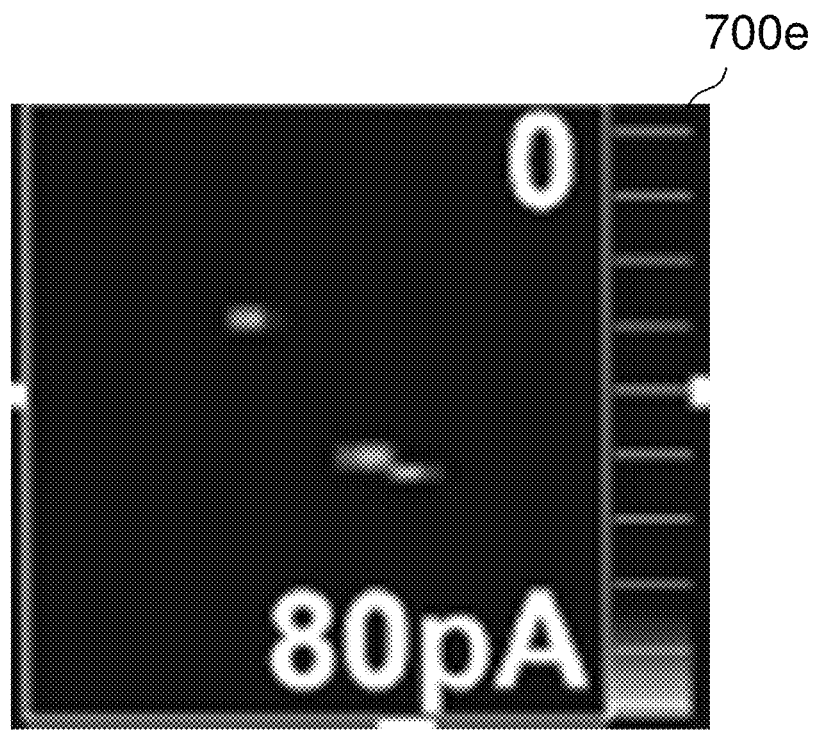
FIG. 7E shows a current map at a much reduced current scale according to various embodiments.

FIGS. 7A-E show the current maps (measured with a +1.5 V applied to the CAFM probe) of the filament and its surrounding area depicting the photosensitivity of the breakdown oxide region according to various embodiments. The time needed to obtain a current map is about 20 minutes. FIG. 7A shows a current map 700*a* before filament formation according to various embodiments. FIG. 7B shows a current map 700*b* after filament formation according to various embodiments, with the filament denoted by the bright shade (about 4 nm in diameter, peak current >1 nA). FIG. 7C shows a current map 700*c* after 30 seconds of white light illumination (light intensity at sample surface is about 1 mW/cm$^2$) according to various embodiments. A less bright filament is seen in FIG. 7C. FIG. 7D shows a current map 700*d* in which the filament has almost completely "disappeared" (i.e. the low resistance of the breakdown oxide is restored to higher resistance) after a further 300 seconds white-light illumination according to various embodiments. FIG. 7E shows a current map 700*e* at a much reduced current scale according to various embodiments. As seen in FIG. 7E, remnants of the filament are visible only at a much reduced scale.

In the current map, a bright shade denotes a region of high conductivity. After soft breakdown, the filament is highly conductive and the breakdown oxide region is therefore much brighter than its surrounding area, as shown in FIG. 7B. Upon white-light illumination for about 30 s, the filament conductivity is markedly decreased, as shown in FIG. 7C. The filament is hardly distinguishable from its surrounding upon further illumination for another 300 s as shown in FIG. 7D, indicating that the leaky filament is successfully eliminated and the insulating property of the breakdown oxide region restored.

The resistance of the filament may be precisely modulated by varying the light exposure period (for a given light intensity) or the light intensity (for a given exposure period). This relationship between filament resistance and light energy may make the negative photoconductivity phenomenon suitable for imaging application.

The LIR effect may also be consistently observed on samples made up of other oxides (ZrO$_2$, SiO$_2$) as well as those having the gate stack (i.e. MOS) structure.

Figure 8A:
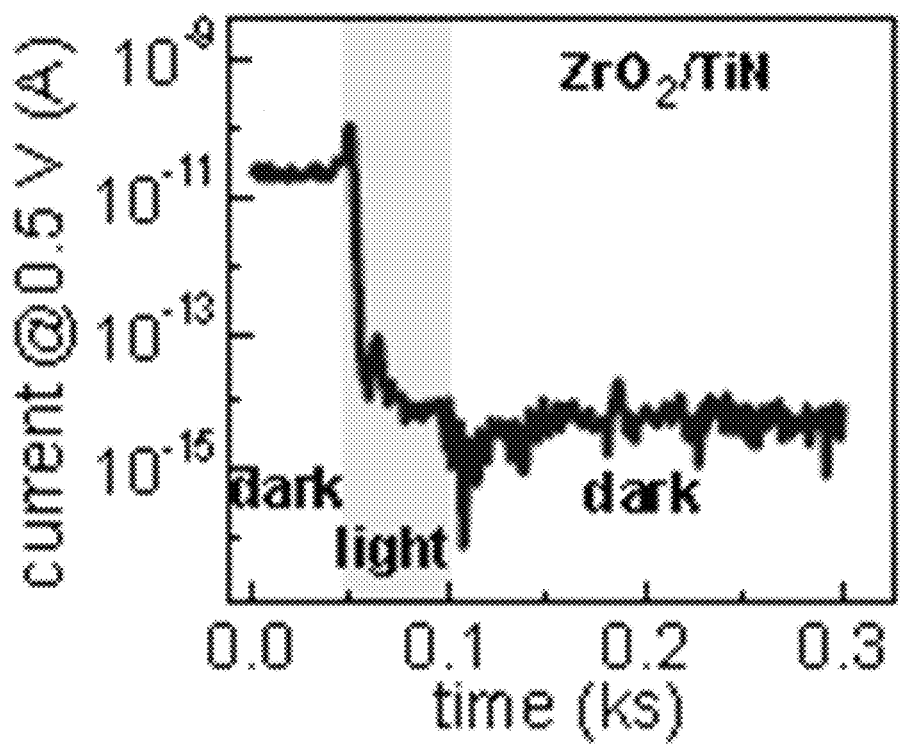
FIG. 8A is a plot of current (amperes or A) as a function of time (kiloseconds or ks) illustrating the disruption, upon white-light illumination, of electrical conduction through a percolation or breakdown path formed in zirconium oxide ($ZrO_2$) according to various embodiments.
Figure 8B:
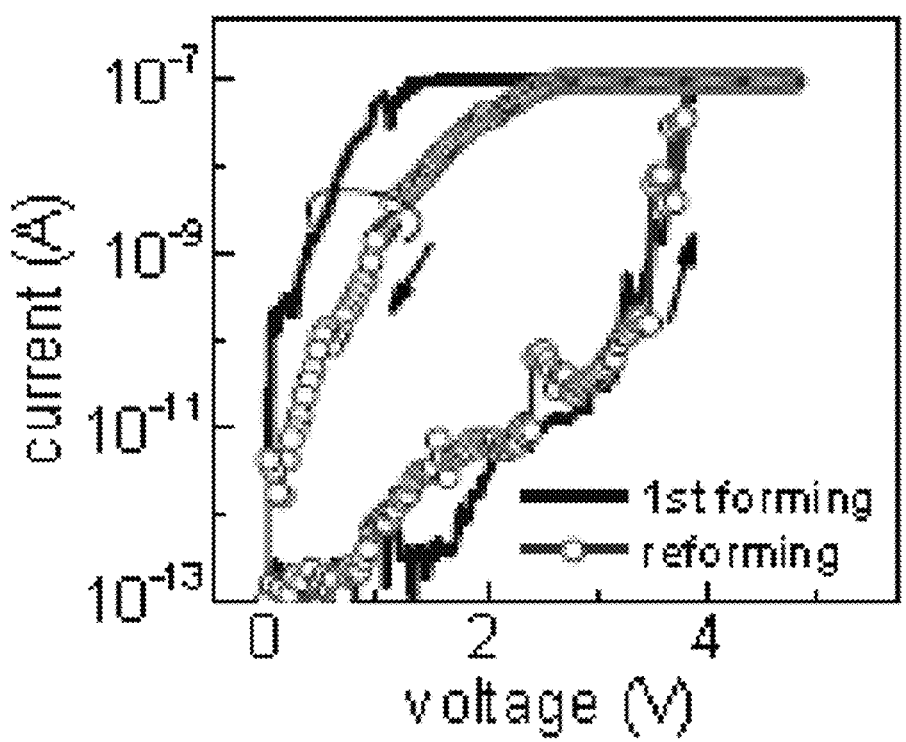
FIG. 8B is a plot of current (amperes or A) as a function of voltage (volts or V) illustrating percolation path formation and reformation at the same location after white-light illumination according to various embodiments.

FIG. 8A is a plot 800*a* of current (amperes or A) as a function of time (kiloseconds or ks) illustrating the disruption, upon white-light illumination, of electrical conduction through a percolation or breakdown path formed in zirconium oxide (ZrO$_2$) according to various embodiments. FIG. 8B is a plot 800*b* of current (amperes or A) as a function of voltage (volts or V) illustrating percolation path formation and reformation at the same location after white-light illumination according to various embodiments. The arrows denote directions of voltage sweep beginning at 0 V.

As shown in FIG. 8A for the ZrO$_2$/TiN sample 600*b*, conduction through the filament formed after soft breakdown (via positive voltage ramping) may be successfully disrupted when illuminated by white light, similar to that seen in the HfO$_2$ sample 600*a*. For this location tested, filament reformation (i.e. second soft breakdown at the same location during a post-LIR positive-voltage sweep) occurred at nearly the same voltage as that for the first SBD (as shown in FIG. 8B), implying that the breakdown oxide region had been restored to almost the original state.

Figure 9A:
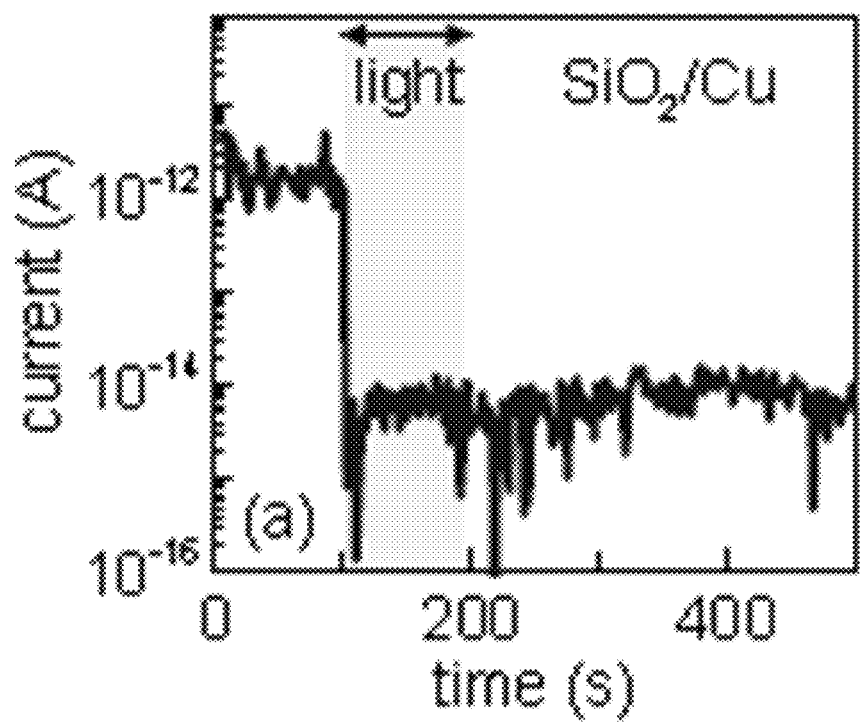
FIG. 9A is a plot of current (amperes or A) as a function of time (seconds or s) showing light induced reset in the silicon oxide/copper ($SiO_2$/Cu) stack according to various embodiments.
Figure 9B:
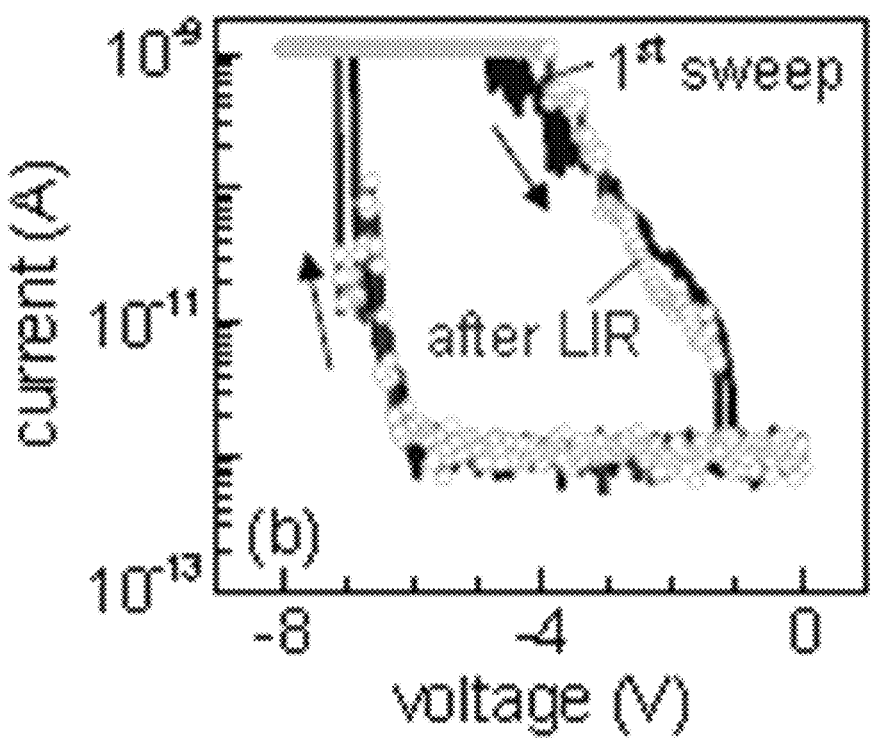
FIG. 9B is a plot of current (amperes or A) as a function of voltage (volts or V) showing the first formation of the conducting filament and reformation after light induced reset (LIR) according to various embodiments.

FIG. 9A is a plot 900*a* of current (amperes or A) as a function of time (seconds or s) showing light induced reset in the silicon oxide/copper (SiO$_2$/Cu) stack 600*c* according to various embodiments. FIG. 9B is a plot 900*b* of current (amperes or A) as a function of voltage (volts or V) showing the first formation of the conducting filament and reformation after light induced reset according to various embodiments. The arrows denote directions of voltage sweep beginning at 0 V.

Figure 10A:
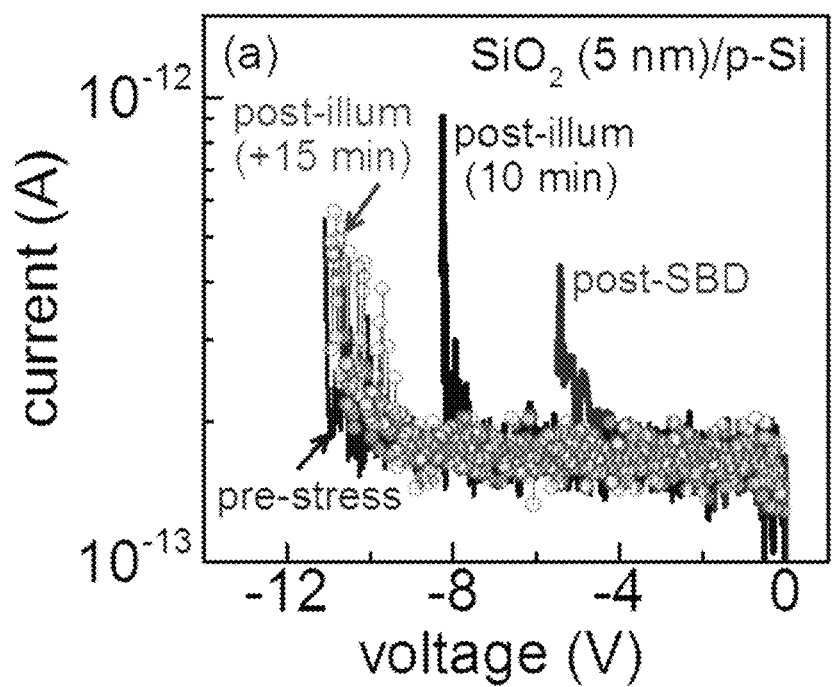
FIG. 10A is a plot of current (amperes or A) as a function of voltage (volts or V) showing effect of white-light illumination on the post-soft breakdown current-voltage characteristics of a silicon oxide/silicon ($SiO_2$/Si) stack according to various embodiments.
Figure 10B:
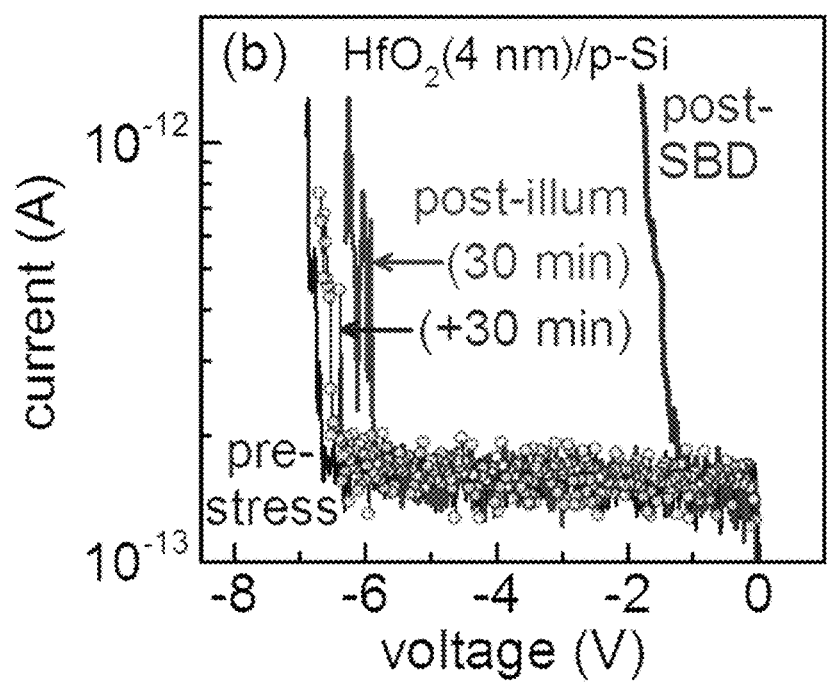
FIG. 10B is a plot of current (amperes or A) as a function of voltage (volts or V) showing effect of white-light illumination on the post-soft breakdown current-voltage characteristics of a hafnium oxide/silicon ($HfO_2$/Si) stack according to various embodiments after the oxide has suffered soft-breakdown under positive constant-voltage stressing.
Figure 10C:
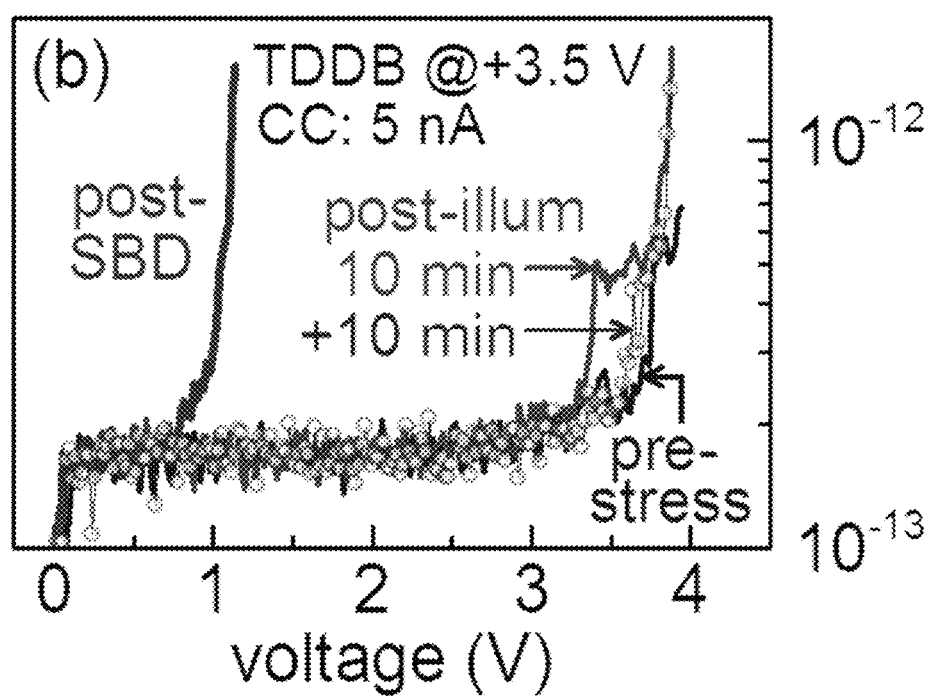
FIG. 10C is a plot of current (amperes or A) as a function of voltage (volts or V) showing effect of white-light illumination on the post-soft breakdown current-voltage characteristics of a hafnium oxide/silicon ($HfO_2$/Si) stack according to various embodiments after the oxide has suffered soft-breakdown under negative constant-voltage stressing.

FIG. 10A is a plot 1000*a* of current (amperes or A) as a function of voltage (volts or V) showing effect of white-light illumination on the post-soft breakdown current-voltage characteristics of a silicon oxide/silicon (SiO$_2$/Si) stack 600*e* according to various embodiments. During illumination, the probe voltage was 0 V. The illumination time is given in parenthesis; '+' denotes additional illumination time. Soft breakdown (SBD) was induced by constant-voltage stressing at −10 V, with current compliance of 0.5 nA. The breakdown oxide may be completely restored after 25 minutes of illumination. FIG. 10B is a plot 1000*b* of current (amperes or A) as a function of voltage (volts or V) showing effect of white-light illumination on the post-soft breakdown current-voltage characteristics of a hafnium oxide/silicon (HfO$_2$/Si) stack 600*d* according to various embodiments after the oxide has suffered soft-breakdown under positive constant-voltage stressing. FIG. 10C is a plot 1000*c* of current (amperes or A) as a function of voltage (volts or V) showing effect of white-light illumination on the post-soft breakdown current-voltage characteristics of a hafnium oxide/silicon (HfO$_2$/ Si) stack 600*d* according to various embodiments after the oxide has suffered soft-breakdown under negative constant-voltage stressing.

A similar LIR effect is seen in the SiO$_2$/Cu sample 600*c* (FIGS. 9A and 9B) as well as in the SiO$_2$/Si sample 600*e* (FIG. 10A) and the HfO$_2$/Si gate stack sample 600*d* (FIG. 10B). For the gate stack samples 600*d*, 600*e*, the current-time curve was not monitored under illumination as the injection of optically generated electrons in the Si substrate also contributed to the measured current. Instead, the pre-stress, post-SBD and post-illumination current-voltage (I-V) curves are compared. The post-soft-breakdown curve was taken after post-stress relaxation effect has quasi-saturated but before white-light illumination. Soft breakdown was induced via constant-voltage stressing (CVS) and the stressing aborted by the parameter analyzer when the current surge during breakdown exceeds a preset current compliance. As is apparent for both the SiO$_2$/Si and HfO$_2$/Si stack, the post-soft-breakdown I-V curve is progressively shifted towards the pre-stress counterpart following white-light illumination. After a sufficiently long illumination period, the restored I-V curve may be seen to almost coincide with the pre-stress curve, indicating that the breakdown path has been successfully eliminated. The fully restored oxide region may exhibit a similar robustness against electrical induced breakdown during re-stressing.

Figure 11A:
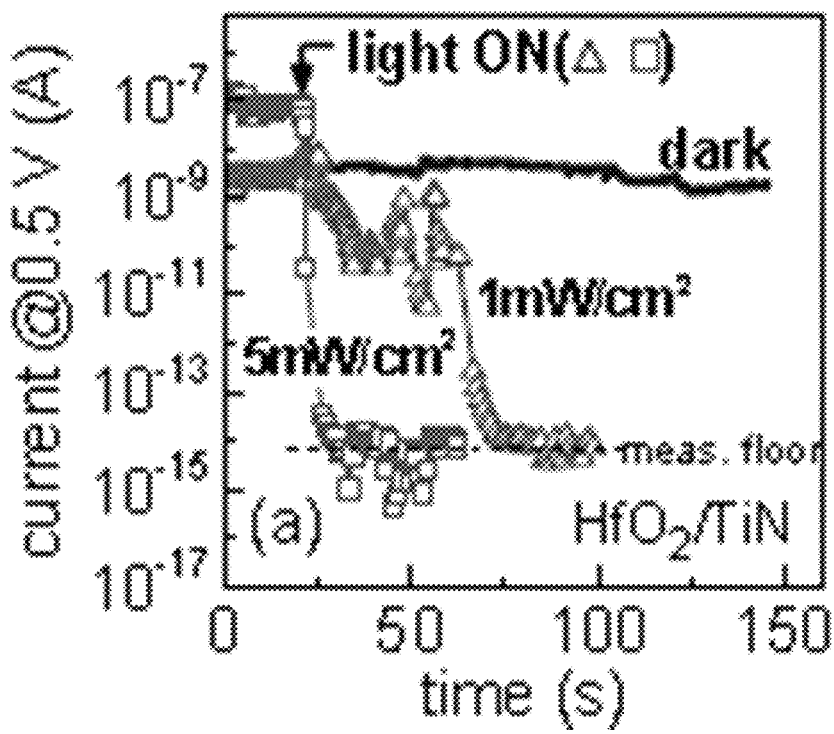
FIG. 11A is a plot of current (amperes or A) as a function of time (seconds or s) showing that filament disruption may occur at a faster rate when illuminated under white light of a higher intensity according to various embodiments.
Figure 11B:
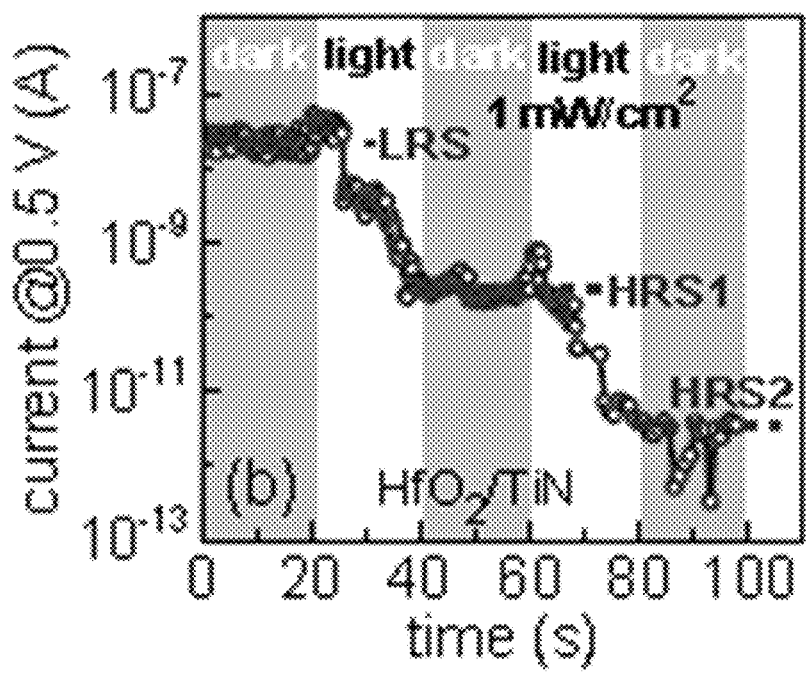
FIG. 11B is a plot of current (amperes or A) as a function of time (seconds or s) showing a relatively stable current plateau denoting an intermediate high resistance state (HRS1), between the low resistance state (LRS) and a further higher resistance state (HRS2), may be achieved by removing the white-light illumination after 20 seconds, with the further higher resistance state (HRS2) achieved by resuming illumination for another 20 seconds according to various embodiments.

It is also of interest to also examine the impact of light intensity and duration on the resistance reset. Results are shown in FIGS. 11A, 11B. FIG. 11A is a plot 1100*a* of current (amperes or A) as a function of time (seconds or s) showing that filament disruption may occur at a faster rate when illuminated under white light of a higher intensity according to various embodiments. FIG. 11B is a plot 1100*b* of current (amperes or A) as a function of time (seconds or s) showing a relatively stable current plateau denoting an intermediate high resistance state (HRS1), between the low resistance state (LRS) and a further higher resistance state (HRS2), may be achieved by removing the white-light illumination after 20 seconds, with the further higher resistance state (HRS2) achieved by resuming illumination for another 20 seconds according to various embodiments.

Initially, white light of a lower intensity was applied to induce resistance reset after forming (triangle). Then, the conducting filament was reformed by ramping up a positive voltage followed by the exposure to white light of a five times higher intensity. As can be seen in FIG. 11A, the current decreases more gradually under the lower intensity light exposure, as compared to the higher intensity case where the current decreases more abruptly (showing a resistance reset that occurred at a distinctively faster rate). In the case of the low-intensity light, it takes 52 s for the current to decrease to the measurement floor. As for the case of the high-intensity light, the time taken is 9.3 s. This 5.7-time reduction corresponds well to the difference between the two light intensities. Clearly, light intensity strongly influences the speed at which the conducting filament is disrupted. The current evolution in the absence of illumination is also shown for comparison.

As the data in FIG. 11A shows, the change in resistance in a specific time interval is determined by the amount of light energy that the filament received, indicating a possibility of achieving multiple resistance levels for a given filament. This is indeed observed in FIG. 11B, where different levels of the conducting filament disruption may be controlled by changing the duration of light exposure. Upon illumination, the current was decreased from the low-resistance state (LRS) to a first high-resistance state (HRS1) in a 20-s interval. The current decrease was obviously arrested when the light illumination is removed, as is evident from the current plateau. When the illumination was resumed, the current was decreased to the next higher resistance state (HRS2). Clearly, by controlling the amount of light energy reaching the filament, multiple resistance values may be generated.

In various embodiments, a light-enabled resistive random access memory (RRAM) resistance tuning approach may be provided as an alternative to the electrical counterpart for neuromorphic computing applications. The electrical tuning approach may be challenging because it requires the control of a set current compliance limit (for DC switching) or set/reset pulse timing (for AC switching).

Figure 12A:
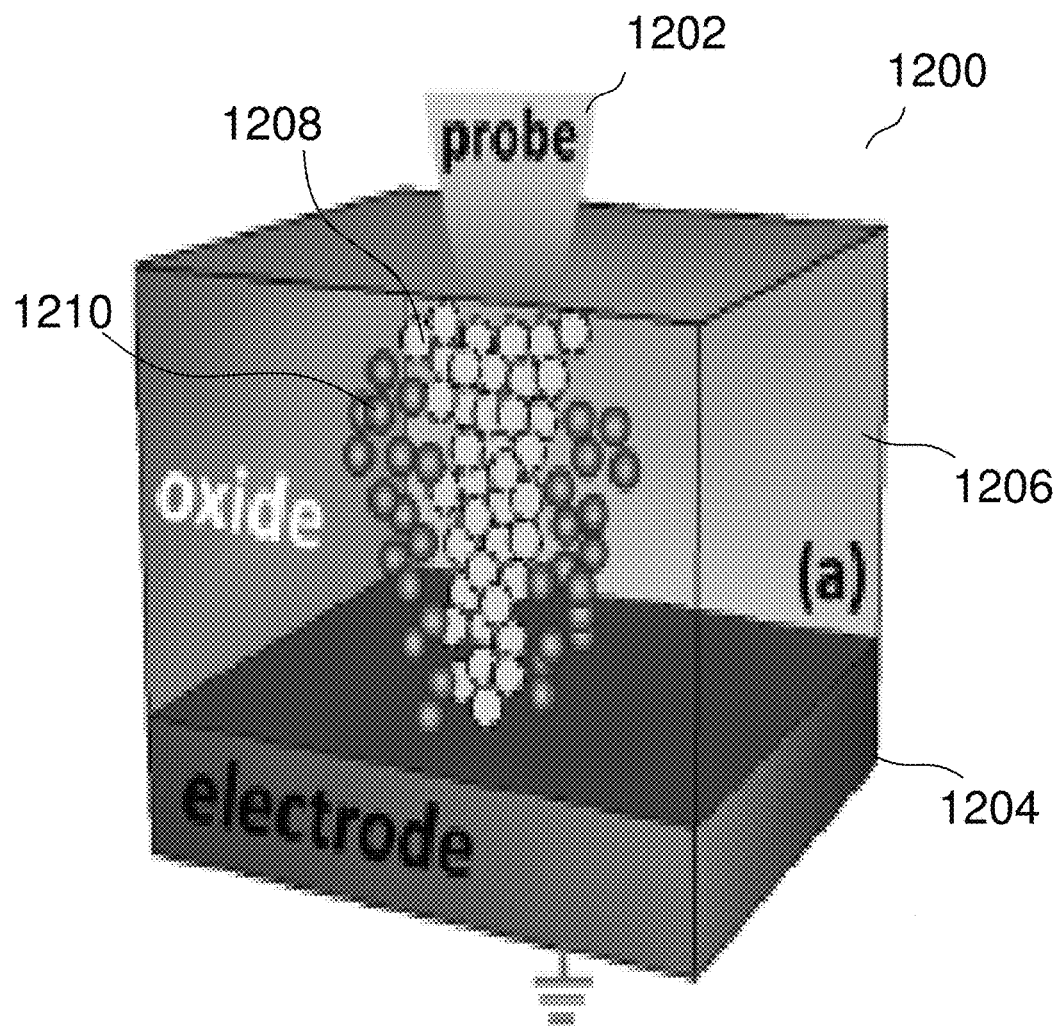
FIG. 12A is a schematic of the probe/oxide/electrode structure showing a conducting filament 1208 made of oxygen vacancies according to various embodiments.
Figure 12B:
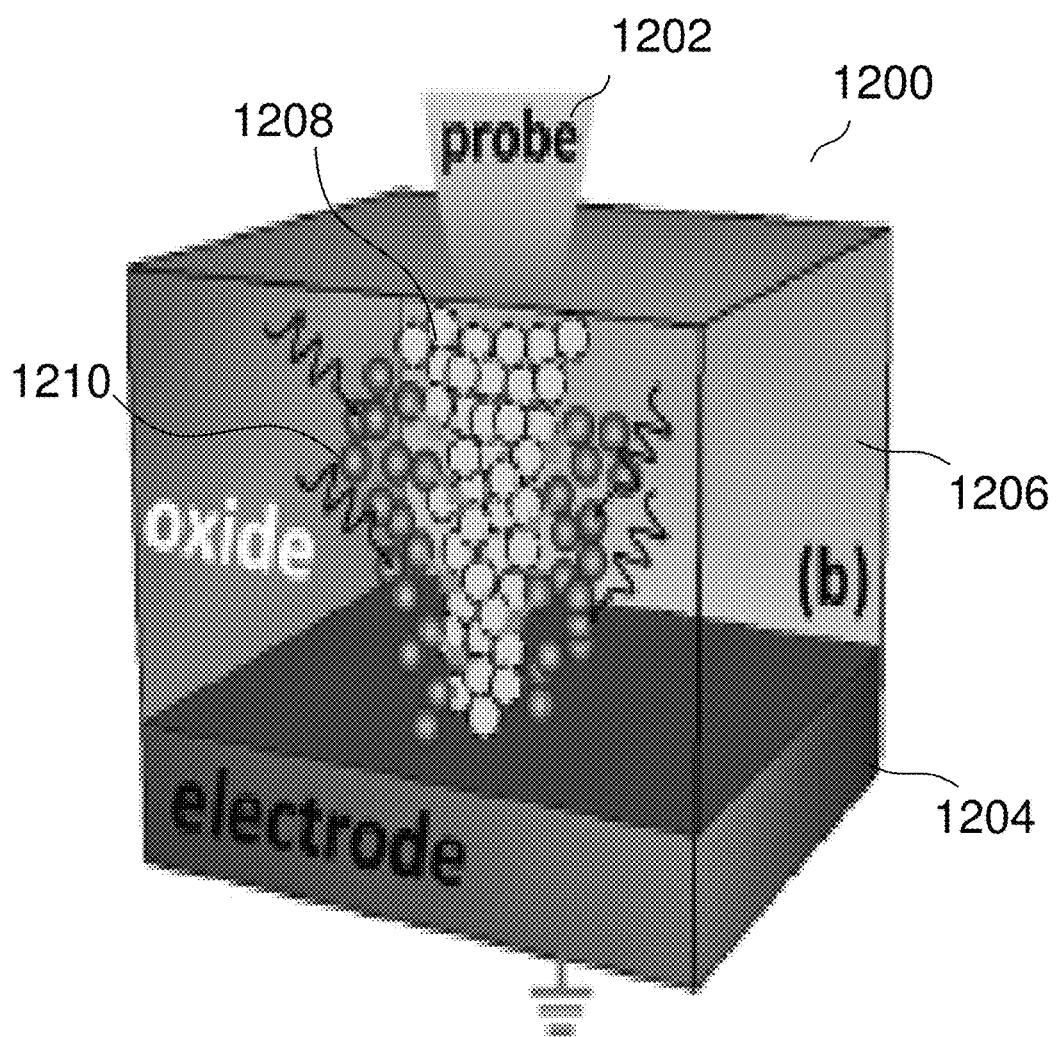
FIG. 12B is a schematic of the probe/oxide/electrode structure shown in FIG. 12A, in which photons from the white-light source excite the interstitial oxygen ions, causing them to migrate and recombine with the vacancies in the filament according to various embodiments.

A possible explanation for the light-induced resistance reset phenomenon is illustrated in FIGS. 12A, 12B. FIGS. 12A, 12B are schematic which provide a physical explanation for white-light induced disruption of filament conduction. FIG. 12A is a schematic of the probe/oxide/electrode structure 1200 showing a conducting filament 1208 made of oxygen vacancies according to various embodiments. The dislodged oxygen ions 1210 may occupy interstitial positions around the vacancy-filled filament 1208 according to various embodiments. FIG. 12B is a schematic of the probe/oxide/electrode structure 1200 shown in FIG. 12A, in which photons from the white-light source excite the interstitial oxygen ions 1210, causing them to migrate and recombine with the vacancies in the filament 1208 according to various embodiments. The structure includes probe 1202, electrode 1204 and an oxide layer 1206 between the probe 1202 and the electrode 1204.

The proposed model may be supported by: 1) studies based on atomic-scale electron-energy loss spectroscopy which show that the breakdown oxide region is depleted of oxygen, i.e. the percolation path or conducting filament comprises of oxygen-vacancy defects; 2) a recent physics based simulation study showing some of the dislodged oxygen ions populating interstitial sites around the vacancy-filled conducting filament when the breakdown process is abruptly terminated. FIG. 12A depicts the formation of an oxygen-deficient conducting filament 1208 through the oxide layer 1206 when a voltage sweep is applied via the C-AFM probe 1202. Electron transport through the oxide film 1206 induces breakage of the metal-oxygen bonds and out-diffusion (assisted by the temperature and electrical field distributions) of the released negatively charged oxygen ions 1210, resulting in the formation of an oxygen-deficient (metal-rich) conducting filament 1208. As the forming process is interrupted when the current reaches a compliance limit, some of the released oxygen ions 1210 remain in the interstitial positions in the vicinity of the filament 1208 and may be subsequently driven back to the filament 1208 by the applied electrical field and temperature gradient during the electrically-controlled reset. The diffusion of interstitial oxygen ions 1210 entails the overcoming of an energy barrier of 0.3-0.6 eV. At a low voltage (below the electrical reset voltage), the diffusion rate would thus be negligibly small. It is suggested that a white light illumination generates a photon-induced excitation of the oxygen ions over the diffusion energy barrier, hence accelerating their diffusion towards the vacancy-rich filament 1208, as illustrated in FIG. 12B. The ion excitation proceeds more efficiently under a stronger light intensity, thus enhancing the migration of oxygen ions 1210 back to the vacancy sites, as manifested by the faster resistance reset rate in FIG. 11A.

Various embodiments may provide for different applications of the negative photoconductivity phenomenon of soft-breakdown oxides. Various embodiments may relate to an oxide image sensor which relies on the demonstrated relationship between filament resistance and light energy. Various embodiments may provide a method for rejuvenating oxide reliability, which depends on the restoration of the breakdown oxide region by light via elimination of the conducting filament.

Various embodiments may relate to other structures and/or methods employing the negative photoconductivity phenomenon. Since the negative photoconductivity of soft breakdown oxide is a physical phenomenon which stems from the interaction between photons and the chemical state of the filament, thereby modifying chemically the oxide region concerned, the phenomenon may have a broad range of optical applications that involve light sensing, or information processing applications that use light to change the logic state of a circuit element.

The basic element of the CMOS sensor array employed in nearly all mobile-phone cameras is a p-n semiconductor junction or a photodiode. Imaging is achieved by light generating excess electrical charge in the photodiode, the amount of which depends on the light energy entering the photodiode. The excess charges are then read by a periphery circuitry to determine the amount of light energy falling on a particular photodiode for imaging reconstruction purpose. The performance of a CMOS sensor (e.g. dynamic range, signal-to-noise ratio, etc.) is directly dependent on the size of the photodiode. More charges can be generated in a large photodiode, which translate into a richer tone of colors and enabling the sensor to fully reproduce the light details. A large photodiode, however, has a more dark current and is less sensitive to low-light conditions.

In the oxide image sensor according to various embodiments, the nanoscale conducting filament may replace the photodiode as the light-sensing element. Instead of generating excess electrical charge, the light may modulate the resistance of the filament. The extent of resistance modulation may depend on the amount of light energy that impinges on the filament (as shown in FIG. 11A). The oxide image sensor may be referred to as an image sensor or an oxide sensor array.

EXPERIMENT 2

The test sample including a 4-nm thick $HfO_2$ layer, formed via the process of atomic-layer deposition on the titanium nitride/titanium/p-type silicon substrate (TiN/Ti/p-Si) is fabricated. Tetrakis (dimethylamino) hafnium was used as the metal precursor and $H_2O$ vapor as the oxidizer. The growth temperature and pressure were 250° C. and 0.1 Torr, respectively. No post-deposition annealing was carried out. A control sample of titanium nitride/titanium/p-type silicon substrate (TiN/Ti/p-Si) is also fabricated.

The conducting filament was formed in the $HfO_2$ layer with a setup similar to that shown in FIG. 6B. The white light source (of wavelengths ranging from about 400 nm to about 700 nm) used in this study was a standard light emitting diode (LED) lamp, positioned at a quartz window of the UHV chamber at a distance of about 30 cm from the sample.

The angle of incidence was about 45°. Measurement under light exposure was also performed on a bare TiN surface (i.e., a control sample without an active oxide layer).

Figure 13A:
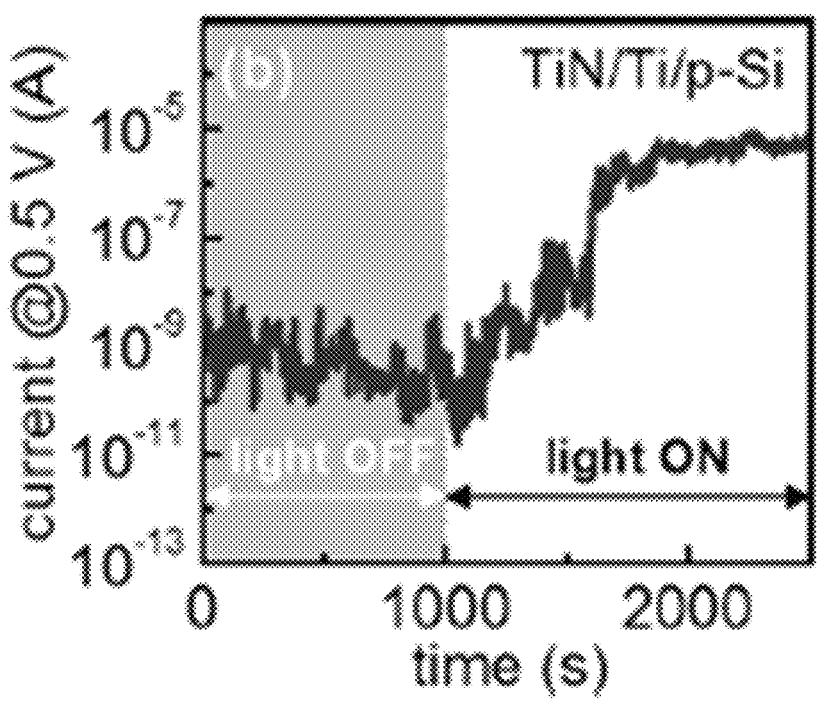
FIG. 13A is a plot of current (amperes or A) as a function of time (second or s) illustrating white light illumination of titanium nitride/titanium/p-type silicon (TiN/Ti/p-Si).
Figure 13B:
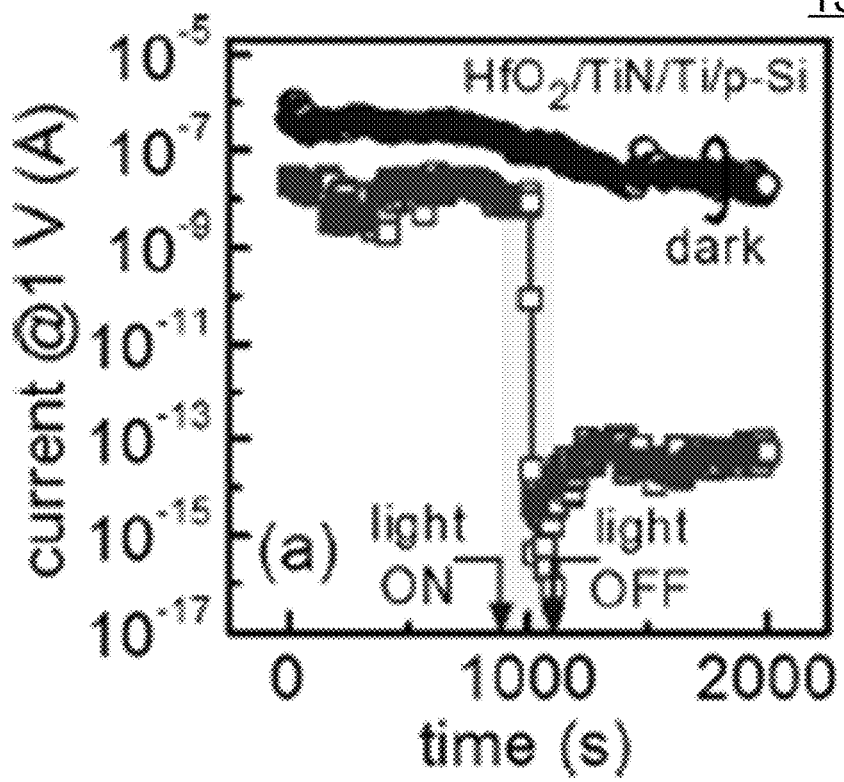
FIG. 13B is a plot of current (amperes or A) as a function of time (second or s) showing current versus time characteristics of a conducting filament according to various embodiments.

FIG. 13A is a plot 1300a of current (amperes or A) as a function of time (second or s) illustrating white light illumination of titanium nitride/titanium/p-type silicon (TiN/Ti/p-Si). FIG. 13A shows the typical photoconductive response (i.e. current increase upon illumination) for this control sample. FIG. 13B is a plot 1300b of current (amperes or A) as a function of time (second or s) showing current versus time characteristics of a conducting filament according to various embodiments. The circles represent data from measurement made after forming in darkness throughout, while the squares represent data from measurement made following a 2000s period with a brief exposure to white light. The photoconductive response for the $HfO_2$/TiN/Ti/p-Si sample is similar to the plot shown in FIG. 6D, and shows a current decrease upon illumination. FIG. 13A verifies that the current decrease in FIG. 13B observed under illumination is a result of the disruption of the conducting filament in the $HfO_2$. As is apparent in FIG. 13A, the current was significantly increased after the light was turned on. This behavior is totally opposite to the decrease observed in the $HfO_2$/TiN/Ti/p-Si sample, confirming that the latter arose from the disruption of the conducting filament in the $HfO_2$. The increase in current in the control sample may be attributed to photon absorption at the TiN surface, which yields "hot electrons" that may easily overcome the TiN-to-probe contact barrier formed by the thin surface oxide. The light induced reset (LIR) effect depicted in FIG. 13B was also observed using a scanning tunneling microscope made of platinum/iridium (Pt/Jr) with 80 atomic percent Pt, thus eliminating any possible role of the probe on the observed effect.

Figure 13C:
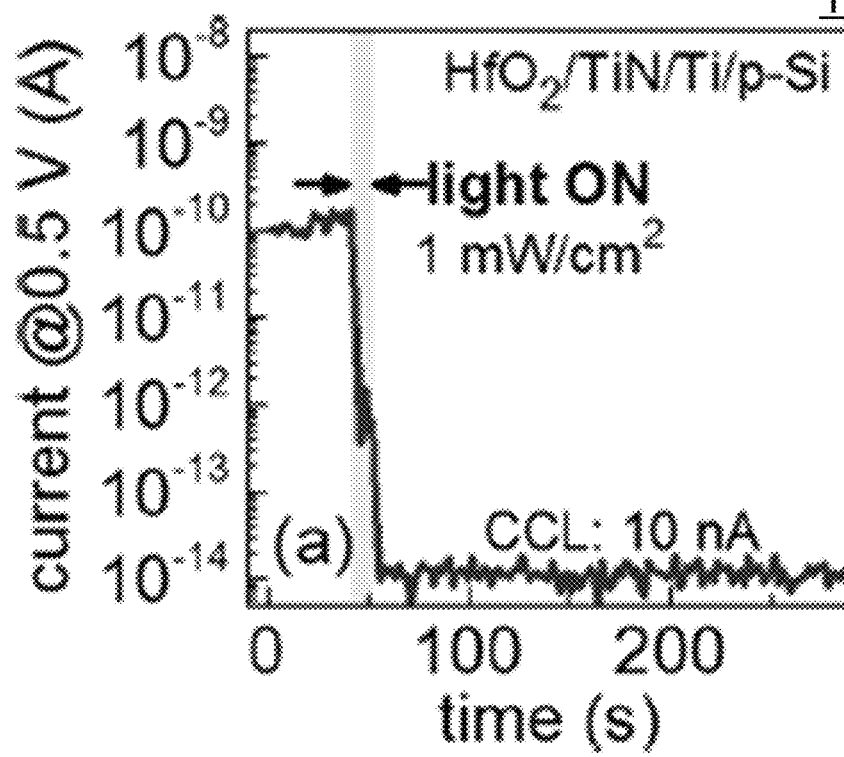
FIG. 13C is a plot of current (amperes or A) as a function of time (second or s) illustrating when light of a given intensity and exposure duration (10 s) results in a complete reset or disruption of the filament formed with a lower current compliance limit (CCL) according to various embodiments.
Figure 13D:
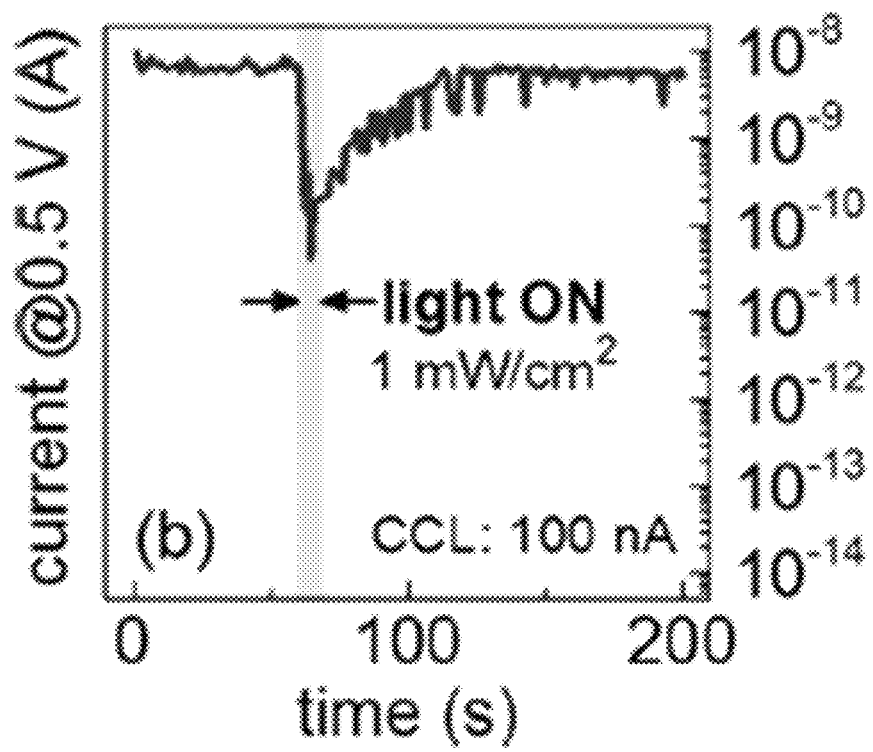
FIG. 13D is a plot of current (amperes or A) as a function of time (second or s) illustrating when light of a given intensity and exposure duration (10 s) results in a partial reset of the filament formed at a higher current compliance limit (CCL).

The effect of the conducting filament dimension, determined by the current compliance limit (CCL) used during the DC forming process, on light-induced reset is shown in FIGS. 13C and 13D. FIGS. 13C and 13D show the influence of the CCL used to form the conducting filament on subsequent light induced reset to a high resistance state.

FIG. 13C is a plot 1300c of current (amperes or A) as a function of time (second or s) illustrating when light of a given intensity and exposure duration (10 s) results in a complete reset or disruption of the filament formed with a lower CCL (10 nA) according to various embodiments. FIG. 13D is a plot 1300d of current (amperes or A) as a function of time (second or s) illustrating when light of the same intensity and exposure duration (10 s) results in a partial reset of the filament formed at a higher CCL (100 nA). The partial reset is evident from the much higher current at the end of illumination. Further, a post exposure gradual recovery of the current towards the level prior to illumination may be observed.

When the conducting filament is formed at a low CCL (of 10 nA), the light-induced reset state is relatively stable (i.e., after the light is turned off, the current remains constant at a low level throughout the entire duration of the observation time). On the other hand, when the conducting filament is reformed at a higher CCL of 100 nA, the light induced reset is less complete and unstable (i.e., the current after illumination is much higher than the case of low CCL and can be seen to gradually increase back to the prereset level). Similar results are obtained on the $ZrO_2$/TiN/Ti/p-Si sample.

Figure 14A:
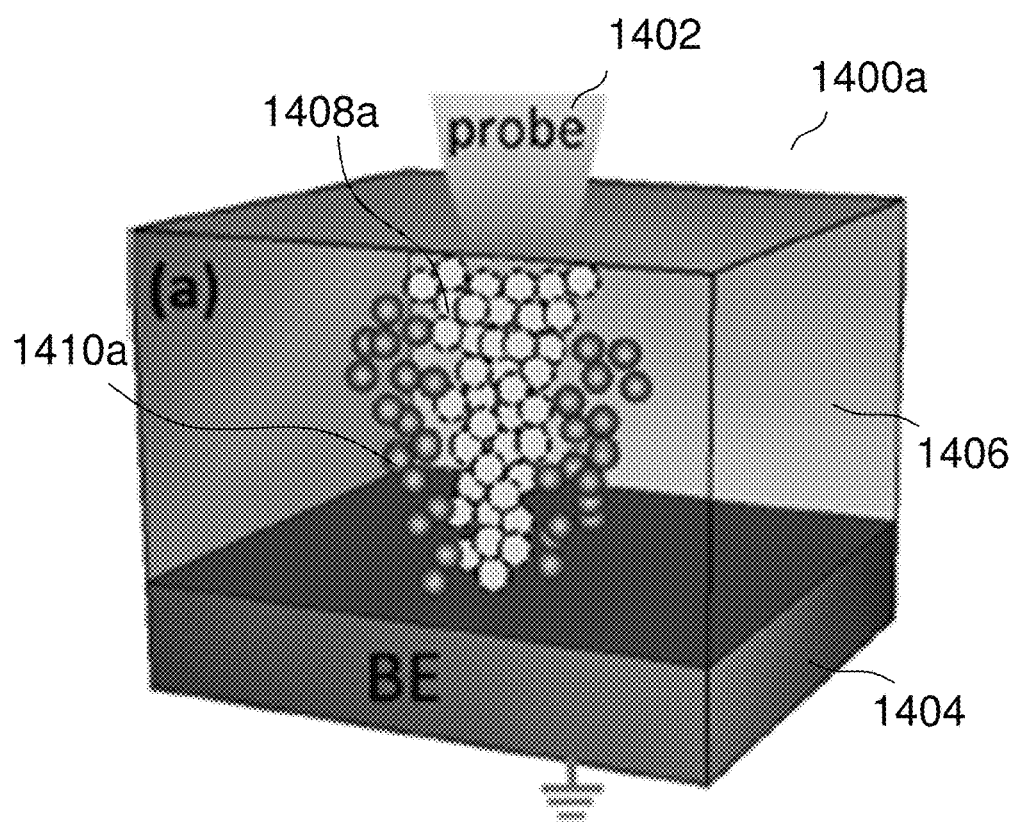
FIG. 14A is a schematic of the probe/oxide/electrode structure showing a conducting filament made of oxygen vacancies according to various embodiments.
Figure 14B:
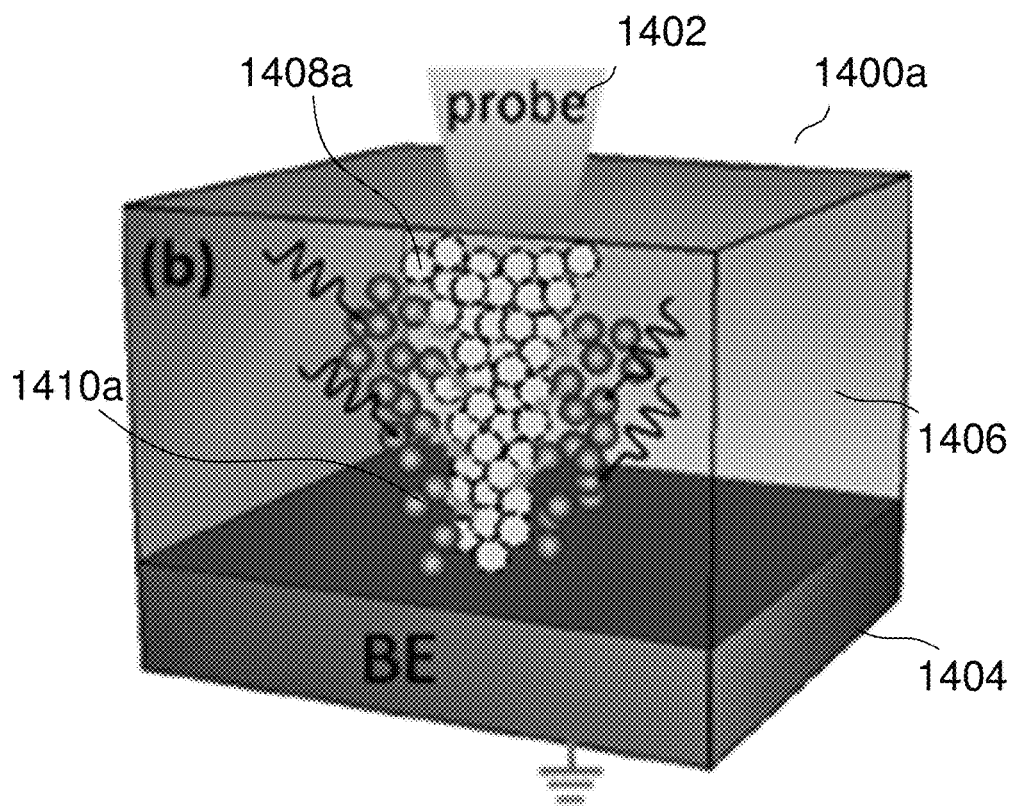
FIG. 14B is a schematic of the probe/oxide/electrode structure shown in FIG. 14A, in which photons from the white-light source excite the interstitial oxygen ions, causing them to migrate and recombine with the vacancies in the filament according to various embodiments.

A possible explanation for the light-induced resistance reset phenomenon is illustrated in FIGS. 14A-D, based on the oxygen migration model. FIG. 14A is a schematic of the probe/oxide/electrode structure 1400a showing a conducting filament 1408a made of oxygen vacancies according to various embodiments. The dislodged oxygen ions 1410a may occupy interstitial positions around the vacancy-filled filament 1408a according to various embodiments. FIG. 14B is a schematic of the probe/oxide/electrode structure 1400a shown in FIG. 14A, in which photons from the white-light source excite the interstitial oxygen ions 1410a, causing them to migrate and recombine with the vacancies in the filament 1408a according to various embodiments. In other words, FIG. 14B shows disruption of the filament 1408a by recombination of filament vacancies and photoexcited oxygen ions 1410a from the vicinity.

Figure 14C:
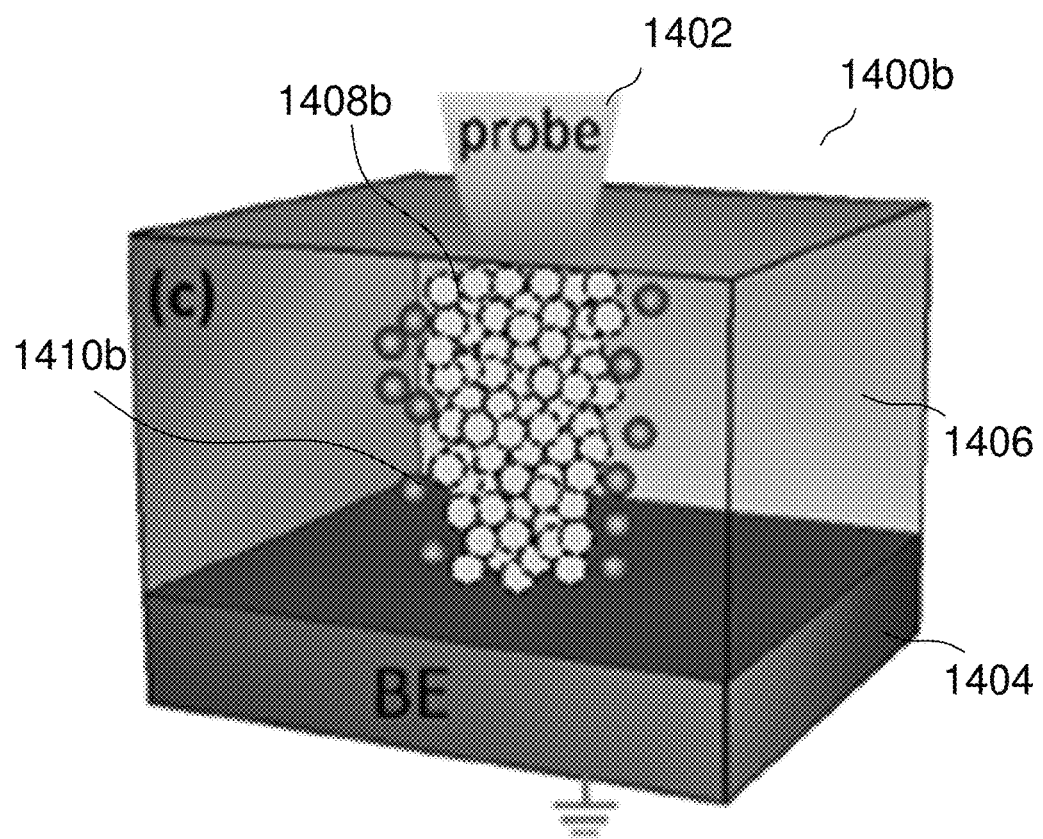
FIG. 14C is a schematic of the probe/oxide/electrode structure (compared to the structure shown in FIG. 14A) in which the filament formed at higher current compliance has fewer interstitial oxygen vacancies in its vicinity due to increased lateral propagation of the released oxygen ions 1410b according to various embodiments.
Figure 14D:
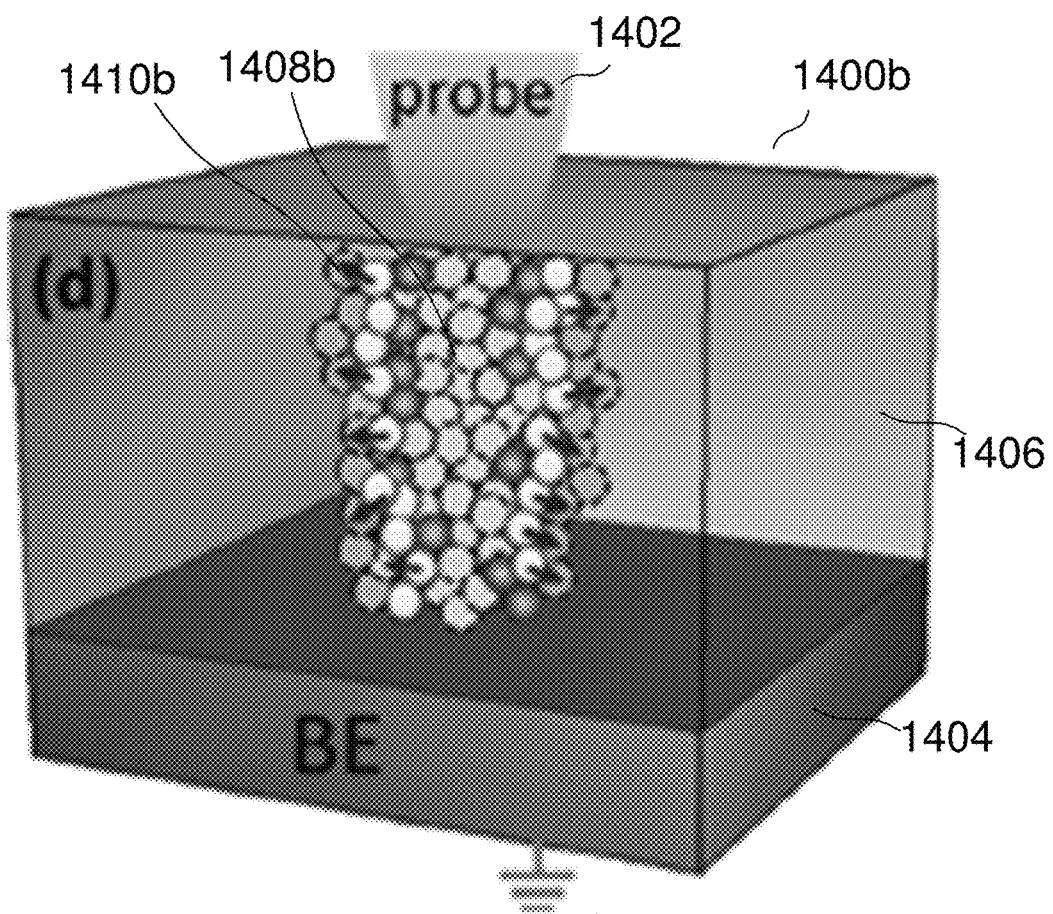
FIG. 14D is a schematic of the probe/oxide/electrode structure shown in FIG. 14C illustrating partial filament disruption according to various embodiments due to limited supply of photo-excited migrating oxygen ions, including weakly bonded lattice oxygen in the filament vicinity.

FIG. 14C is a schematic of the probe/oxide/electrode structure 1400b (compared to the structure 1400a shown in FIG. 14A) in which the filament 1408b formed at higher current compliance has fewer interstitial oxygen vacancies in its vicinity due to increased lateral propagation of the released oxygen ions 1410b according to various embodiments. FIG. 14D is a schematic of the probe/oxide/electrode structure 1400b shown in FIG. 14C illustrating partial filament disruption according to various embodiments due to limited supply of photo-excited migrating oxygen ions 1410b, including weakly bonded lattice oxygen in the filament vicinity. Additional vacancies generated lead to oxygen back-diffusion (arrows) and filament reformation after light exposure. Each of both structures 1400a, 1400b includes a probe 1402, an electrode 1404 and an oxide layer 1406 between the probe 1402 and the electrode 1404.

These observations shown in FIGS. 13C-D are consistent with the model discussed in FIGS. 14A-D. When a lower CCL is used during DC forming, fewer oxygen ions are released due to a smaller required filament cross-section. Since the process involved is shorter (terminated once the low CCL is reached), a larger portion of the released oxygen ions populate interstitial sites in the immediate vicinity of the filament (FIG. 14A). These interstitial oxygen ions may then recombine with the filament vacancies during light-driven reset (FIG. 14B). On the other hand, a DC forming process using a larger CCL releases more oxygen ions (due to a larger filament cross-section) and also enables a larger share of the released ions to propagate further away from the filament as a result of the greater Joule heating and longer process involved (FIG. 14C). Then, during a subsequent light exposure, a smaller share of the light-activated interstitial oxygen ions distributed throughout the dielectric volume may potentially reach the filament, resulting in only partial filament disruption. As the recombination of filament vacancies may also involve light-stimulated migration of weakly bonded lattice oxygen ions in the filament vicinity towards the filament vacancies, the resultant vacancies formed would in turn trigger the back-diffusion and reformation of filament vacancies (FIG. 14D) after the light was turned off. This may explain the gradual recovery of the current towards the pre-illumination level.

It should be noted that in FIG. 13B, the filament was also formed at a CCL of 100 nA but a stable light induced reset was achieved (i.e., no increase of current after removal of illumination). The better reset stability may be attributed to the much longer light-exposure period (200 s) as compared to that of FIG. 13D (10 s).

The resistance of a nanoscale conducting filament (formed using voltage sweep under a certain current compliance limit) in the $HfO_2$ dielectric may be increased by exposing the dielectric film to white light. Resistance values may be modulated by varying the light intensity and exposure duration. The light-induced resistance increase in the reset process may be ascribed to a conducting filament disruption caused by a recombination of the oxygen vacancies there with oxygen ions, whose transport from the surrounding interstitial locations is activated by the white light. These findings point to a possibility of extending the application range of $HfO_2$-based devices to the optical domain, e.g., imaging sensors and photodetectors with built-in non-volatile memory capability.

EXPERIMENT 3

Localized breakdown of $SiO_2$ or $HfO_2$ film formed on a p-Si substrate was achieved using a diamond-coated Si probe in an RHK 3500 ultra-high vacuum (~$5 \times 10^{-10}$ Torr) conductive atomic force microscope (C-AFM). The contact area between the C-AFM probe and oxide is estimated to be 25.5 $nm^2$, based on an applied force of 28 nN and the properties of the diamond-coated Si probe. The $SiO_2$ film is 5-nm thick, formed by a standard plasma-enhanced chemical vapor deposition process with $SiH_4$ and $N_2O$. The $HfO_2$ film was achieved by atomic layer deposition involving Tetrakis (dimethlyamino) hafnium and water vapor and has a 4-nm thickness. The C-AFM probe was connected to a Keithley SCS4200 parameter analyzer and the substrate was grounded.

Breakdown stressing, with a constant voltage at the probe, was applied and interrupted when the current exceeded a preset compliance limit. A LED lamp, positioned at a quartz window of the C-AFM system, functioned as a white-light source. The light intensity at the sample surface was 1 $mW/cm^2$, estimated based on the separation between the sample and light source, using a Daystar DS-05A solar meter. The entire experiment was carried out at 297 K. Negligible light-induced heating was confirmed by periodic measurement of the sample temperature using an infrared thermometer. As SBD exhibits initial relaxation after stress interruption, light exposure was carried out only after a 45-minute wait period. Probe stability was verified by monitoring the breakdown current for extended period (>8 hours).

Figure 15A:
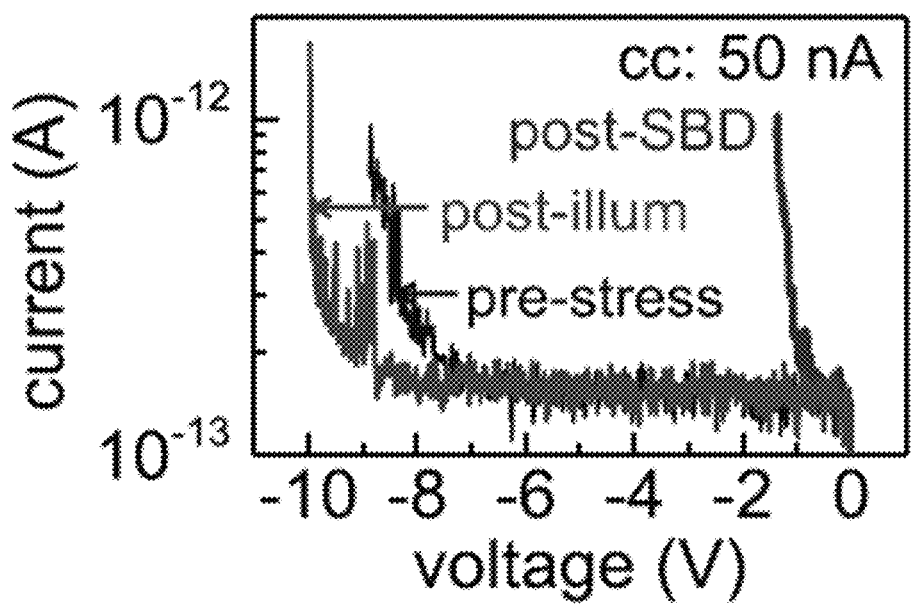
FIG. 15A is a plot of current (amperes or A) as a function of voltage (volts or V) showing complete restoration of soft breakdown at a low breakdown current compliance according to various embodiments.
Figure 15B:
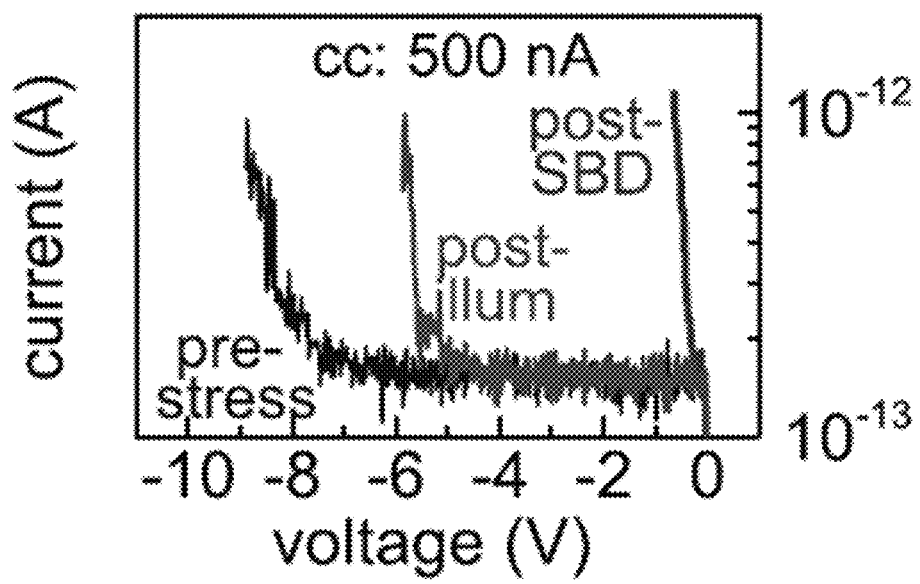
FIG. 15B is a plot of current (amperes or A) as a function of voltage (volts or V) showing partial restoration for higher current compliance according to various embodiments.

FIG. 15A is a plot 1500a of current (amperes or A) as a function of voltage (volts or V) showing complete restoration of soft breakdown at a low breakdown current compliance (cc) according to various embodiments. FIG. 15B is a plot 1500b of current (amperes or A) as a function of voltage (volts or V) showing partial restoration for higher current compliance (cc) according to various embodiments. The impact of breakdown hardness on white-light-induced restoration was also studied. Harder breakdown was induced by increasing the current compliance limit during stressing.

As can be seen from FIG. 15B, for breakdown induced at a higher current compliance limit, white-light illumination remains effective in restoring breakdown, but only partial restoration may be achieved for the same exposure period.

Figure 15C:
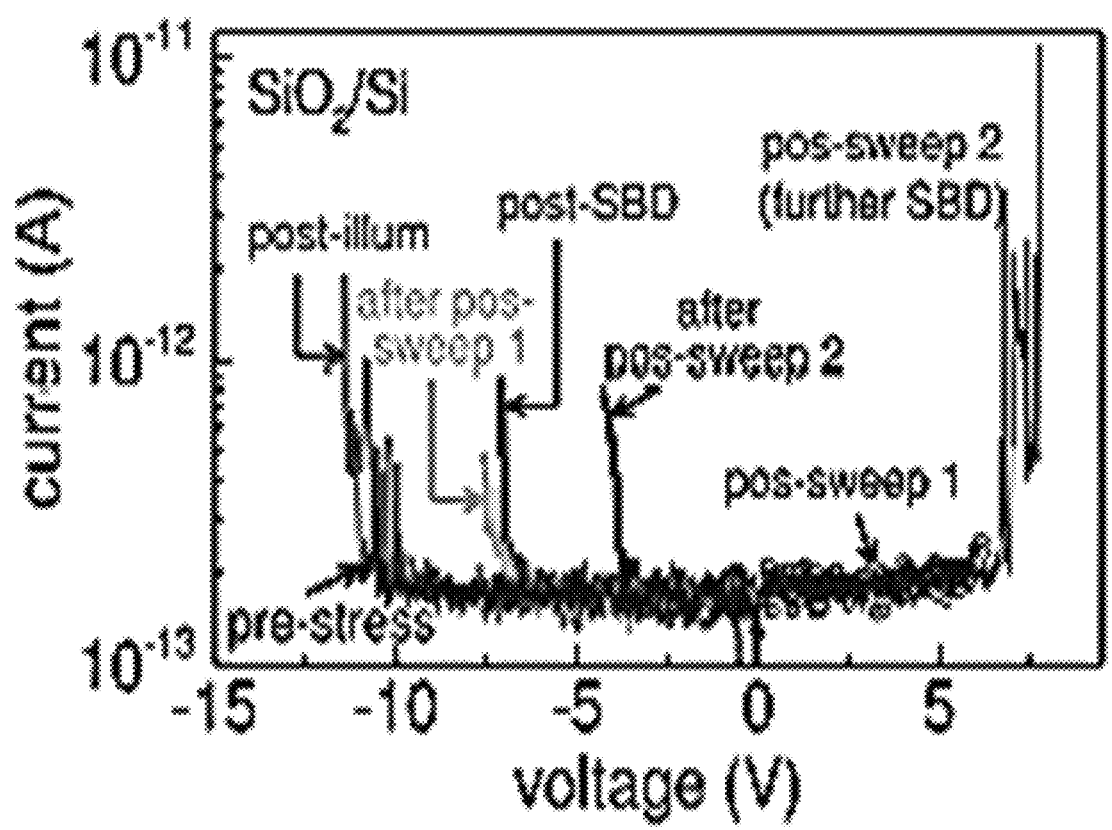
FIG. 15C is a plot of current (amperes or A) as a function of voltage (volts or V) showing effects of an opposite polarity sweep as well as white light illumination according to various embodiments.

Since electrical induced recovery (via an opposite polarity voltage sweep) is commonly observed in the MIM resistance random access memory (RRAM) structure, it may also be pertinent to examine the effect of an opposite-voltage sweep on the post-SBD recovery of gate stacks. FIG. 15C is a plot 1500c of current (amperes or A) as a function of voltage (volts or V) showing effects of an opposite polarity sweep as well as white light illumination according to various embodiments.

The opposite polarity sweep is shown to have a limited effect on the recovery of the $SiO_2$/Si gate stack after suffering soft breakdown during negative constant-voltage stressing (CVS). On the other hand, full recovery via white light illumination is achieved, even after the gate stack had suffered further breakdown during the positive-voltage sweep. Unlike the RRAM structure, the gate structure is generally more resistant to electrical-induced recovery. As can be seen from FIG. 15C for the $SiO_2$/Si sample (SBD inducted by negative CVS), the first positive-voltage sweep did not yield any apparent recovery of the I-V curve. Extending the voltage range during the second positive-voltage sweep resulted in a further breakdown, as is evident from the shift of the I-V curve to an even lower voltage regime. However, a near complete recovery was achieved by a 30-minute exposure to white-light after the second positive-voltage-sweep induced breakdown. A similar result is obtained on the $HfO_2$/Si sample (not shown). While this sample exhibits a more apparent recovery after a positive-voltage sweep, the extend of recovery is nonetheless limited and extending the positive-voltage sweep range leads to further breakdown, just like the $SiO_2$/Si sample. The results show that the white-light illumination is much more efficient in inducing the recovery of breakdown gate stacks.

The lack of breakdown-oxide restoration under restricted positive-voltage sweep (FIG. 15C; "after pos-sweep 1" curve) should be further addressed. Electrically induced breakdown recovery has been found to exhibit electrode dependence. It is believed that the metal(anode)/oxide interface region, adjacent to the percolation path, acts as a "storage" place for O released during breakdown. These O could then drift back to the percolation path under an opposite-polarity voltage sweep. The possibility of the Si anode "immobilizing" the O, through Si—O bond formation, during negative probe-voltage induced breakdown may explain the lack of recovery during the post-breakdown positive probe-voltage-sweep. A similar absence of recovery during a negative probe-voltage-sweep is also observed for breakdown induced by a positive probe voltage (not shown), and may be ascribed to the escape of O from the uncapped oxide. On the other hand, it is intriguing that near-complete restoration can be achieved by white-light illumination, regardless of the breakdown-voltage polarity.

This may imply the concurrent role of other mechanisms and/or defect-passivating agents (e.g. hydrogen), which require further investigation Physical analysis of the breakdown location in $SiO_2$ by high-resolution electron-energy-loss spectroscopy has revealed an increasing proportion of Si oxidation states having values lesser than +4 when the current compliance limit is raised. In addition, a lateral growth of the oxide region having lower Si oxidation state values is correspondingly observed. These observations imply that more O is depleted from the stressing location when the stress is interrupted at a higher compliance limit, due to greater O migration by increased Joule heating. Based on this oxide breakdown framework, a possible explanation for the light-induced breakdown restoration is proposed.

Figure 16A:
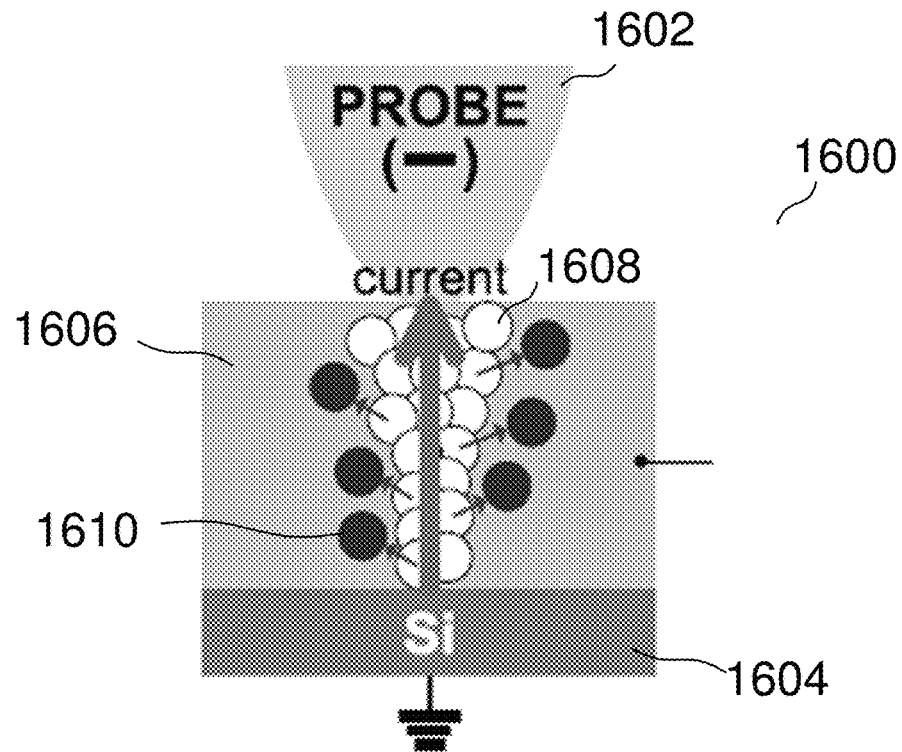
FIG. 16A is a schematic illustrating the stack in which there is Joule-heating-induced migration of oxygen (O) ions away from the percolation path at the instant of soft breakdown according to various embodiments.
Figure 16B:
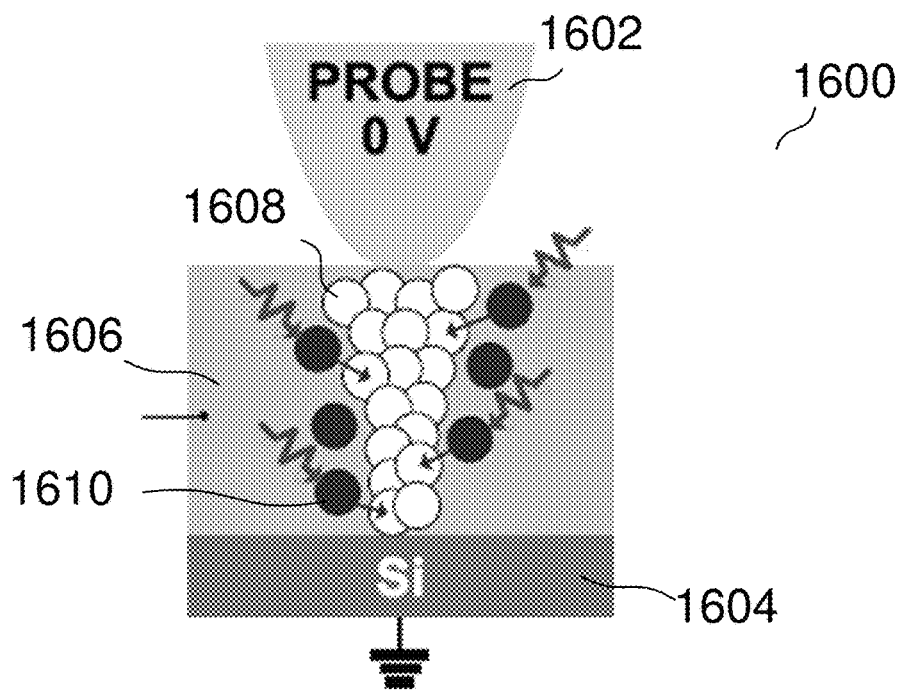
FIG. 16B is a schematic illustrating the stack shown in FIG. 16A in which there is photon-induced excitation of interstitials oxygen (O) ions and migration back to vacancies in the percolation path, aided by vacancy-interstitial dipole field according to various embodiments.

FIGS. 16A and 16B show stack 1600 including a gate oxide layer 1606 on silicon layer 1604. The silicon layer 1604 is grounded while a probe 1602 is used to form the filament or percolation path 1608. 1610 represents oxygen (O) ions. FIG. 16A is a schematic illustrating the stack 1600 in which there is Joule-heating-induced migration of oxygen (O) ions 1610 away from the percolation path 1608 at the instant of soft breakdown according to various embodiments. When the electrical stress is arrested quickly, a portion of the released O 1610 may populate interstitial sites in the proximity of the percolation path 1608.

FIG. 16B is a schematic illustrating the stack 1600 shown in FIG. 16A in which there is photon-induced excitation of interstitials oxygen (O) ions 1610 and migration back to vacancies in the percolation path, aided by vacancy-interstitial dipole field according to various embodiments.

Although a directed motion of O ions 1610, released from oxide-field-induced bond dissociation, towards the anode occurs during breakdown transient, the stochastic nature of ion transport, exacerbated by Joule heating (estimated to produce a substantial local temperature increase), results in lateral propagation and some O ions populating interstitial sites in the vicinity of the percolation path 1608 when the breakdown is arrested. Migration of the interstitial O ions 1610 back to the vacancy-rich percolation path 1608 may entail the overcoming of an energy barrier (~0.3-0.6 eV) and thus does not readily occur in the absence of an external excitation. Under illumination by white light (with energies ranging from 1.8-3 eV), photon absorption electronically excites the interstitial O 1610, thus decreasing their migration barriers.

Aided by the vacancy-interstitial dipole field, the excited interstitial O 1610 may then be able to migrate towards the vacancy sites in the percolation path 1608. Subsequent recombination with the vacancies there eliminates the percolation path 1608 and restores the insulating property of the oxide 1606. Compared to the larger bandgap energy of $SiO_2$ or $HfO_2$, the relatively low photon energies of white light may be insufficient to "dislodge" lattice O and thus would not cause harder breakdown.

At a higher current compliance limit, increased Joule heating enhances the lateral propagation of O ions 1610, thus decreasing the portion of ions populating interstitial sites in the proximity of the percolation path 1608 when stress is terminated. As a consequence, only a limited number of the photon-excited interstitial O ions 1610 can migrate back to the percolation path 1608, resulting in only a partial restoration (FIG. 16B). Stochastic transport may restrict interstitial O ions 1610 located further away from returning to the percolation path 1608.

EXPERIMENT 4

The study was carried out on uncapped samples including $SiO_2$/p-Si, $HfO_2$/p-Si, $HfO_2$/TiN/Ti/p-Si, $ZrO_2$/TiN/Ti/p-Si and $SiO_2$/Cu/Ti/p-Si stacks in an ultra-high vacuum (UHV) conductive atomic force microscope (C-AFM) system (RHK 3500 HT AFM/STM). The C-AFM probe was made up of diamond-coated Si, which performed the role of a top electrode mimicking a metal-oxide-Si (MOS gate stack) or metal/insulator/metal (RRAM) structure of a very small dimension. From the force-distance relationship and the mechanical properties of the cantilever, the probe-to-oxide contact was estimated to be 26 $nm^2$. The UHV environment helped avoid surface contamination. The $SiO_2$ was 5-nm thick for the $SiO_2$/p-Si sample and 10-nm thick for the $SiO_2$/Cu/Ti/p-Si sample, formed by a conventional plasma-enhanced chemical vapour deposition process. The $HfO_2$ and $ZrO_2$ were each of thickness 4 nm and were grown by an atomic-layer deposition process. Before the oxide deposition step, sputter-deposition of a 10-nm or 30-nm Ti layer, followed by a 70-nm TiN or 30-nm Cu layer, respectively, on a precleaned p-Si substrate were carried out to form the bottom metal electrode in some of the test samples. For simplicity, only the type of oxide and the metal electrode in contact with the oxide is referenced in subsequent discussion.

Figure 17:
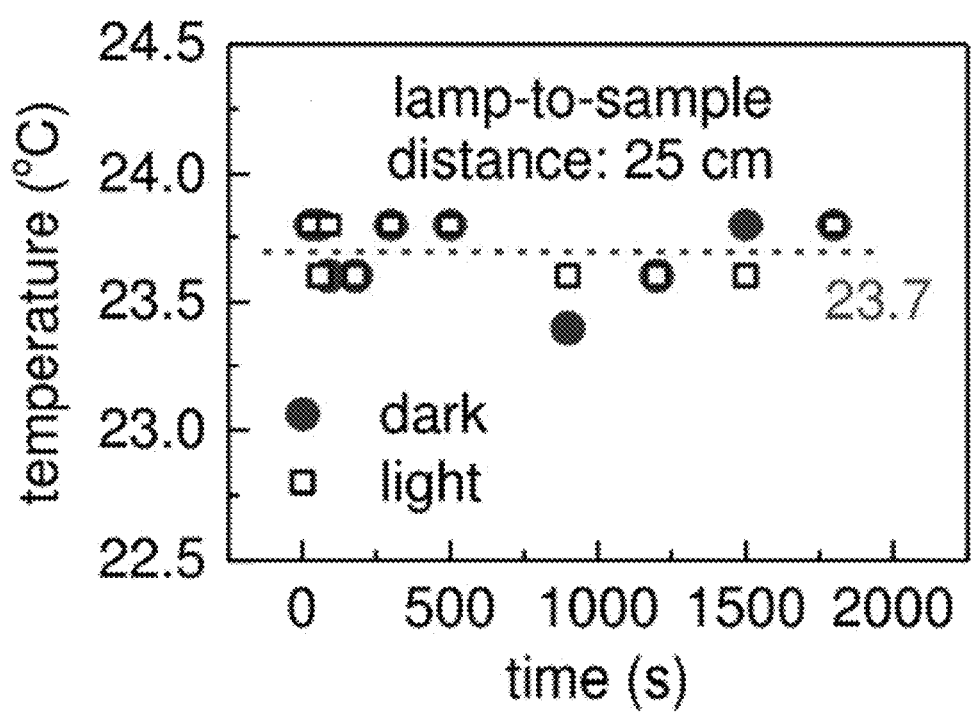
FIG. 17 is a plot of temperature (degrees Celsius or ° C.) as a function of time (seconds or s) indicating the sample temperature (measured by an infrared thermometer) as a function of time in the dark and under white-light illumination, according to various embodiments.

Experimental setup is similar to the one shown in FIG. 6B. Voltage biasing of the test sample were applied through the C-AFM probe, connected to a Keithley SCS4200 parameter analyzer. The Si substrate was always grounded. Formation of the conducting filament was achieved in two ways: 1) voltage ramp; 2) a constant-voltage applied to the C-AFM probe. In both cases, the current through the filament at the instant of its formation was capped at the preset level, termed current compliance, by the parameter analyzer. White light, with a wavelength range of 450-700 nm, was supplied by an ordinary LED lamp positioned at the quartz window of the UHV chamber, at about 25 cm away from the test sample. The intensity of light reaching the sample surface was estimated using a Daystar's solar meter placed 25 cm away from the LED lamp. All results are obtained at an intensity of 1 $mW/cm^2$ unless stated otherwise. Possible sample heating by the white-light illumination was checked using an infra-red thermometer. FIG. 17 is a plot of temperature (degrees Celsius or ° C.) as a function of time (seconds or s) indicating the sample temperature (measured by an infrared thermometer) as a function of time in the dark and under white-light illumination, according to various embodiments. Dashed line depicts the average temperature for both cases.

The time-dependent dielectric breakdown (TBBD) reliability of the pristine and restored oxide is compared for the $SiO_2$/Si sample.

Figure 18A:
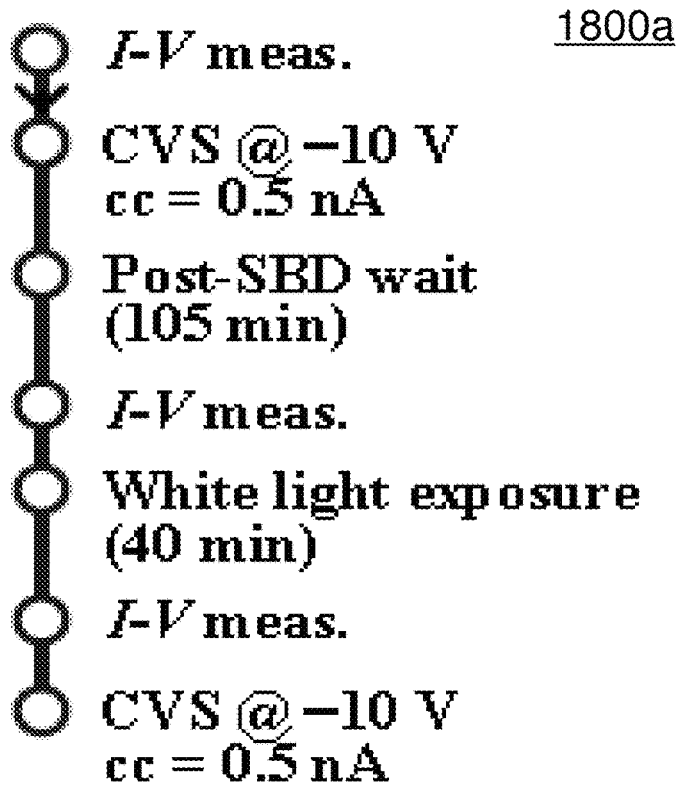
FIG. 18A is a schematic illustrating an experimental sequence used to assess the robustness of white-light-restored oxide against electrical re-stressing under the same conditions as those used to induce the first soft breakdown according to various embodiments.
Figure 18B:
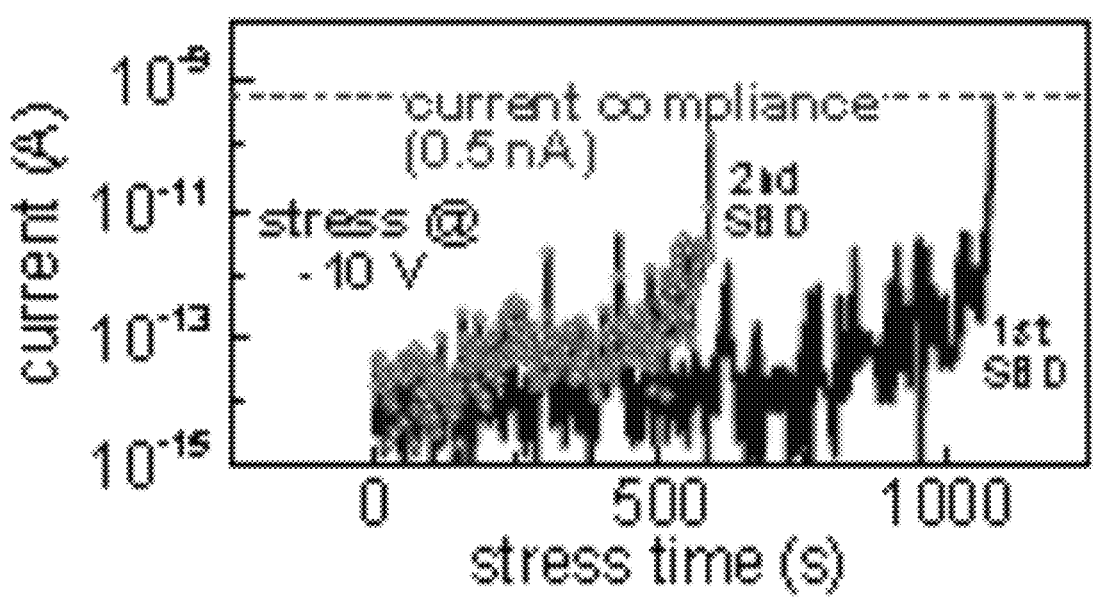
FIG. 18B is a plot of current (amperes or A) as a function of stress time (seconds or s) showing the current-time characteristics of the first and second soft-breakdown (SBD) evolution for a first randomly selected location on the silicon oxide/silicon ($SiO_2$/Si) sample according to various embodiments.

FIG. 18A is a schematic 1800a illustrating an experimental sequence used to assess the robustness of white-light-restored oxide against electrical re-stressing under the same conditions as those used to induce the first soft breakdown according to various embodiments. FIG. 18B is a plot 1800b of current (amperes or A) as a function of stress time (seconds or s) showing the current-time characteristics of the first and second soft-breakdown (SBD) evolution for a first randomly selected location on the silicon oxide/silicon ($SiO_2$/Si) sample according to various embodiments, while FIG. 18C is a plot 1800c of current (amperes or A) as a function of stress time (seconds or s) showing the current-time characteristics of the first and second soft-breakdown (SBD) evolution for a second randomly selected location on the silicon oxide/silicon (SiO$_2$/Si) sample according to various embodiments.

Figure 19A:
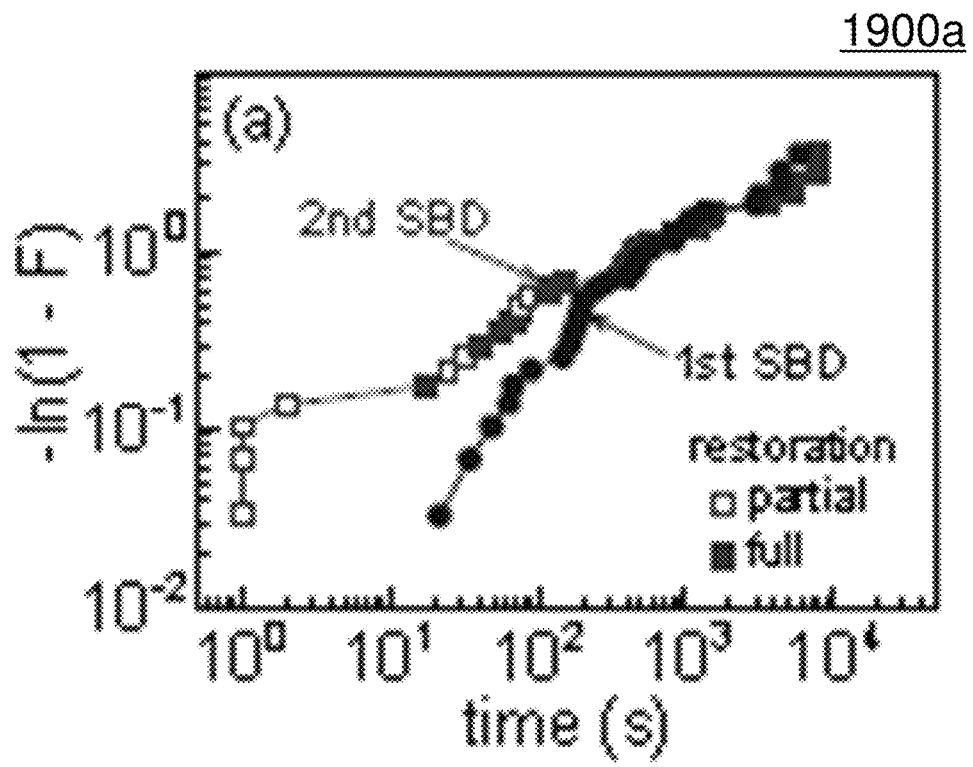
FIG. 19A is a plot of —ln (1-F), where F represents a cumulative density function, as a function of breakdown time (seconds or s), illustrating the breakdown distribution of the first soft-breakdown (SBD) measured at different locations as well as the breakdown distribution for the corresponding second soft-breakdown (SBD) for all locations (completely and partially restored) according to various embodiments.
Figure 19B:
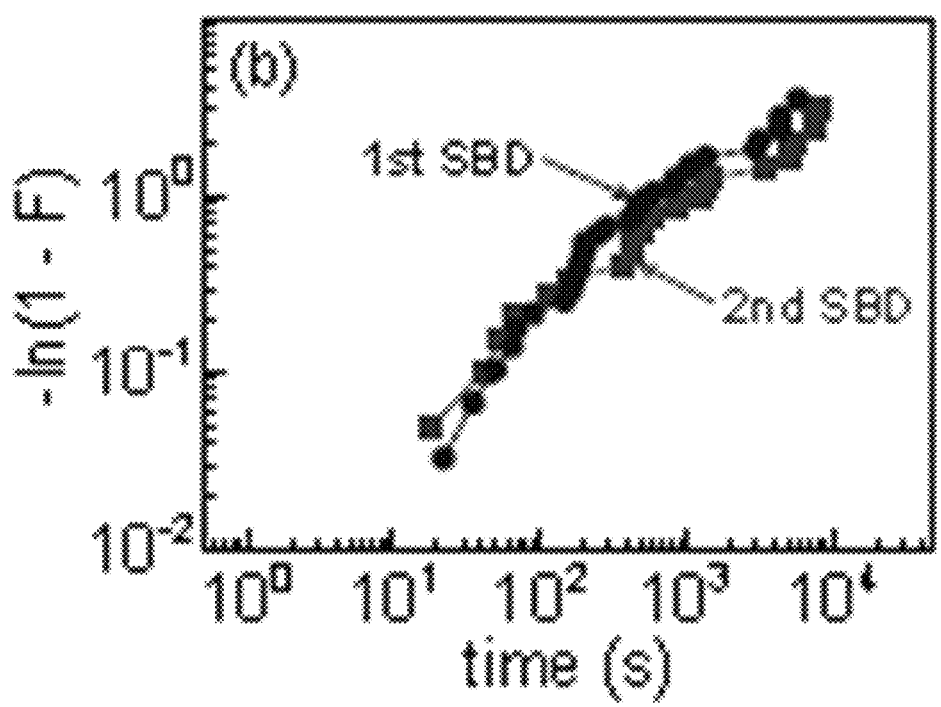
FIG. 19B is a plot of —ln (1-F), where F represents a cumulative density function, as a function of breakdown time (seconds or s), illustrating second soft-breakdown (SBD) only for locations where full restoration had been achieved according to various embodiments.

FIGS. 19A-B represent Weibull distributions for the time to first soft-breakdown (SBD) and second soft-breakdown (SBD) for the silicon oxide/silicon (SiO$_2$/Si) sample. The second SBD was induced by the same negative constant-voltage stressing of the location where the first SBD occurred and had been restored by white-light illumination. A total of 30 random locations were tested. FIG. 19A is a plot 1900$a$ of —ln (1-F), where F represents a cumulative density function, as a function of breakdown time (seconds or s), illustrating the first soft-breakdown distribution (SBD) measured at different locations as well as the breakdown distribution for the corresponding second soft-breakdown (SBD) for all locations (completely and partially restored) according to various embodiments. FIG. 19B is a plot 1900$b$ of —ln (1-F), where F represents a cumulative density function, as a function of breakdown time (seconds or s), illustrating second soft-breakdown (SBD) only for locations where full restoration had been achieved according to various embodiments.

Soft breakdown of the SiO$_2$ was induced by constant-voltage stressing (CVS) applied to CAFM probe. The experimental sequence used in the study is summarized in FIG. 18A. Prior to the first CVS, the I-V curve was measured. A negative CVS was then applied. FIGS. 18B-C show the evolution of the current towards the first SBD (line) for two random locations on the SiO$_2$/Si sample. Prior to SBD, a gradual increase of current with time may be observed, indicating the onset of a progressive breakdown behavior typical of a thin gate oxide. When the increase in current reached a preset compliance level, the stress was automatically aborted by the parameter analyzer. I-V measurement was then taken continuously in the dark to monitor the post-stress relaxation effect until quasi-saturation was reached (after ~105 minutes). The final post-SBD I-V curve was recorded before the sample was subjected to white-light illumination. After 40-minute illumination, the light source was removed and the I-V curve for the restored oxide was measured. Regardless of whether full restoration was achieved, the negative CVS was reapplied until the second SBD occurred. The same experimental procedure was repeated on 30 randomly selected locations on the SiO$_2$/Si sample.

Figure 18C:
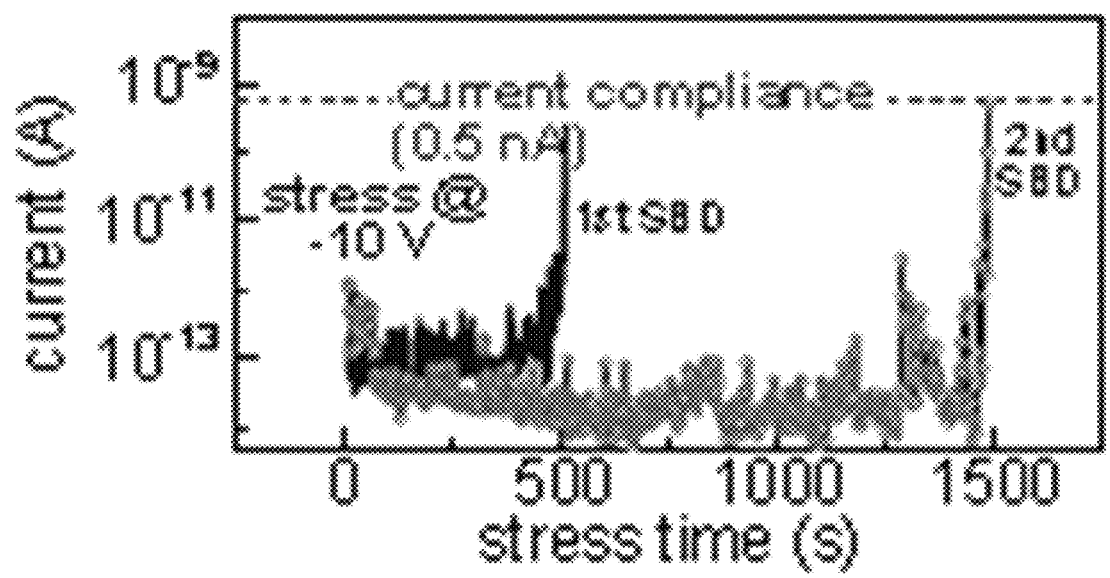
FIG. 18C is a plot of current (amperes or A) as a function of stress time (seconds or s) showing the current-time characteristics of the first and second soft-breakdown (SBD) evolution for a second randomly selected location on the silicon oxide/silicon ($SiO_2$/Si) sample according to various embodiments.

For the two random locations depicted in FIGS. 18B-C, full restoration of the breakdown oxide was achieved as judged by overlapping pre-stress and restored current voltage (I-V) curves (I-V curve as shown in FIG. 10A was obtained). However, the time to second SBD may either be shorter or longer than the first. As the defect generation process leading to oxide breakdown is stochastic in nature, the Weibull distribution for the time to first and second SBD would have to be compared, as depicted in FIG. 19A. In the distribution curve for the second SBD, the data points are classified according to whether full (solid) or partial (open) restoration was achieved during white-light illumination. Compared to the distribution curve of the first SBD, the distribution curve of the second SBD features a prominent "tail", but populated mainly by the early failures, upon restressing, of locations where the breakdown oxide was partially restored by the white-light illumination, i.e. the I-V curves for these locations fall at a lower voltage regime than their pre-stress counterparts. At these locations, the oxide was "weaker" in comparison to the original state and thus it failed at much shorter times when subjected to the same negative CVS. On the other hand, for locations where the breakdown oxide was fully restored, the distribution curve of the second SBD may be seen to merge with that of the first SBD. This result shows that the fully restored oxide exhibits similar robustness against breakdown during electrical re-stressing. This can be verified by excluding locations where only partial restoration was achieved when plotting the Weibull distribution plot for the time to second SBD. The resultant distribution is nearly identical to that of the first SBD (FIG. 19B).

EXPERIMENT 5

Figure 20A:
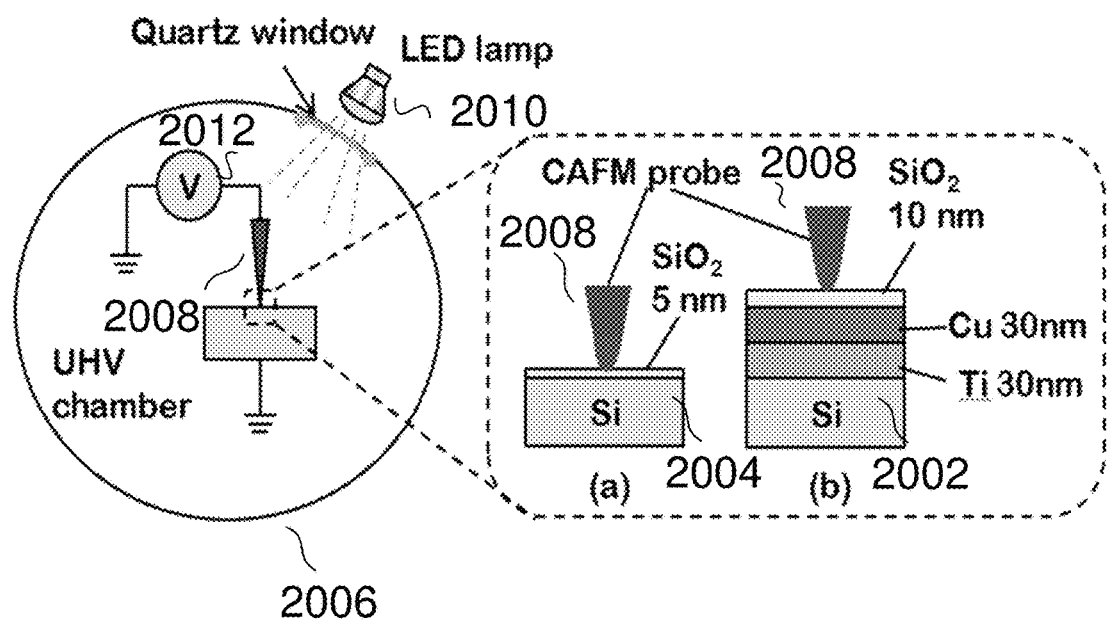
FIG. 20A is a schematic showing the experimental setup according to various embodiments.

In this study, the effect of light on the nanoscale property of a conductive filament in the silicon oxide/copper (SiO$_2$/Cu) stack 2002 (Cu sample) is investigated. FIG. 20A is a schematic showing the experimental setup 2000$a$ according to various embodiments. A HF-cleaned p-Si(100) substrate (of resistivity 5×10$^{-3}$-1×10$^{-2}$ Ωcm) was deposited with 30-nm Ti and 30-nm Cu films via DC magnetron sputtering. Subsequently, a 10-nm SiO$_2$ was formed at 250° C. via parallel-plate plasma-enhanced chemical vapor deposition with SiH$_4$ and N$_2$O. For comparison, a non-metal sample of SiO$_2$(5-nm)/p-Si 2004 was prepared (no-Cu control sample). Electrical measurement was performed using ultra-high vacuum C-AFM system 2006 with the diamond-coated Si probe 2008 connected to a Keithley SCS4200 parameter analyzer. The current that passed through the filament/breakdown path at the instant of forming was limited by a preset current compliance limit of 1.1×10$^{-9}$ A to restrict progression to hard breakdown. The bias voltage was applied to the probe 2008 and the substrate was grounded. A commercially available white LED light 2010, having constituent wavelengths of about 400 nm to about 700 nm, was used in the light-induced resistance-reset study. The bias voltage was provided by voltage source 2012.

Figure 20B:
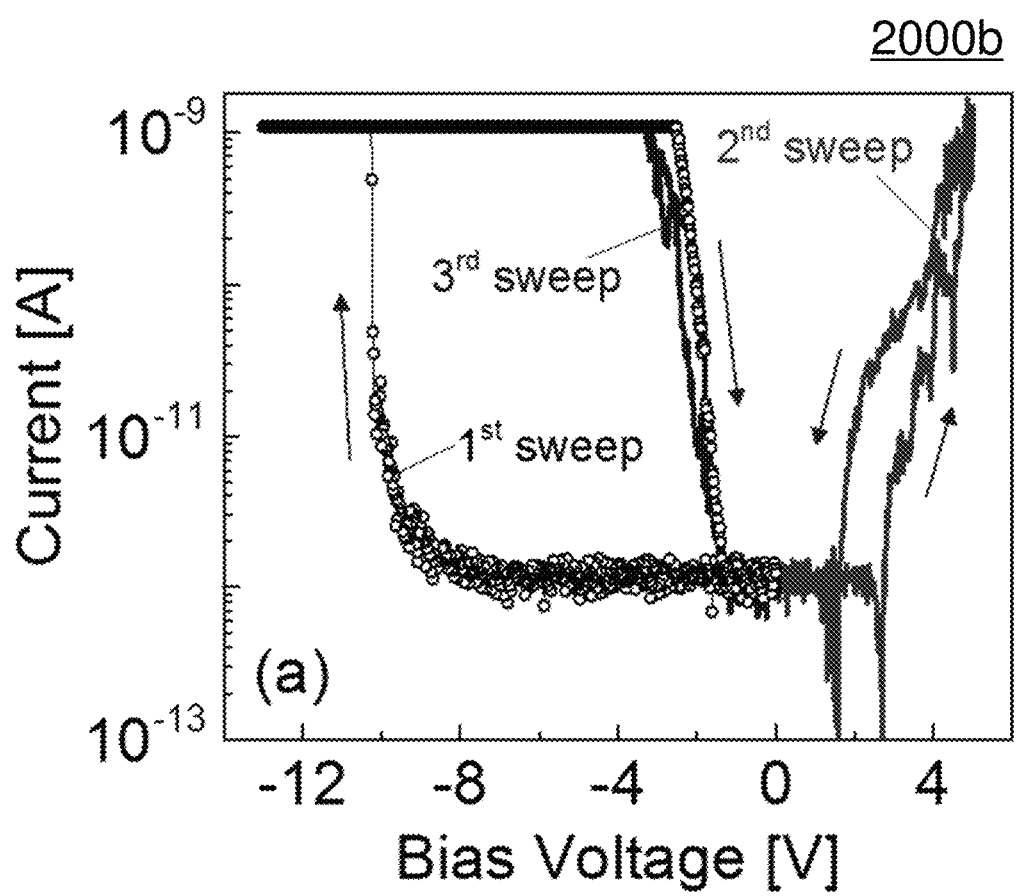
FIG. 20B is a plot of current (amperes or A) as a function of voltage (volts or V) showing the current-voltage characteristics of the silicon oxide/p-type silicon ($SiO_2$/p-Si) sample (i.e. no-Cu control sample) according to various embodiments.
Figure 20C:
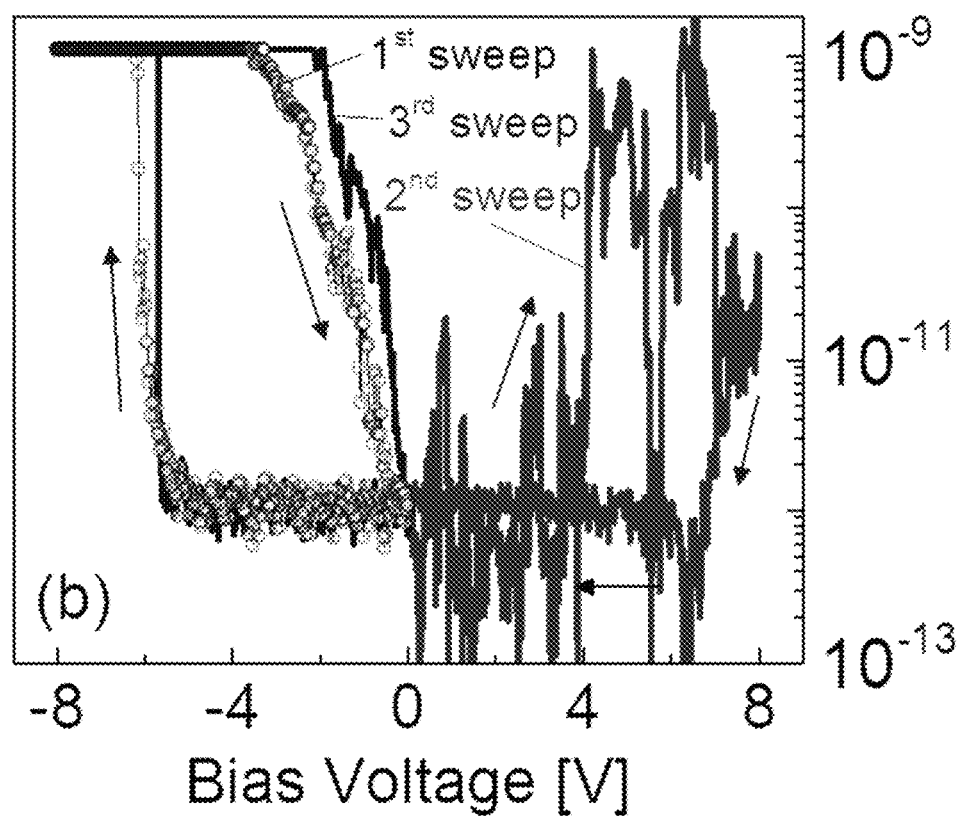
FIG. 20C is a plot of current (amperes or A) as a function of voltage (volts or V) showing the current-voltage characteristics of the silicon oxide/copper/titanium/p-type silicon ($SiO_2$/Cu/Ti/p-Si) sample (i.e. Cu sample) according to various embodiments.

FIG. 20B is a plot 2000$b$ of current (amperes or A) as a function of voltage (volts or V) showing the current-voltage characteristics of the silicon oxide/p-type silicon (SiO$_2$/p-Si) sample (i.e. the no-Cu control sample) according to various embodiments. FIG. 20C is a plot 2000$c$ of current (amperes or A) as a function of voltage (volts or V) showing the current-voltage characteristics of the silicon oxide/copper/titanium/p-type silicon (SiO$_2$/Cu/Ti/p-Si) sample (i.e. the Cu sample) according to various embodiments. After the negative voltage ramp (1$^{st}$ sweep) for forming, a positive-voltage ramp (2$^{nd}$ sweep) was applied. There is no current drop in the SiO$_2$/p-Si, indicating no reset. On the other hand, a significant current decrease is observed in the SiO$_2$/Cu/Ti/p-Si, showing a successful reset. In the following negative-voltage (3$^{rd}$ sweep), the current-voltage curve of the SiO$_2$/Si overlaps that in the 1$^{st}$ reverse sweep, confirming that the low resistance state (LRS) was retained. In contrast, the current-voltage curve of the SiO$_2$/Cu/Ti/p-Si shows a current jump similar to that of the Pt sweep, showing reforming of the conductive filament.

By applying a negative-voltage ramp to the C-AFM probe, an abrupt current increase is observed at −10 V for the no-Cu sample (FIG. 20B) and at −5 V for the Cu sample (FIG. 20C). The lower voltage for conductive filament formation in the Cu sample may be attributed to oxide-field effect induced migration of Cu ions (from the underlying Cu electrode) and the increase in the local field in the SiO$_2$. On the other hand, the breakdown of the SiO$_2$ layer in the control sample is due to the generation of oxygen (V$_o$) defects, which occurs via dissociation of Si—O bonds at a higher oxide field.

Subsequently, a positive-voltage ramp was applied (2nd sweep). No resistance reset is observed in the former; note that there is no evident drop in the low-resistance state (LRS) current. This is supported by a subsequent negative-voltage ramp (3rd sweep), in which the current-voltage curve is similar to that of the 1st reverse-sweep. In contrast, a significant current drop is observed in the Cu sample (FIG. 20C 2nd sweep), indicating a successful reset. This is confirmed in the 3rd sweep, in which the current is comparable to the pre-forming current. It is believed that various intrinsic defects (e.g., oxygen vacancies ($V_o$'s) and dangling bonds) in $SiO_2$ results in irreversible resistance change in FIG. 20B, while the ionized Cu diffuses into the $SiO_2$ bulk, leading to the resistive switching observed in FIG. 20C. It should also be mentioned that a further breakdown of the $SiO_2$ occurs when the range of the positive sweep is increased.

Breakdown was induced at 30 random locations on the control sample and all of them did not display breakdown recovery. This result draws similarity to the general lack of breakdown recovery in the polysilicon/$HfO_2$/Si gate stack. On the other hand, breakdown recovery can be commonly observed in the TiN/$HfO_2$/Si gate stack. The relative ease of recovery in this gate stack is ascribed to the migration of O ions from the TiN interface region to the breakdown path during negative gate-voltage sweep. A possible reason for the absence of breakdown recovery in the control sample is the lack of O supply from the Si interface region due to the strong bonding between O and Si. Moreover, O ions driven towards the Si substrate during the breakdown may be "locked-in" by the formation of strong Si—O bonds, thus limiting their drift back to the breakdown path during the positive sweep.

On the other hand, more than 80% of the 30 conducting filaments (CFs) formed at random locations on the Cu sample exhibit a near-complete resistance reset after the positive sweep. This significantly enhanced breakdown recovery may be attributed to 1) the relative ease for Cu ions in the filament region to migrate back to the Cu electrode; 2) the availability of O ions from the Cu interface region for reducing the Vo defects in the filament region. As Cu has a lower oxygen affinity (the Gibbs free energy of the formation of the metal oxide) than Si, the oxidation of Cu is less likely as compared to Si. Thus, it is believed that 0 ions driven towards the Cu electrode during breakdown would accumulate in the Cu interface region and then drift back to the filament during the positive sweep.

Figure 20D:
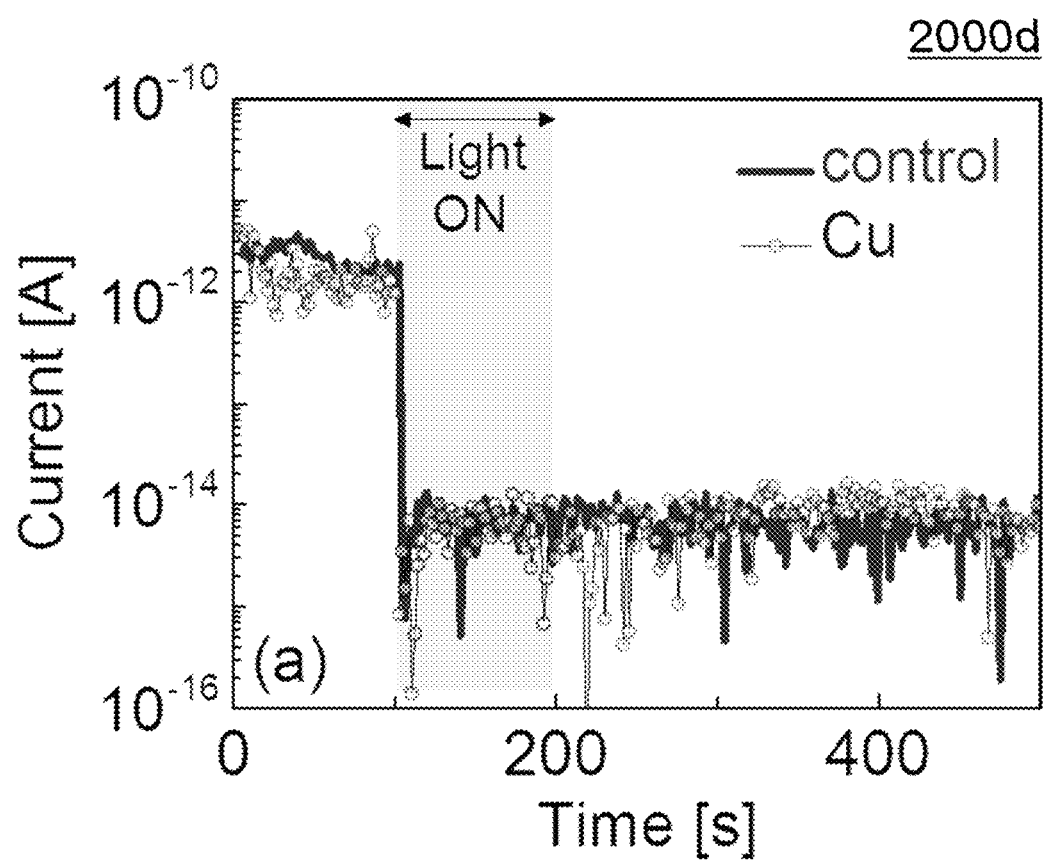
FIG. 20D is a plot of current (amperes or A) as a function of time (seconds or s) for the silicon oxide/p-type silicon ($SiO_2$/p-Si) sample (i.e. no-Cu control sample) and the silicon oxide/copper/titanium/p-type silicon ($SiO_2$/Cu/Ti/p-Si) sample (i.e. Cu sample) illustrating the current-time characteristics of the samples under light exposure according to various embodiments.

FIG. 20D is a plot 2000d of current (amperes or A) as a function of time (seconds or s) for the silicon oxide/p-type silicon ($SiO_2$/p-Si) sample (i.e. the no-Cu control sample) and the silicon oxide/copper/titanium/p-type silicon ($SiO_2$/Cu/Ti/p-Si) sample (i.e. the Cu sample) illustrating the current-time characteristics of the samples under light exposure according to various embodiments. The currents in both samples show a steep decrease upon illumination at 100-s and remain low at about $10^{-14}$ A after light was turned off at 200 s.

FIG. 20D shows that the LRS current is decreased instantly from $\sim 10^{-12}$ to $\sim 10^{-14}$ A, for both post-forming no-Cu and Cu samples upon illumination at 100-s. Even after the light was turned off at 200-s, the current level remains at $\sim 10^{-14}$ A. Clearly, the samples were restored to the high resistance state (HRS) under light stimulation.

Light may help reduce the oxygen vacancies ($V_o$'s) in $SiO_2$ and rupture the CF for both samples, even for the no-Cu sample in which reset is not observed under voltage ramp (FIG. 20B). For Cu electrode conducting-bridge resistive random access memory (CBRAM), Cu may precipitate and form a CF in a solid electrolyte. Thus, we attribute the light-induced reset in the Cu sample to the reduction of $V_o$'s which exist in between the Cu filament and the $SiO_2$/probe interface.

It is worth mentioning that both samples can be repeatedly "cycled" between the LRS (by voltage-induced set or breakdown) and the HRS (by light-induced reset or recovery (LIR)), similar to that shown in the study on the $HfO_2$/TiN stack. The LIR effect may be attributed to the photo-induced migration of O ions from the vicinity of the CF or breakdown path and their recombination with the $V_O$ defects in the CF or breakdown path. These O ions were released and driven outward from the filament or breakdown path during the forming or breakdown process by the thermal effect and some reside interstitially in the surrounding oxide after the process was aborted. Ab-initio simulation study has shown the activation energy for the migration of interstitial O ions in the $HfO_2$ to be ~0.3-0.6 eV, corresponding to 4.8-9.6× $10^{-20}$ J. Considering that the intensity of the visible light at the sample surface is 1 mW/cm$^2$, equivalent to $1 \times 10^{-19}$ J/s·Å$^2$, it is thus plausible that visible-light illumination may reduce part of the $V_O$ defects in the CF or breakdown path by stimulating the back-migration of interstitial O ions located in the vicinity. On the other hand, such back-migration of interstitial O ions to the CF or breakdown path from the vicinity would not occur during voltage sweeping, as the Joule-heating effect tends to favor the further outward propagation of these O ions. This may explain the lack of breakdown recovery in the $SiO_2$/p-Si control samples during post-forming voltage sweeps.

Figure 20E:
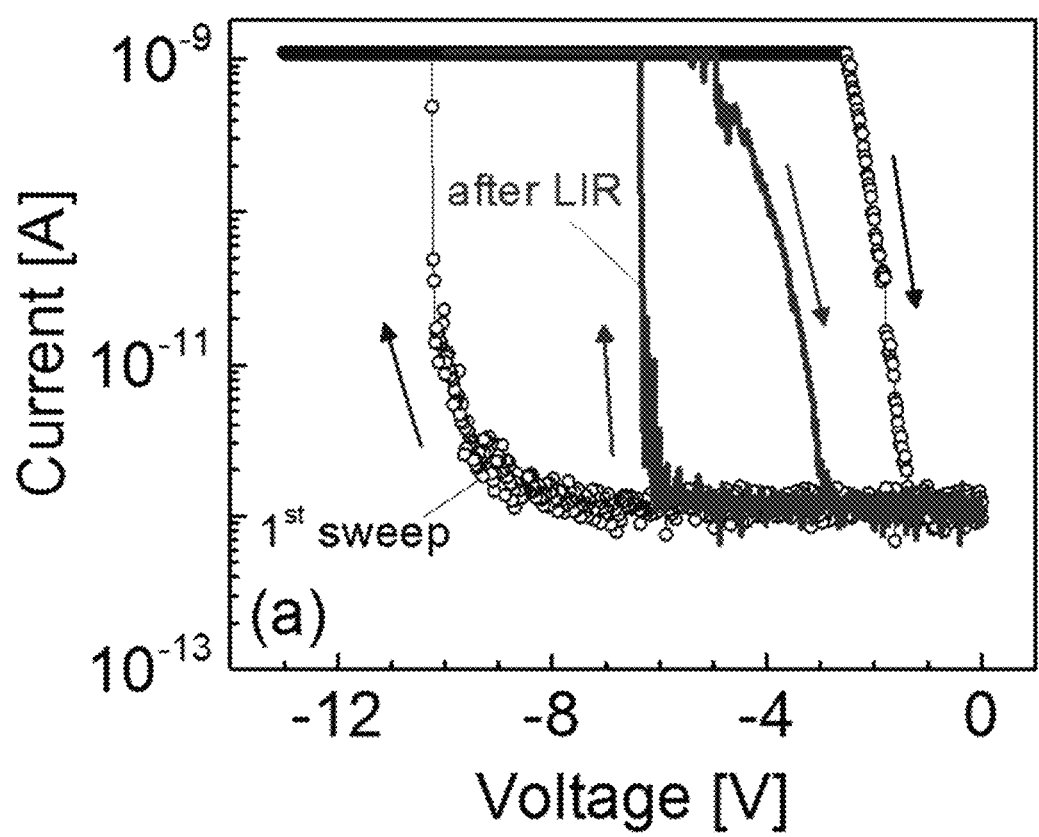
FIG. 20E is a plot of current (amperes or A) as a function of voltage (volts or V) illustrating the initial and post-light-induced-reset (LIR) current-voltage of silicon oxide/p-type silicon (SiO$_2$/p-Si) sample (i.e. no-Cu control sample) according to various embodiments.
Figure 20F:
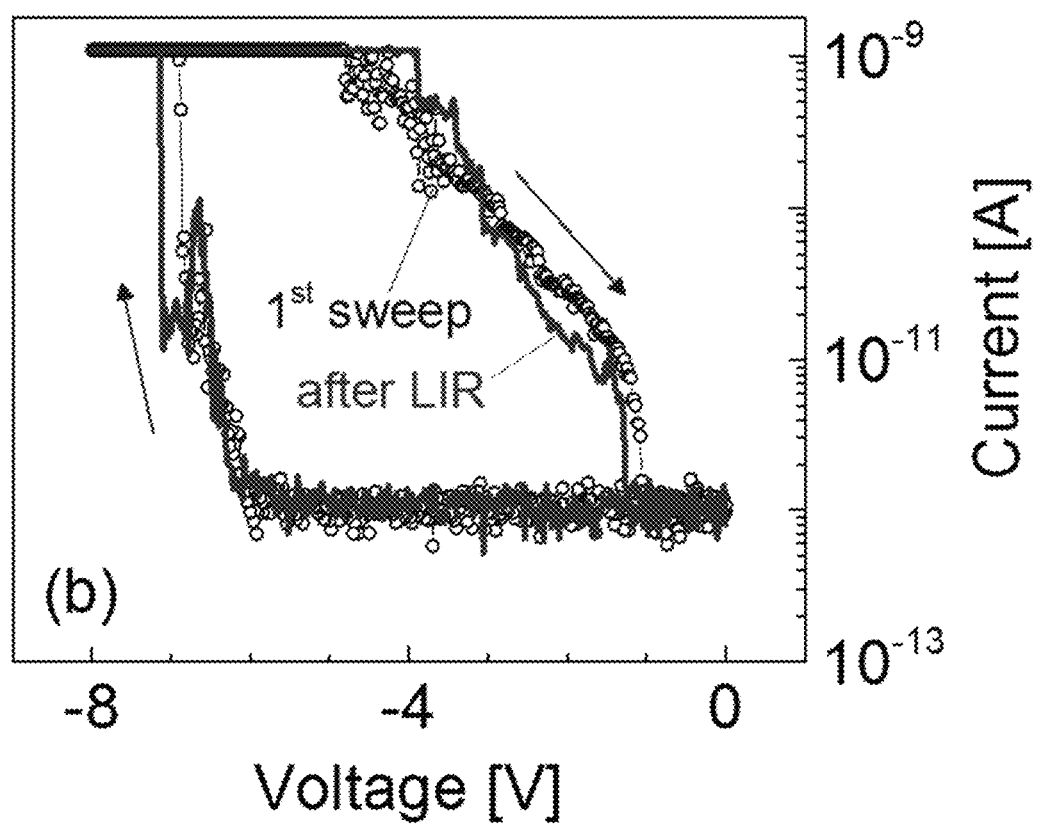
FIG. 20F is a plot of current (amperes or A) as a function of voltage (volts or V) illustrating the initial and post-light-induced-reset (LIR) current-voltage of silicon oxide/copper/titanium/p-type silicon] (SiO$_2$/Cu/Ti/p-Si) sample (i.e. Cu sample) according to various embodiments.

FIG. 20E is a plot 2000e of current (amperes or A) as a function of voltage (volts or V) illustrating the initial and post-light-induced-reset (LIR) current-voltage of silicon oxide/p-type silicon ($SiO_2$/p-Si) sample (i.e. the no-Cu control sample) according to various embodiments. FIG. 20F is a plot 2000f of current (amperes or A) as a function of voltage (volts or V) illustrating the initial and post-light-induced-reset (LIR) current-voltage of silicon oxide/copper/titanium/p-type silicon ($SiO_2$/Cu/Ti/p-Si) sample (i.e. the Cu control sample) according to various embodiments.

FIGS. 20E, 20F depict the post-LIR set voltage sweep. It is noted that the set voltage of the Cu sample is almost similar to the forming voltage, implying a restoration to HRS by light exposure. While for the no-Cu sample, the set voltage is about −6 V, as compared with the forming voltage of about −10 V.

It has been shown that the conducting filament in the Cu sample may be rendered non-photo-responsive to the white light illumination after it is subjected to a negative-voltage ramp (0 V to about 8 V) several times before illumination. However, such an effect is not observed on the breakdown path in the no-Cu sample, which continues to exhibit a negative photo-response despite being subjected to the same number of negative-voltage ramps.

Figure 20G:
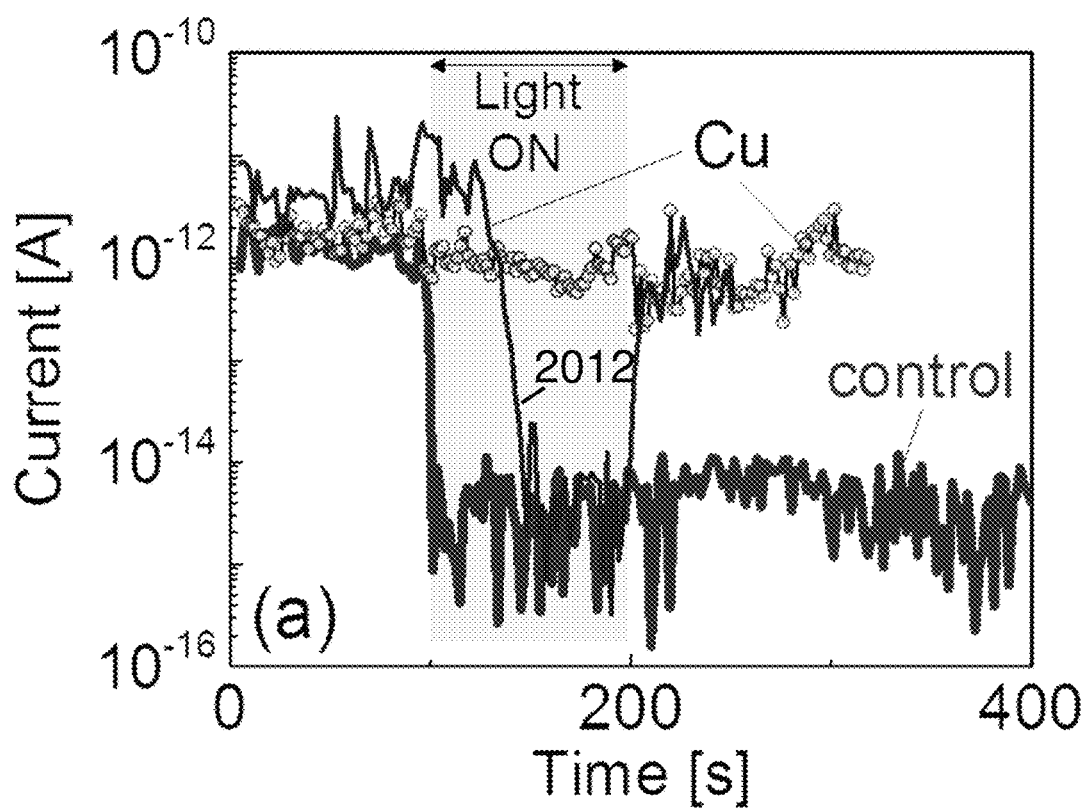
FIG. 20G is a plot of current (amperes or A) as a function of time (seconds or s) for the silicon oxide/p-type silicon (SiO$_2$/p-Si) sample (i.e. no-Cu control sample) and the silicon oxide/copper/titanium/p-type silicon (SiO$_2$/Cu/Ti/p-Si) (i.e. Cu sample) sample illustrating the current-time characteristics of the samples under light exposure after the samples are subjected to repeated post-forming voltage sweeps according to various embodiments.

FIG. 20G is a plot 2000g of current (amperes or A) as a function of time (seconds or s) for the silicon oxide/p-type silicon ($SiO_2$/p-Si) sample (i.e. the no-Cu control sample) and the silicon oxide/copper/titanium/p-type silicon ($SiO_2$/Cu/Ti/p-Si) sample (i.e. the Cu sample) illustrating the current-time characteristics of the samples under light exposure after the samples are subjected to repeated post-forming voltage sweeps according to various embodiments. The LRS current of $SiO_2$/Cu/Ti/p-Si sample does not drop instantly upon illumination at 100-s, while the LRS current of $SiO_2$/p-Si sample decreases rapidly at 100-s. A small number of CFs in the copper samples are reset during illumination but revert back to the low resistance state (LRS) after illumination.

As shown in FIG. 20G, the no-Cu sample exhibits a significant current drop upon illumination at 100-s. For the Cu sample, on the other hand, the LRS current level is not affected by illumination and remains approximately constant throughout the measurement.

By repeatedly subjecting the CF in the Cu sample to a 0→−8 V sweep (at the same current compliance used for forming), the Cu sample may eventually lose the photo-response seen in FIG. 20G. The same procedure, however, did not impact the photo-response of the breakdown path in the control sample. As shown in FIG. 20G, the conduction through the breakdown path in the control sample may still be disrupted by visible light, similar to that seen in FIG. 20D. This applies to all the 30 breakdown paths formed at random locations on the $SiO_2$/p-Si (control) sample (FIG. 20H).

Figure 20H:
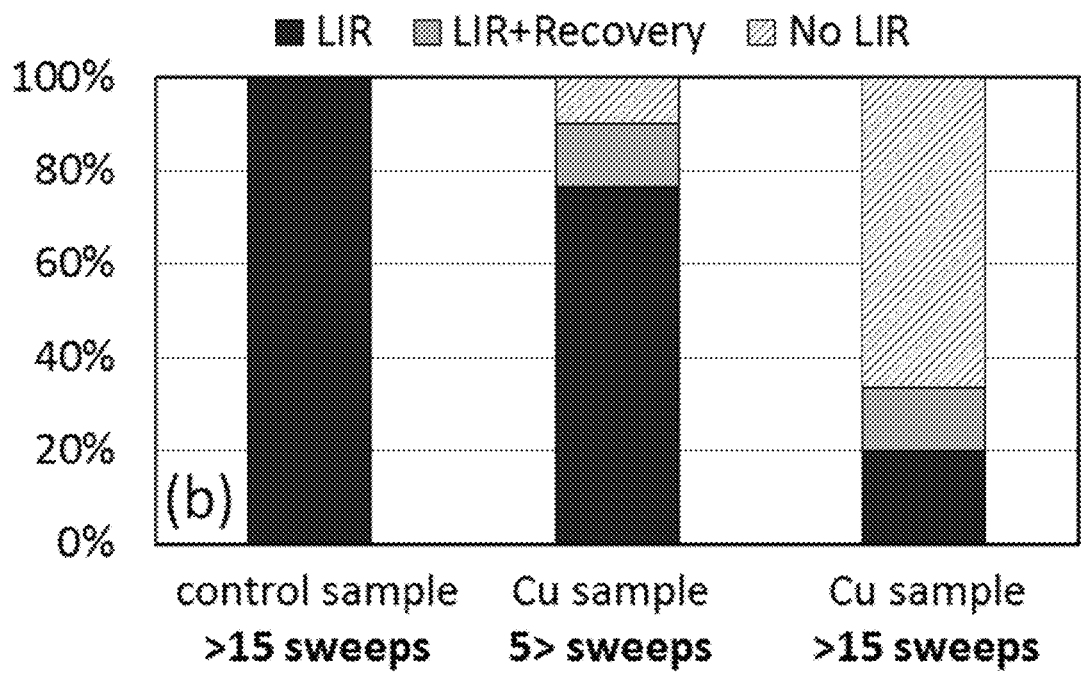
FIG. 20H is a plot of the percentage (%) of breakdown paths or conductive filaments (out of a total of 30 each) which can still display the light induced reset (LIR) behavior after a certain number of negative-voltage sweeps according to various embodiments.

FIG. 20H is a plot 2000h of the percentage (%) of breakdown paths or conductive filaments (out of a total of 30 each) which can still display the light induced reset (LIR) behavior after a certain number of negative-voltage sweeps according to various embodiments. "LIR+Recovery" represents the minority that reverts to the low resistance state (LRS) after the illumination. For a majority of the CFs in the Cu sample, however, they did not respond to the visible light, as is apparent from the approximately constant LRS current throughout the illumination period. The number of the applied negative sweep is found to significantly affect the photo-response of the CF in the Cu sample. As shown in FIG. 20H, more than 90% of the 30 CFs exhibit the LIR behavior when the number of negative sweeps is less than 5. This percentage is significantly reduced to 33% when the number of negative sweeps exceeds 15. Clearly, a large number of the CFs are rendered non-photo-responsive after repeatedly subjecting them to the negative sweep. It is interesting to point out that for a small number of CFs that can still respond to the visible light after the repeated voltage sweeps (dark grey; FIG. 20H), the effect of LIR is temporary, i.e. the current reverts to the LRS level after the illumination is removed (see for example the thin black line 2012 in FIG. 20G). Such a behavior is not observed on the control sample for the conditions used in this study. A similar behavior of a temporary LIR was found in the $HfO_2$/TiN stack, with the probability of such occurrence increasing with the forming current compliance. When forming is carried out at a higher current compliance, the increased Joule-heating results in the released O ions propagating further away from the filament, thereby limiting their migration back to the filament for a given illumination time. The temporary LIR observed may have arisen from a partial disruption of the CF caused by changes in the spatial distribution of O ions within the filament region during illumination. As filament formation and the extent of outward propagation of the released O ions are stochastic processes highly dependent on the local material chemistry, the above scenario may apply to some CFs even though all CFs are formed under the same forming current compliance. Further study on the temporary LIR effect may be needed.

To further probe the mechanism behind the lack of LIR after the repeated negative sweeps, a comparison is made between the averaged pre-illumination I-V curve of the 20 CFs which lost their LIR behavior after the repeated negative sweeps and the averaged pre-illumination I-V curve of the same 20 locations that were photo-responsive in the initial stage (cf. FIG. 20D).

Figure 20I:
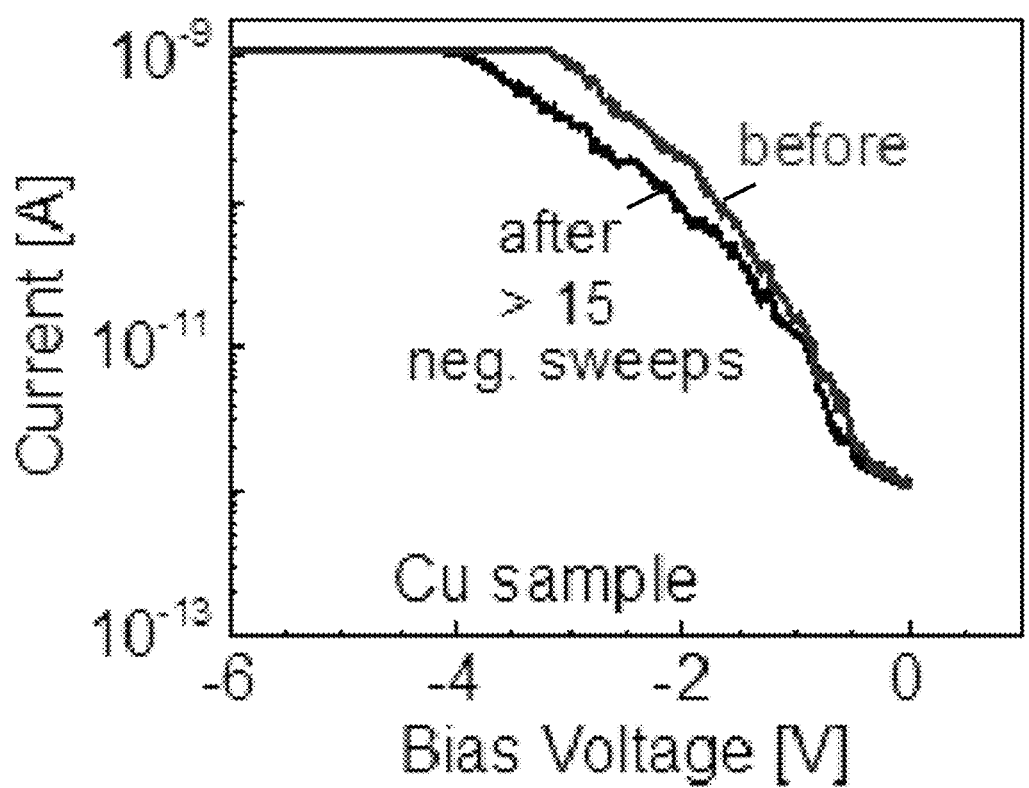
FIG. 20I is a plot of current (amperes or A) as a function of bias voltage (volts or V) showing the averaged pre-illumination current-voltage (I-V) curves of 20 conductive filaments in the silicon oxide/copper/titanium/p-type (SiO$_2$/Cu/Ti/p-Si) sample (i.e. Cu sample) before and after more than 15 negative-voltage sweeps according to various embodiments.
Figure 20J:
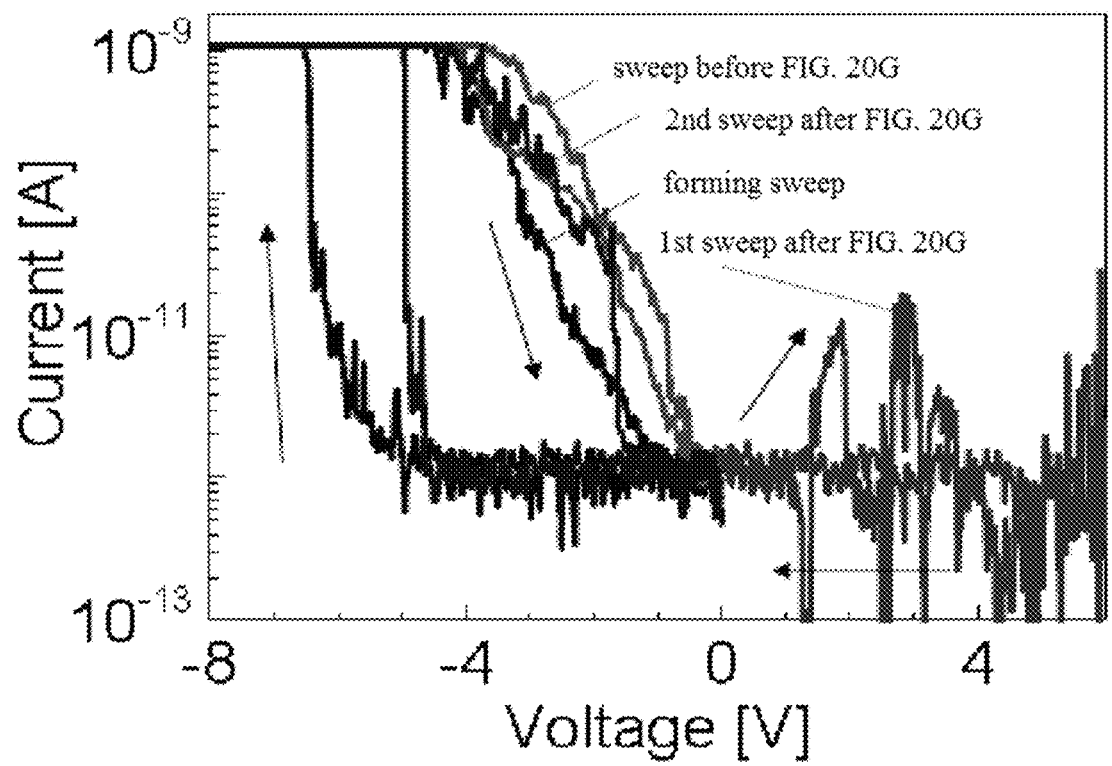
FIG. 20J is a plot showing the current (amperes or A) as a function of bias voltage (volts or V) of a conductive filament in the silicon oxide/copper/titanium/p-type silicon (SiO$_2$/Cu/Ti/p-Si) sample (i.e. Cu sample) showing that that the sample is able to be reset by a positive-voltage sweep when the sample no longer responds to visible light after repeated negative-voltage sweeps according to various embodiments.

FIG. 20I is a plot 2000i of current (amperes or A) as a function of bias voltage (volts or V) showing the averaged pre-illumination current-voltage (I-V) curves of 20 CFs in the silicon oxide/copper/titanium/p-type silicon ($SiO_2$/Cu/Ti/p-Si) sample (i.e. Cu sample) before and after more than 15 negative-voltage sweeps according to various embodiments. No obvious difference between the two curves can be observed (FIG. 20I). This observation enables one to exclude the possible progression of the CF towards hard breakdown as the reason for the loss of photo-response after repeated negative sweeps. To check this, a positive sweep is applied after the repeated negative sweeps. A near-complete reset can still be achieved on all the CFs. FIG. 20J is a plot 2000j showing the current (amperes or A) as a function of bias voltage (volts or V) of a CF in the silicon oxide/copper/titanium/p-type silicon ($SiO_2$/Cu/Ti/p-Si) sample (i.e. Cu sample) showing that that the sample is still able to be reset by a positive-voltage sweep when the sample no longer responds to visible light after repeated negative-voltage sweeps according to various embodiments. A subsequent reforming step would render the CF photo-sensitive again.

These findings indicate that the photosensitivity of the CF in the Cu sample can be modulated by the repeated voltage sweeps.

Figure 21A:
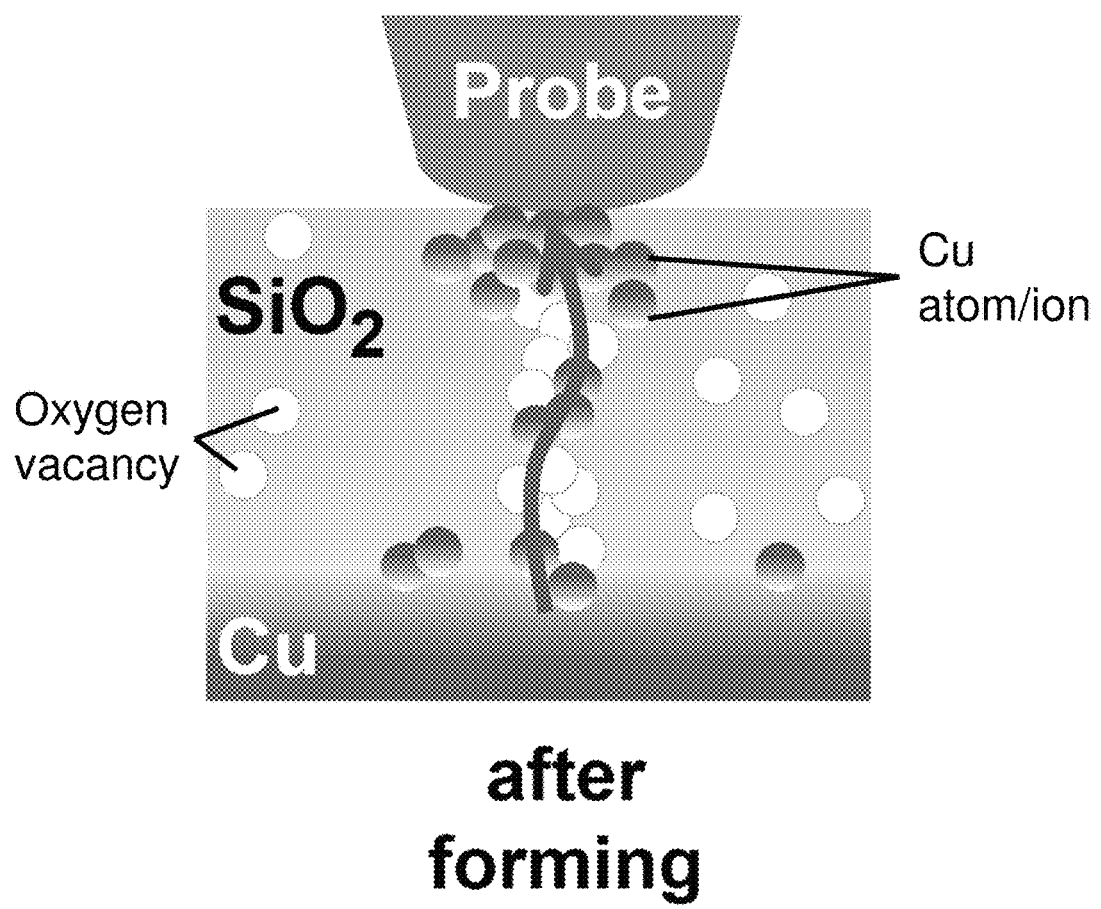
FIG. 21A is a schematic diagram showing the initial state of a conducting filament in the silicon oxide/copper/titanium/p-type silicon (SiO$_2$/Cu/Ti/p-Si) sample (i.e. Cu sample) after forming according to various embodiments.
Figure 21B:
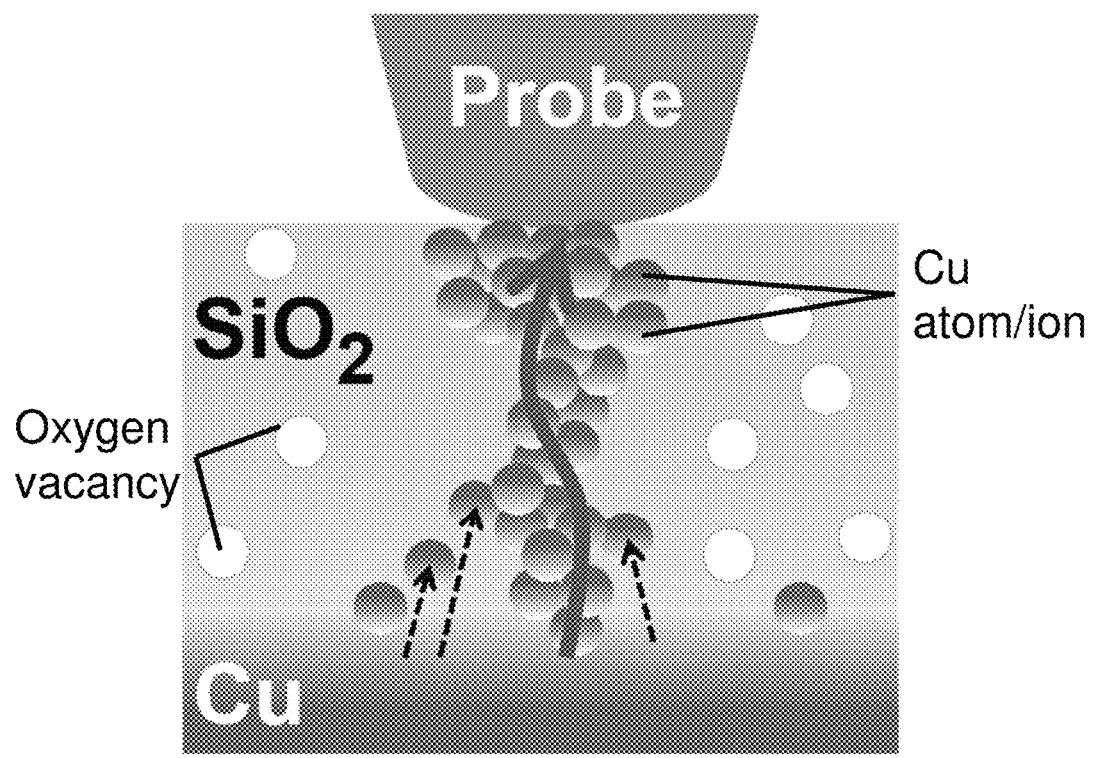
FIG. 21B is a schematic diagram showing change in the filament composition during a negative-voltage sweep applied to the probe according to various embodiments.

FIG. 21A is a schematic diagram 2100a showing the initial state of a conducting filament (CF) in the silicon oxide/copper/titanium/p-type silicon ($SiO_2$/Cu/Ti/p-Si) sample (i.e. Cu sample) after forming according to various embodiments. FIG. 21B is a schematic diagram 2100b showing change in the filament composition during a negative-voltage sweep applied to the probe according to various embodiments. Cu ions drawn from the bottom Cu electrode into the filament region by the negative-voltage sweep (see dotted arrows) fill the oxygen vacancies present in the initial CF, resulting in the formation of a complete Cu filament.

A possible explanation for the loss of photo-response of a CF in the Cu sample after repeated negative sweeps is depicted in FIGS. 21A-B. Cu ions may precipitate and form a CF in a solid electrolyte (which is $SiO_2$ here), with gaps in between the Cu filament and the $SiO_2$/probe interface. After forming, the CF in the Cu sample may be made up of both Cu-ion clusters and $V_O$ defects (FIG. 21A). The existence of $V_O$ defects in the filament region makes the CF photo-responsive, as photon-stimulated back-migration of oxygen ions in the CF's vicinity and their recombination with the $V_O$ defects within CF would disrupt the filament, leading to a partial resistance reset (FIG. 20F). At the same time, the CF may be reset almost completely by a positive sweep, which simultaneously drives the Cu ions back to the bottom Cu electrode and eliminates the Vo defects by drawing O ions from the Cu interface region. If a negative sweep is repeatedly applied after forming, more Cu ions are drawn into the CF region, occupying the Vo sites in the initial CF to form a complete Cu filament (FIG. 21B). First-principle calculation has shown that metal-ion migration in an oxide network is enhanced by the presence of Vo defects. Disruption of the Cu filament requires not only the cleavage of Cu-Cu bonds but also the ionization of Cu to $Cu^+$ or $Cu^{2+}$. The Cu—Cu bonding energy is 2.08 eV and the first ionization energy to form $Cu^+$ is 7.73 eV, requiring a total energy of $1.57 \times 10^{-18}$ J, ~10× larger than the energy provided by the LED source used. Thus, the visible light used is unable to disrupt the CF in the Cu sample after a complete Cu filament is formed. A stronger light intensity is observed to be able to disrupt the CF (after the multiple voltage sweeps) or delay the loss of photo-response to a larger number of voltage sweeps. This observation is still under further study. On the other hand, a positive sweep could drive the Cu ions back to the bottom electrode and reduces $V_O$'s via recombination with O ions drawn from the Cu interface region, thus causing a reset.

In summary, it is shown that visible light is able to disrupt the CF in the $SiO_2$/Cu stack and the breakdown path in the $SiO_2$/Si stack. The observations may be attributed to the photo-stimulated recombination between Vo defects within the filament or breakdown region and O ions in the vicinity. However, unlike the latter where a consistent photo-response may still be observed, the CF in the $SiO_2$/Cu stack would become non-photo-responsive after repeated negative-voltage sweeps were applied to the C-AFM probe (top electrode). The photosensitivity may, however, be restored by electrically resetting the CF and reforming it again. These results show the existence of an electrically controllable photosensitivity effect in the $SiO_2$/Cu stack. The loss of photosensitivity may be ascribed to additional Cu ions drawn into the filament by the applied negative voltage filling the Vo defects there, thus suppressing their photo-stimulated recombination with O ions in the vicinity.

EXPERIMENT 6

The structure of this test sample is zirconium oxide/titanium nitride/silicon ($ZrO_2$/TiN/Si). Interestingly, a larger number of repeated negative voltage sweeps (~70) is needed to cause the breakdown path to lose its negative photo-response, as compared to the case of the copper (Cu) sample in the previous experiment.

Figure 22A:
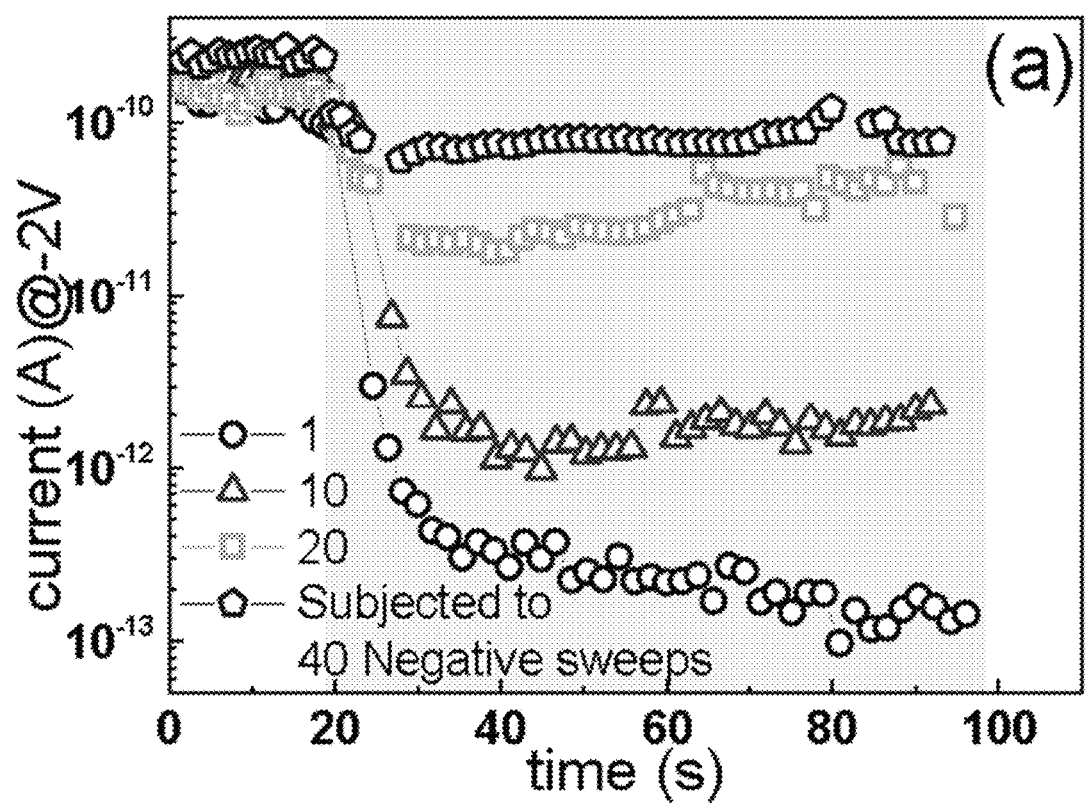
FIG. 22A is a plot of current (amperes or A) as a function of time (seconds or s) showing progressive loss of negative photo-response of the breakdown path in the zirconium oxide/titanium nitride/silicon (ZrO$_2$/TiN/Si) test sample as the number of applied negative voltage sweeps is increased according to various embodiments.
Figure 22B:
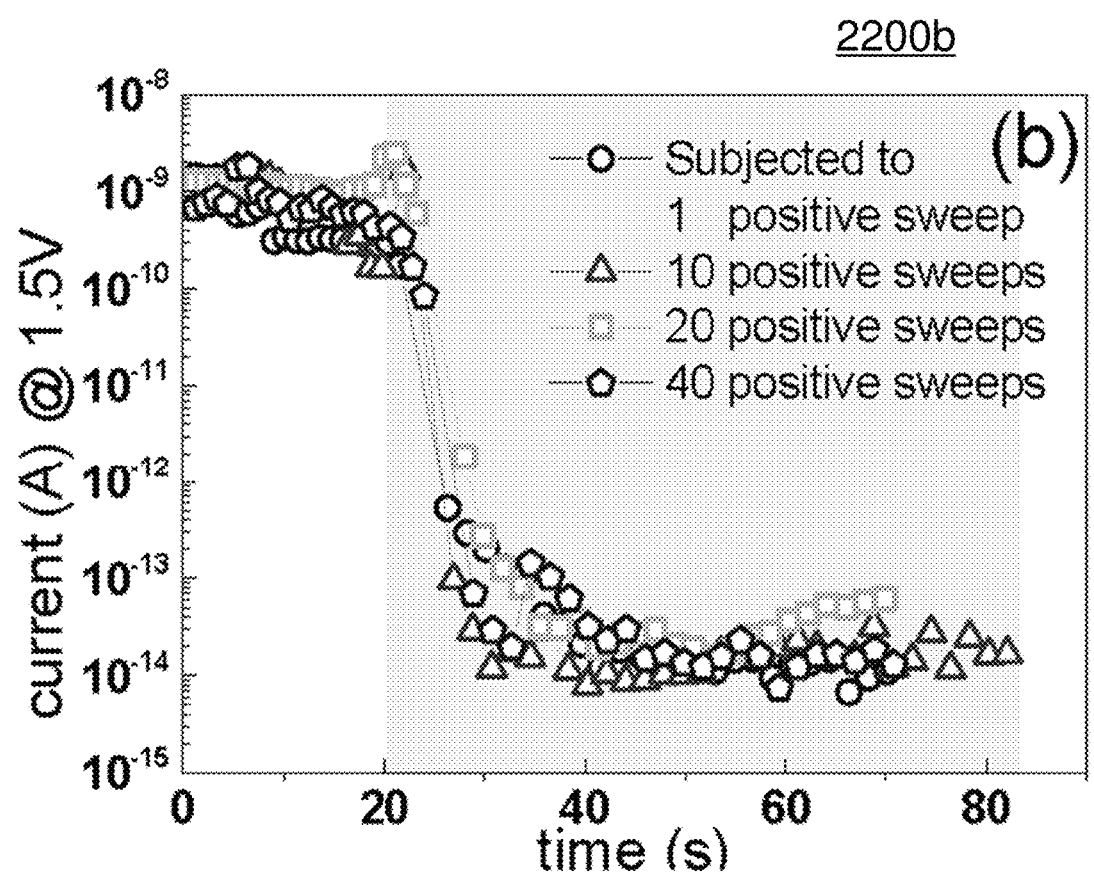
FIG. 22B is a plot of current (amperes or A) as a function of time (seconds or s) showing no loss of negative photo-response when the breakdown path was subjected to repeated positive voltage sweeps according to various embodiments.
Figure 22C:
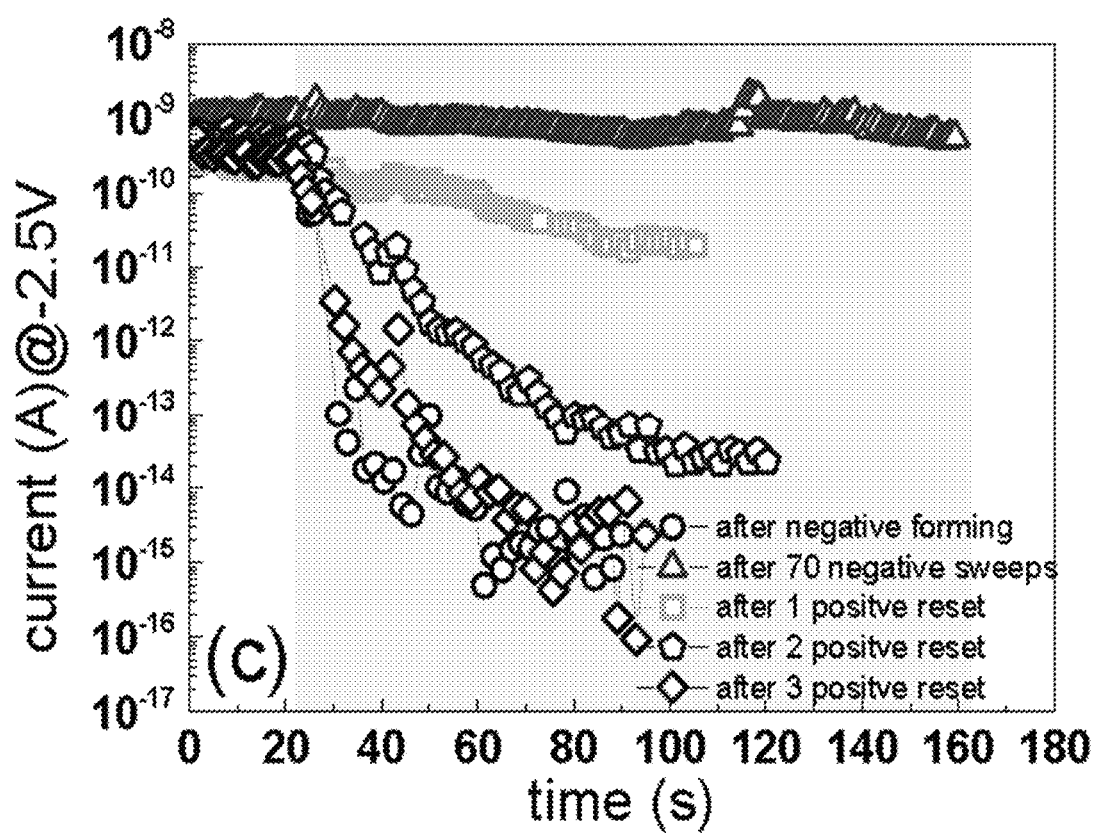
FIG. 22C is a plot of current (amperes or A as a function of time (seconds or s) showing restoration of negative photo-response after positive voltage sweep(s) according to various embodiments.

FIG. 22A is a plot 2200a of current (amperes or A) as a function of time (seconds or s) showing progressive loss of negative photo-response of the breakdown path in the zirconium oxide/titanium nitride/silicon ($ZrO_2$/TiN/Si) test sample as the number of applied negative voltage sweeps is increased according to various embodiments. FIG. 22B is a plot 2200b of current (amperes or A) as a function of time (seconds or s) showing no loss of negative photo-response when the breakdown path was subjected to repeated positive voltage sweeps according to various embodiments. FIG. 22C is a plot 2200c of current (amperes or A as a function of time (seconds or s) showing restoration of negative photo-response after positive voltage sweep(s) according to various embodiments. The duration of illumination is greyed in FIGS. 22A-C.

Very interestingly, a single positive voltage sweep is sufficient to restore the negative photo-response. These findings suggest the possibility of achieving photo-response modulation via a combination of electrode type and number of voltage sweeps.

FIG. 22D is a table 2200d illustrating the likelihood of the breakdown path exhibiting electrical and light induced increase in resistance in samples with different electrodes according to various embodiments. The table 2200d provides a summary for the various electrodes examined thus far. Comparison is based on the percentage of breakdown paths exhibiting negative photo-response after forming. A lower percentage indicates that a larger number of the breakdown paths are unable to exhibit negative photo-response, implying a greater likelihood of metal ions migrating into the paths during the forming process thus causing the paths to lose their photosensitivity.

Among the various electrodes examined, Ni has the lowest percentage. This result agrees with other reports that it is relatively easy to form a Ni filament (i.e. a breakdown path made up of Ni) after forming. The highest percentages are obtained for the control sample ($SiO_2$/Si) and Al sample ($SiO_2$/Al/Ti/Si). Intermediate values are obtained for the Cu sample ($SiO_2$/Cu/Ti/Si) and Ti sample ($SiO_2$/Ti/Si).

EXPERIMENT 7

Figure 23A:
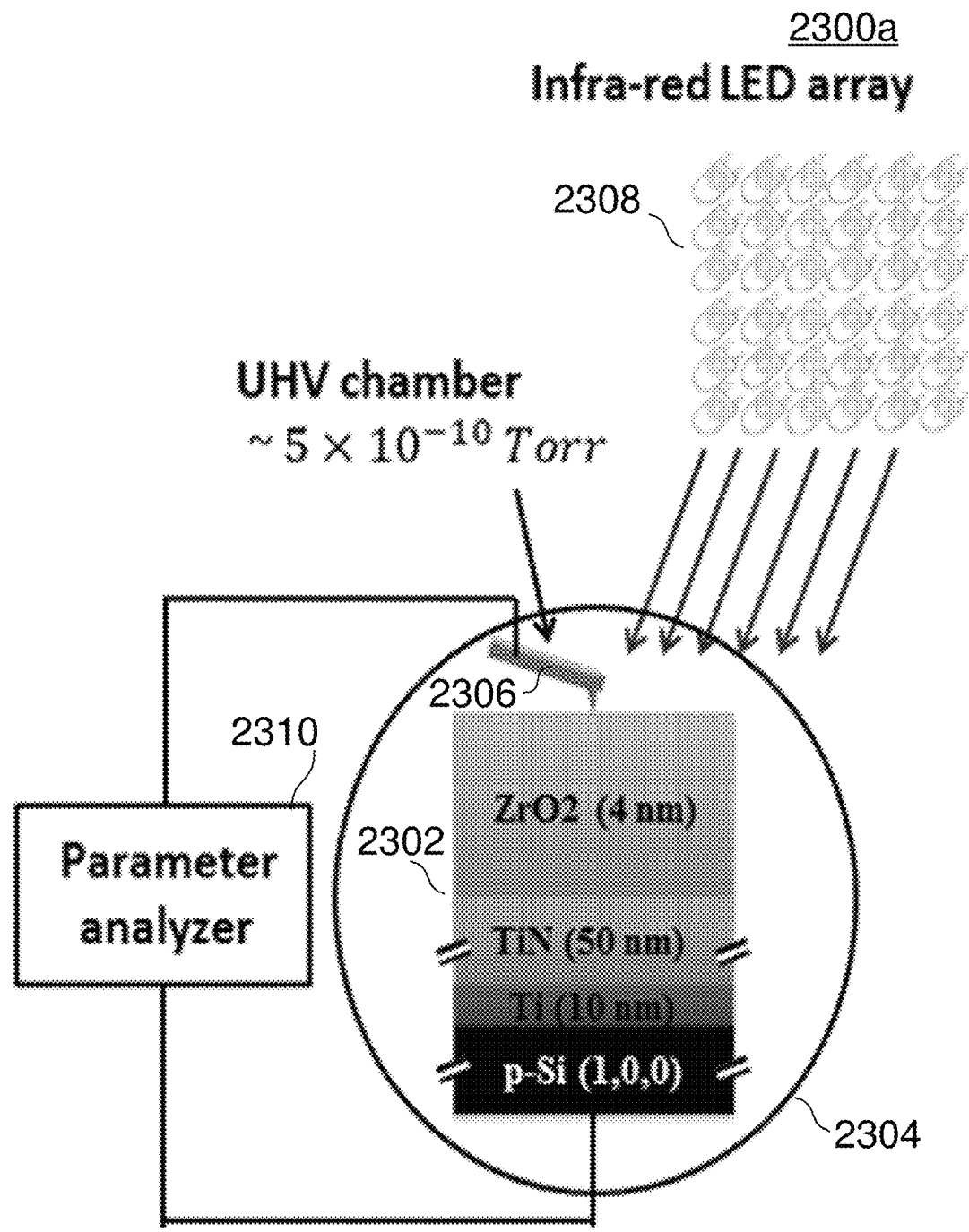
FIG. 23A is a schematic illustrating the experimental setup for testing the sample according to various embodiments.

The infra-red light-induced RESET is observed on $ZrO_2$/TiN sample in ultra-high-vacuum ($5\times10^{-10}$ Ton) conductive atomic force microscope (CAFM) chamber. FIG. 23A is a schematic illustrating the experimental setup 2300a for testing the sample 2302 according to various embodiments. As shown in FIG. 23A, the sample 2302 is positioned within ultra-high-vacuum chamber (UHV) 2304 and CAFM probe 2306 acts as the top electrode and an infra-red (wavelength 850 nm) LED array 2308 is placed outside the chamber 2304 near quartz window as the light source. The light intensity is measured to be 6 mW/cm$^2$ at the sample surface. The top electrode and the bottom electrode are coupled to parameter analyzer 2310, which is Keithley SCS-4200. The bottom electrode is TiN and the top electrode is a CAFM diamond coated Si-probe.

Figure 23C:
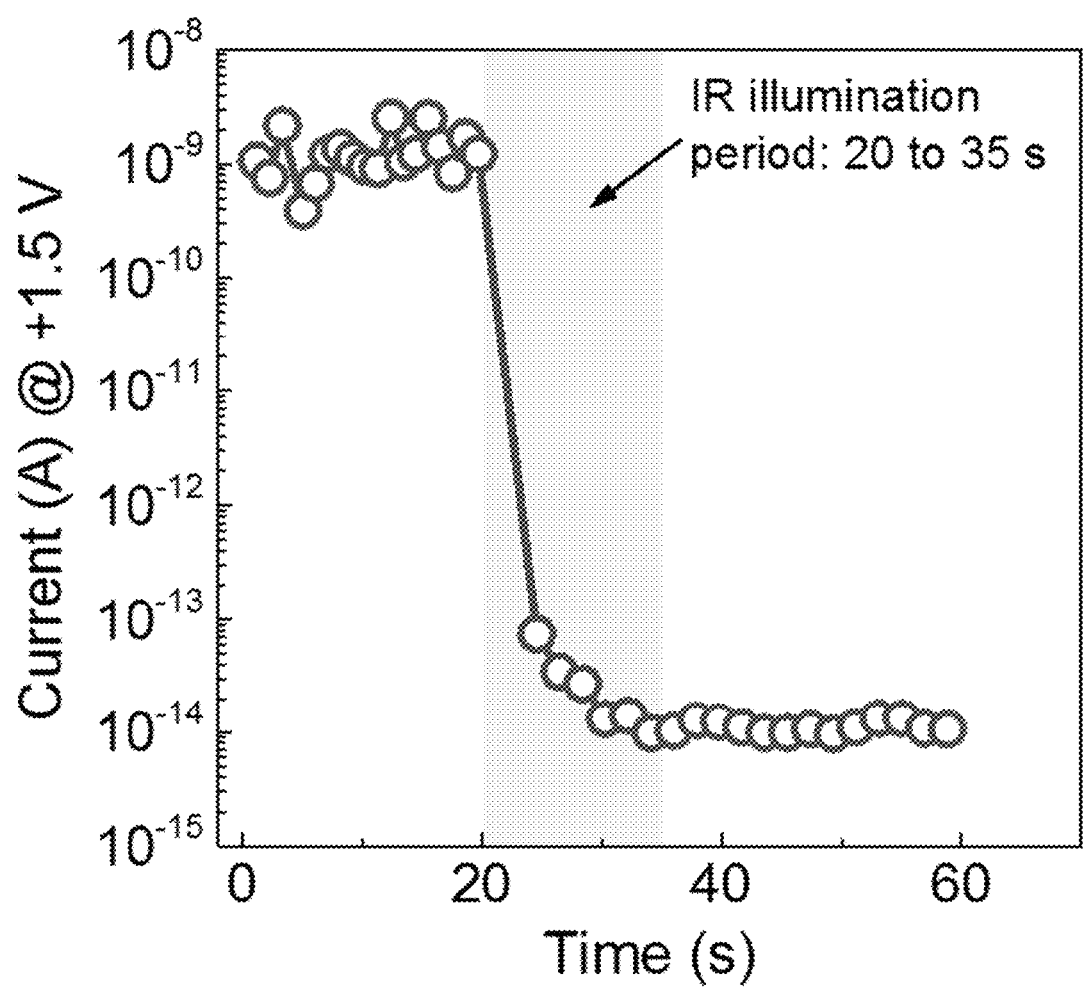
FIG. 23C is a plot of current (amperes or A) as a function of time (seconds or s) showing the current-time characteristics of infra-red light induced RESET upon illumination according to various embodiments and the current stability without illumination as a comparison.

FIG. 23B is a plot 2300b of current (amperes or A) as a function of voltage (volts or V) showing the formation of a conducting filament, as indicated by the abrupt current increase, during the first positive-voltage sweep, followed by electrical reset using a negative-voltage sweep, filament reformation by using a negative-voltage sweep and filament reformation again after infra-red light-induced reset (LIR) according to various embodiments. FIG. 23C is a plot 2300c of current (amperes or A) as a function of time (seconds or s) showing the current-time characteristics of infra-red light induced RESET upon illumination according to various embodiments and the current stability without illumination as a comparison.

FIGS. 23A-B show the coexistence of the electrical switching and the infra-red light-induced RESET. In FIG. 23A, curve 2312 and curve 2314 show a normal electrical switching, after which the sample is reformed to the low-resistance-state (LRS) as shown by the voltage sweep curve 2316, ready for the subsequent infra-red light-induced RESET. In FIG. 23B, a +1.5 V is applied to the sample as the monitoring bias, detecting the current as a function of time. For the period 0~20 s, the sample is in the dark and this serves as a comparison for the following infra-red test, evidencing the stability of the current without illumination. The infra-red illumination starts at 20 s, where a gradual current decrease can be obviously observed until it reaches the lowest current limit at around 35 s. A subsequent voltage sweep (curve 2318) in FIG. 23A confirms the effect of the infra-red light-induced-RESET, which is close to the high-resistance state (HRS) after electrical RESET.

Figure 24A:
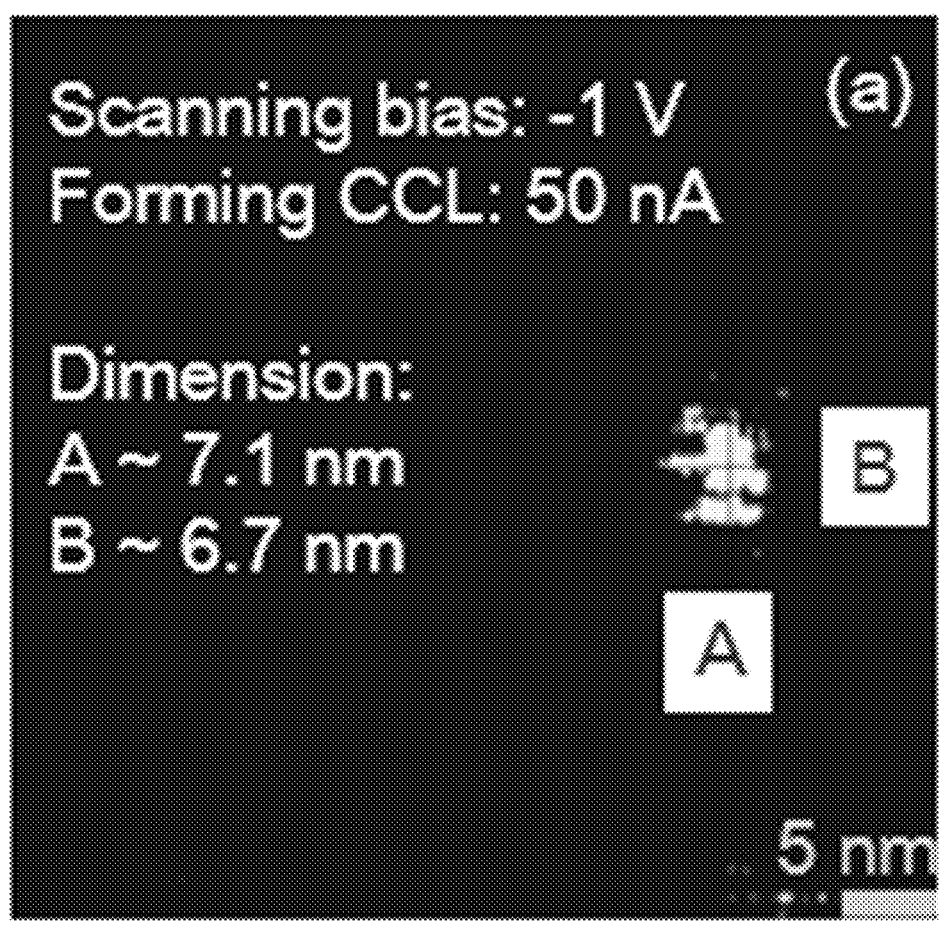
FIG. 24A is a current map of the sample before illumination according to various embodiments.
Figure 24B:
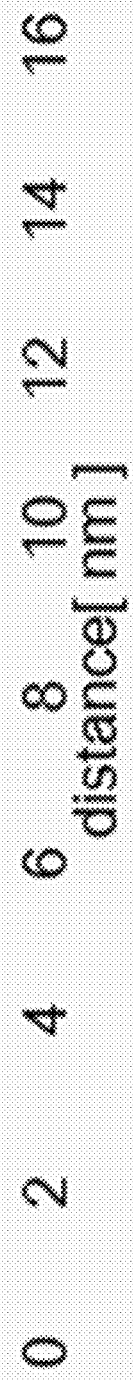
FIG. 24B is a plot of current (pico-amperes or pA) as a function of distance (nanometer or nm) showing the vertical section view of the conductive filament along the section path according to various embodiments.
Figure 24C:
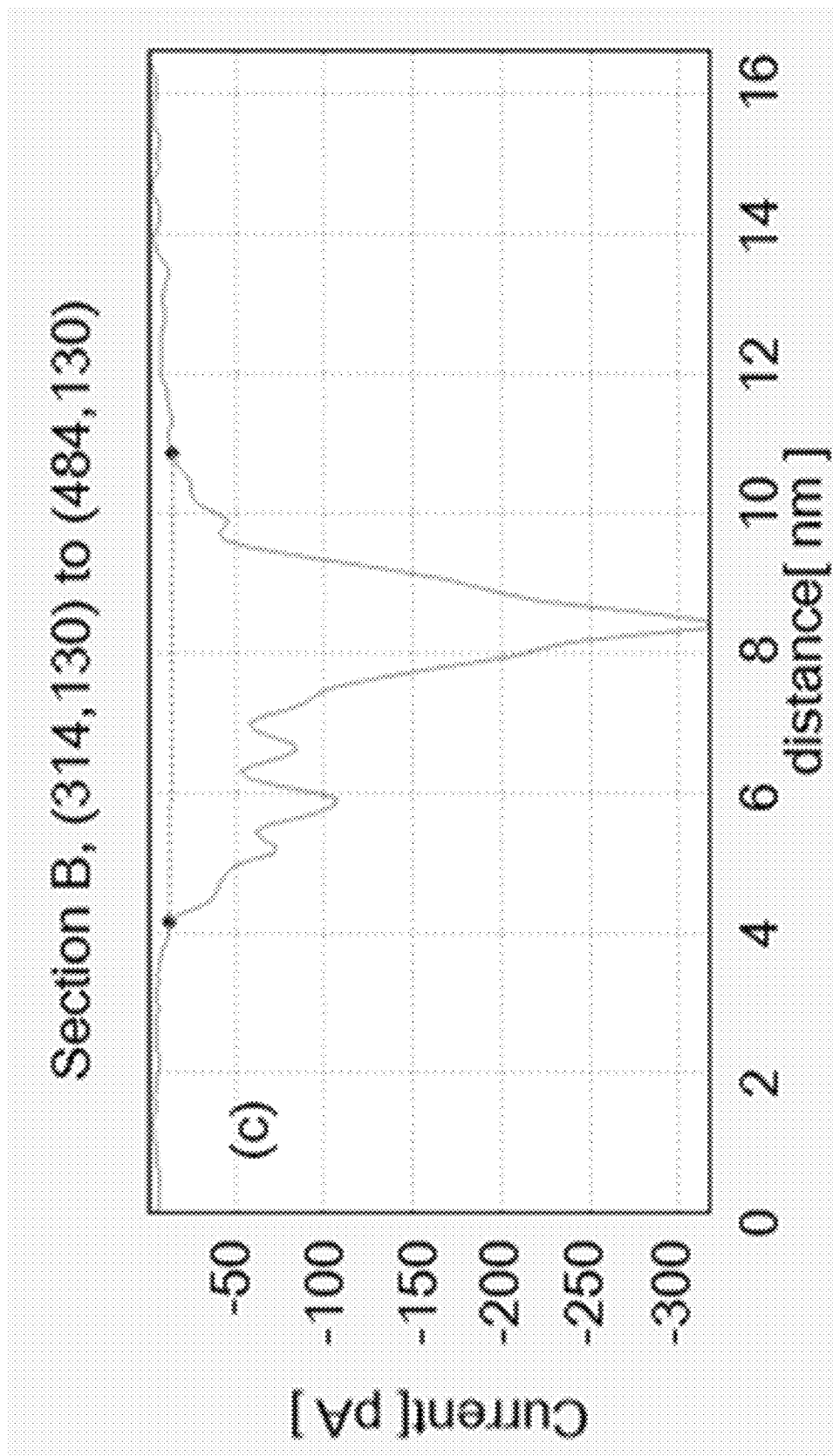
FIG. 24C is a plot of current (pico-amperes or pA) as a function of distance (nanometer or nm) showing the horizontal section view of the conductive filament along the section path according to various embodiments.
Figure 24D:
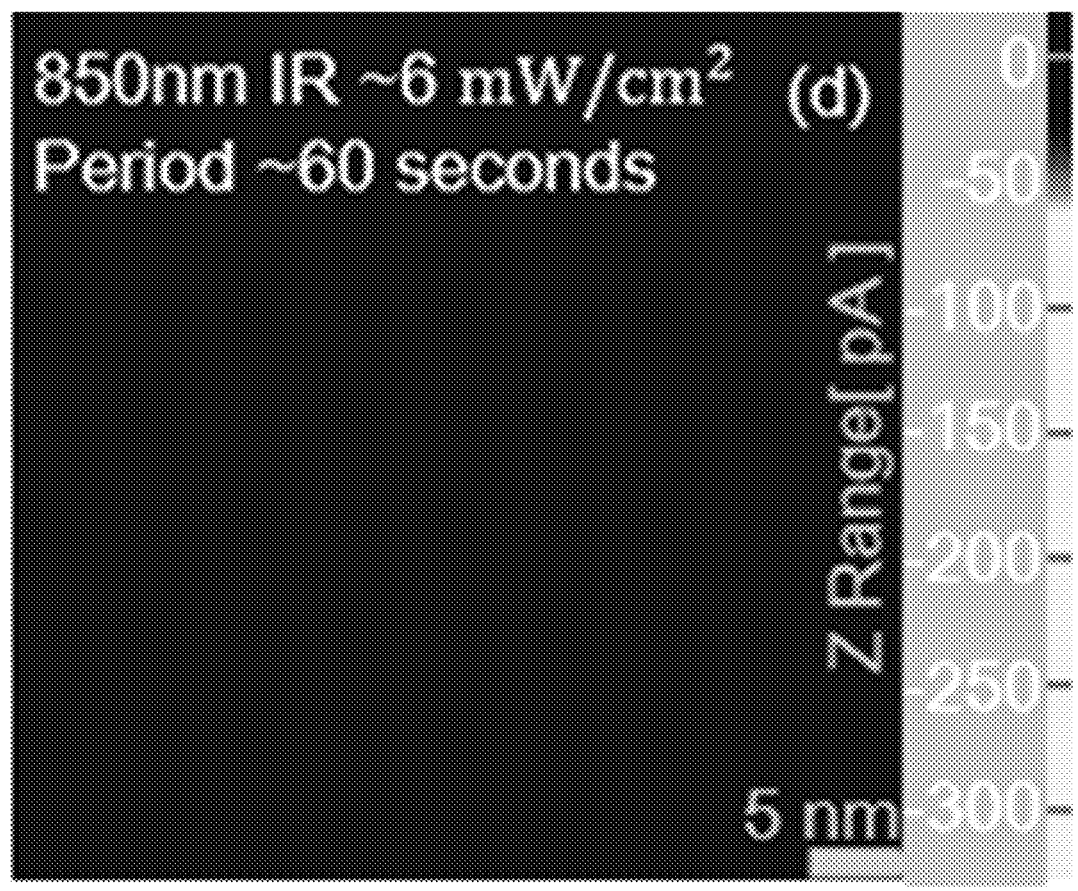
FIG. 24D is a current map of the sample after infra-red illumination according to various embodiments.

FIG. 24A is a current map 2400a of the sample before illumination according to various embodiments. FIG. 24B is a plot 2400b of current (pico-amperes or pA) as a function of distance (nanometer or nm) showing the vertical section view of the conductive filament along the section path according to various embodiments. FIG. 24C is a plot 2400c of current (pico-amperes or pA) as a function of distance (nanometer or nm) showing the horizontal section view of the conductive filament along the section path according to various embodiments. FIG. 24D is a current map 2400d of the sample after infra-red illumination according to various embodiments.

The effect of the infra-red light-induced-RESET is evidenced by the CAFM current map as well, as shown in FIGS. 24A-D. After forming at a current compliance of 50 nA, a conductive filament is clearly seen in FIG. 24A, with a diameter of about 7 nm, measured by the section view A and B (FIGS. 24B-C), showing a few hundreds of pA within the conductive filament with a scanning bias of −1 V applied to the substrate. In contrast, after sample exposure to infra-red illumination for around 60 s, the bright area (conductive filament) disappears as shown in FIG. 4D, which is consistent with the voltage sweep and I-T curves in FIGS. 23A-B, confirming the existence of the infra-red light-induced RESET phenomenon.

Figure 25A:
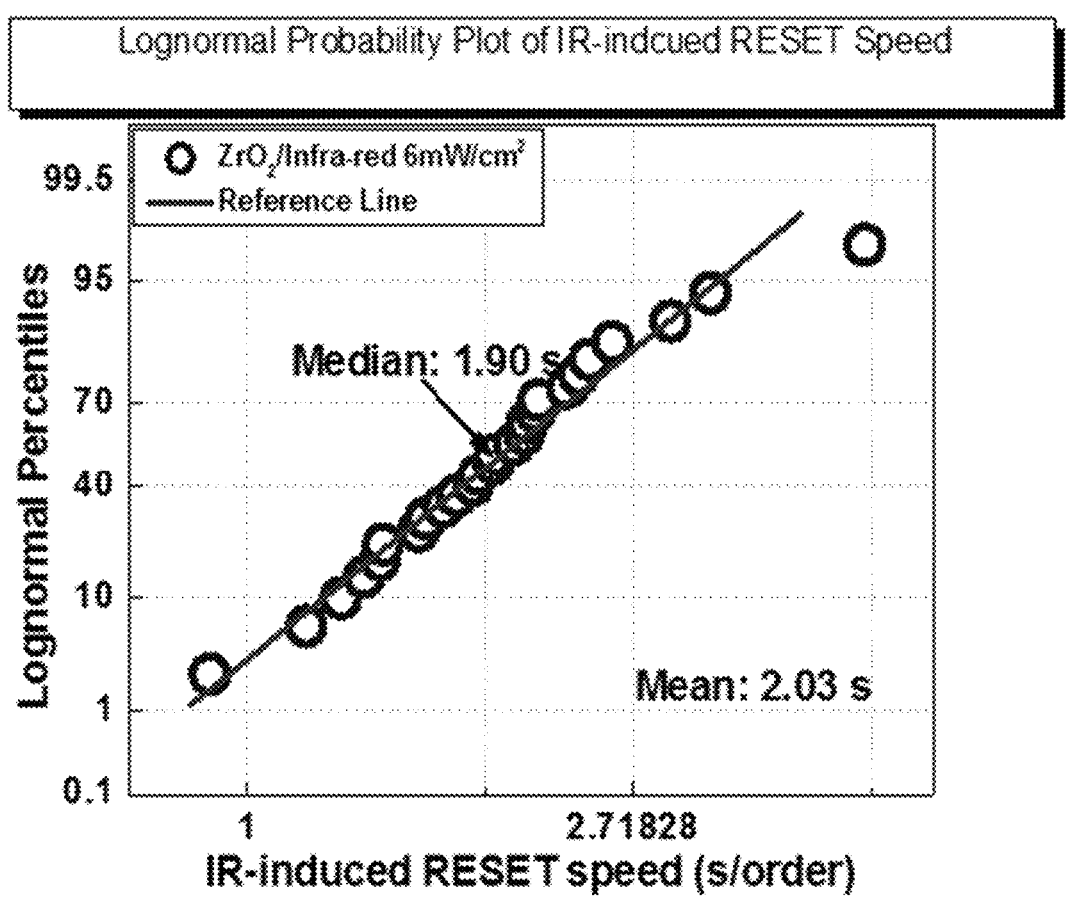
FIG. 25A is a plot of lognormal percentiles (percentage or %) as a function of the infrared-induced-RESET time (seconds or s) (defined as the time corresponding to one decade decrease in current), showing the statistical analysis of the infra-red light-induced RESET speed according to various embodiments.

FIG. 25A is a plot 2500a of lognormal percentiles (percentage or %) as a function of the infrared-induced-RESET time (seconds or s) (defined as the time corresponding to one decade decrease in current), showing the statistical analysis of the infra-red light-induced RESET speed according to various embodiments.

The RESET time (defined as the time for a decade decrease in current) follows log-normal distribution, with a mean value of 2.03 s and a median value of 1.90 s among 26 measured spots.

Figure 25B:
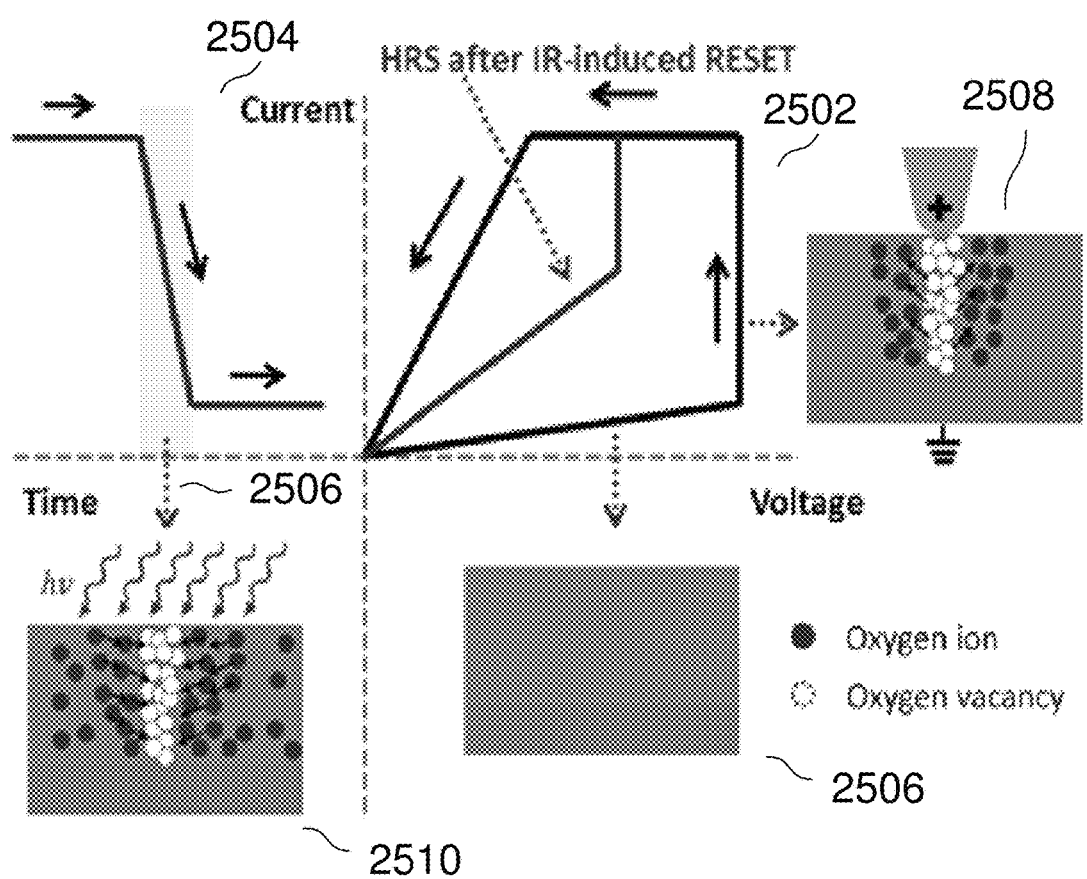
FIG. 25B is a schematic illustrating a possible mechanism of the infra-red light-induced RESET according to various embodiments.

FIG. 25B is a schematic 2500b illustrating a possible mechanism of the infra-red light-induced RESET according to various embodiments. 2502 is a plot of current as a function of voltage while 2504 is a plot of current as a function of time. 2506 is a schematic of the oxide dielectric in a fresh state before a conductive filament is formed, 2508 is a schematic showing the forming process: current formation and interstitial oxygen ions distribution. 2510 is a schematic showing infra-red light-induced RESET process: excitation of interstitial oxygen ions by photon energy and disruption of the conductive filament caused by the back diffusion of the excited oxygen ions.

The sample is at fresh state before forming, showing a low current in the I-V curve. At a certain voltage, the forming occurs. The oxygen ions move away from the current path, driven by electrical field and Joule heating, and finally distribute around the CF to be interstitial oxygen ions. Upon illumination, these interstitial oxygen ions may be re-activated to be movable by absorbing the photon energy provided by the infra-red light source. By virtue of the oxygen concentration difference, the activated oxygen ions would naturally diffuse towards the low concentration area, namely the conductive filament, resulting in the disruption of the current path.

EXPERIMENT 7

The impact of red light and blue light on the speed of the negative photoresponse is examined. The red and blue coloured lights were achieved by passing white light (from an LED (light-emitting diode) illuminator) through the relevant colour filter. The coloured light was focused using a collimator lens. The intensity was measured by a solar meter placed at 25 cm (similar to the separation between the test sample and light source) from the light source.

Figure 26:
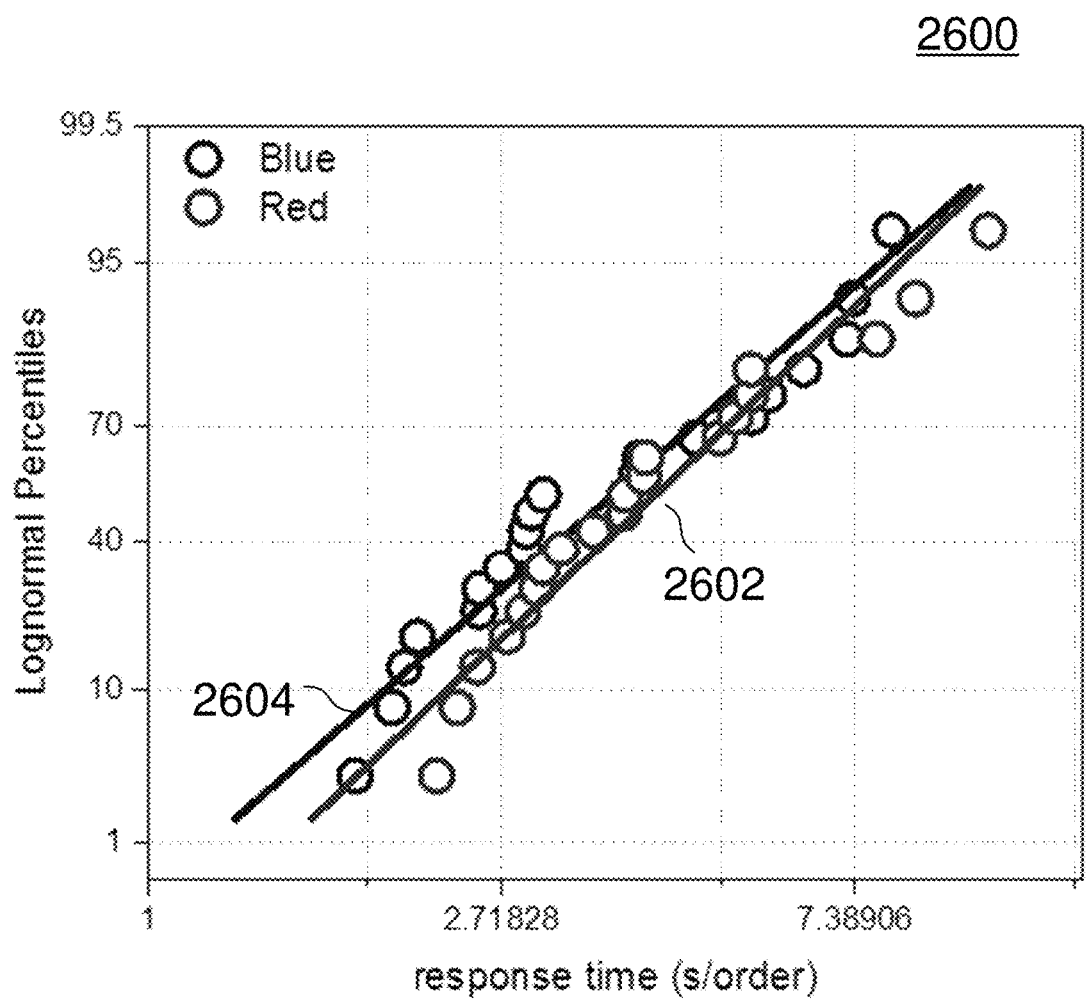
FIG. 26 is a plot of lognormal percentiles (percentage or %) as a function of the infrared-induced-RESET time (seconds or s) (defined as the time corresponding to one decade decrease in current), showing the distributions for red and blue light of intensity ~5 mW/cm$^2$ (as measured separately using a solar meter) according to various embodiments.

FIG. 26 is a plot 2600 of lognormal percentiles (percentage or %) as a function of the infrared-induced-RESET time (seconds or s) (defined as the time corresponding to one decade decrease in current), showing the distributions for red light (indicated by 2602) and blue light (indicated by 2604) of intensity ~5 mW/cm² (as measured separately using a solar meter) according to various embodiments.

FIG. 26 shows the distribution of the response time for red light (2602) and blue light (2604). The response time is defined as the time it takes for the current through the breakdown path to decrease by one order of magnitude (10×). The average response time for red and blue light are 4.51 s and 4.04 s, respectively. Interestingly, the results show marginal difference in the average response time for red and blue light. The finding may be beneficial to optical/image sensing application as it suggests that the breakdown path has broadband photosensitivity.

The data presented here are preliminary. Further measurements are in progress after the following issues were resolved recently.

"Shadow" effect: Because the intensity of the light after the colour filter is significantly reduced, a collimator lens has to be used to focus the light onto the test sample so that sufficient light intensity is achieved. Due to the now narrower beam of light, a shadow effect occurs due to light blockage by one of the legs of the "beetle" scan head of the conductive atomic force microscope. Hence, the actual intensity of the light arriving at the sample surface is lower than that measured separately using a solar meter. This problem was successfully resolved by optimizing the sample height so that the leg would not be in the path of the light source after the probe has made contact to the sample surface.

Measurement speed limitation: Current measurement was previously made using a semiconductor parameter analyser. The average measurement time of the analyser is ~2 s or longer for sub-picoampere current level. This limitation had severe impact on the accuracy of the response time measurement. This problem was successfully resolved via real-time waveform capture using a high-speed oscilloscope. Very recent measurements have revealed response time in the range of tens to hundreds of milliseconds, giving much potential for further reduction in the case of a prototype device.

Image Sensor

The instrument that enables mobile devices such as smartphones, tablet computers, etc. to instantly capture an image of interest and share it on social media is the digital camera. At the heart of the digital camera is the CMOS image sensor, which is basically made up of a two-dimensional array of photodiodes, where each photodiode makes up one pixel in the digital image. The imaging process occurs when light, from an external object, falls on the array of photodiodes, generating within individual photodiodes varying amount of excess electrical charges which are in turn detected by a peripheral circuitry to form the digital image. Due to the constant drive towards higher image resolution, the size of individual photodiodes has continuously decreased over the years. The reduction in size of a photodiode has resulted in several critical problems/challenges for future CMOS image sensor development. These challenges include: 1) increased "cross-talk" between pixels due to their reduced spacing; 2) decreased signal-to-dark-current-noise ratio due to lesser electrical charge generation within the reduced pixel area.

Recently, it has been observed that a wide bandgap oxide such as $SiO_2$, $HfO_2$, etc. exhibits a negative photoconductivity behavior after suffering an electrical induced soft-breakdown. It should be mentioned that because of the relatively large bandgap of these oxide materials, they are non-photo-responsive (i.e. visible light is unable to induce any electrical response from them). Hence, although these oxide materials have been widely deployed in current integrated circuit (IC) manufacturing technology, stimulating them using visible light for realizing novel functionalities has never been a consideration; the operation of current CMOS ICs are limited to only electrical stimulation. It has been found that after suffering an electrical soft-breakdown, these oxide materials may become photo-responsive. In particular, the insulating property of the breakdown oxide may be restored upon illumination by visible light. As will be shown later, the restoration may be manifested via a significant decrease in electrical conduction through the breakdown oxide region. This response, which may be referred to as negative photoconductivity, suggests possible exploitation for digital imaging. Since these oxides are already part of the existing IC manufacturing technology, full manufacturing compatibility may immediately be realized after successful prototype development and testing.

Further reducing the size of the photodiodes in the current CMOS image sensor to improve image resolution may be challenging due to the issues on pixel cross-talk and dark current noise, which basically limit how close and how small each photodiode can be. The oxide image sensor according to various embodiments may be based on a different operating principle—the detection of the change in the electrical resistance, due to visible-light induced restoration of the insulating property of a nanoscale breakdown oxide region. As a consequence, the individual sensing elements in the oxide image sensor may be very small and spaced relatively far apart. This may help eliminate the crosstalk problem (leakage of electrical charge from one to another adjacent photodiode) that the current CMOS image sensor is facing. Moreover, the oxide sensing element may work based on an inverse or negative photoconductivity principle, i.e. the current flowing through the sensing element in the dark (i.e. the dark current) is higher than when it is exposed to visible light, with the rate of current decrease increasing with the dark current. In this way, the sensitivity of the oxide sensing element may actually improve with the level of the dark current. In contrast, the photodiodes in the CMOS image sensor relies on the additional electrical charges generated by light to achieve a further current increase as a means for light sensing. In this manner, the sensitivity of the photodiodes is compromised by the dark current already present before exposure to visible light, as a sufficient number of electrical charges may have to be generated during light exposure so as to create a current increase that can be distinguished from the inherent dark current noise due to thermal generation.

These inherent advantages of the oxide image sensor according to various embodiments mentioned above may be crucial to the realization of digital cameras with much improved image resolution (in the several tens of mega pixels) and that may be free from crosstalk and dark current noise issues. With the widespread use of digital cameras in mobile devices, which now form an integral part in the daily life of a common man on the street, various embodiments may thus have very a significant societal and market impact.

Figure 27A:
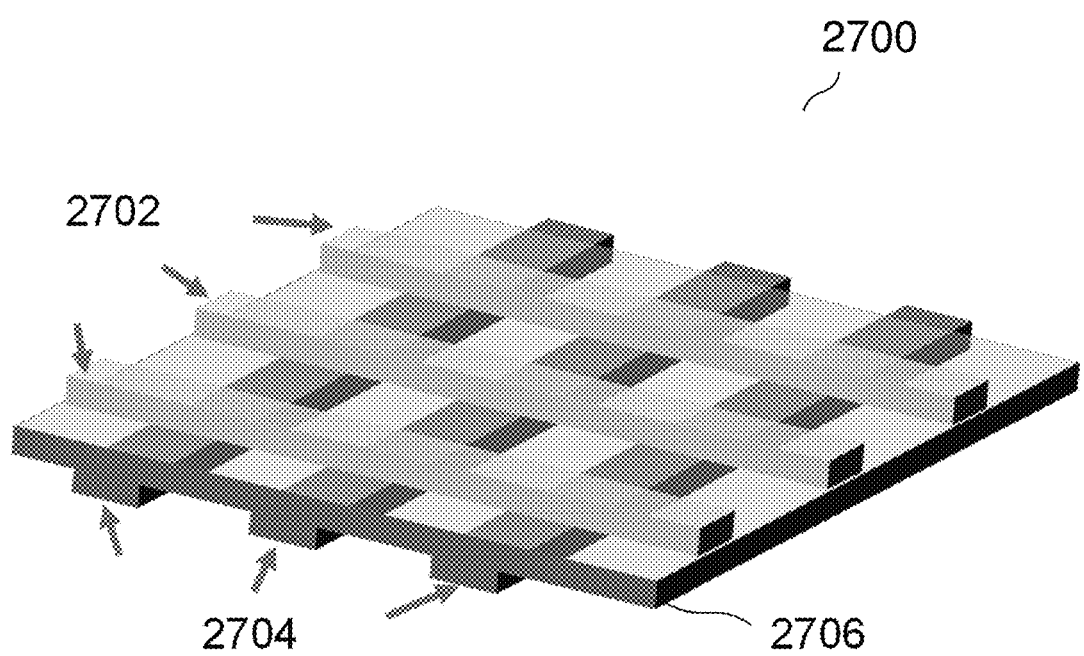
FIG. 27A is a schematic diagram showing a perspective view of an image sensor according to various embodiments.

FIG. 27A is a schematic diagram showing a perspective view of an image sensor 2700 according to various embodiments. The image sensor or oxide image sensor may include two sets of parallel metal lines 2702, 2704, arranged perpendicularly to each other and separated by an oxide layer 2706. Each pixel is made up of a small area metal-insulator-metal (MIM) structure, formed at the intersection between any two metal lines. In other words, a sensing element may be formed at the intersection between each pair of top electrode and bottom electrode.

As shown in FIG. 27A, the image sensor 2700 may include two sets of perpendicularly oriented parallel metal lines 2702, 2704, separated by an oxide layer 2706. Before imaging is carried out, a filament 2708 may be electrically formed at the intersection between any two metal lines. The top metal lines 2702 are made using a transparent conductive material (e.g. ITO glass or TiN of a high optical transmittance, etc.) so that the optical light interacts with the filaments 2708 formed. Upon exposure to light, the resistance of each filament 2708 may be modulated differently, depending on the amount of light each receives.

The modified resistance of each filament 2708 may then be read by applying appropriate voltages at the metal lines 2702, 2704 for digital image reconstruction. A potentially advantageous feature of the oxide sensor 2700 may lie in the broad dynamic range of resistance of ~3 to 4 orders of magnitude as shown above. As the resistance of the filament 2708 may be electrically varied at the time of its formation, it may be possible to use the same oxide sensor 2700 under a wide range of lighting conditions. For instance, for imaging under low-light condition, the current compliance applied during filament 2708 formation may be set to a lower value so that fewer oxygen ions may be displaced into the interstitial positions. This may in turn require lesser light energy to reset the resistance, making the oxide sensor 2700 more sensitive under low-light conditions.

Figure 27B:
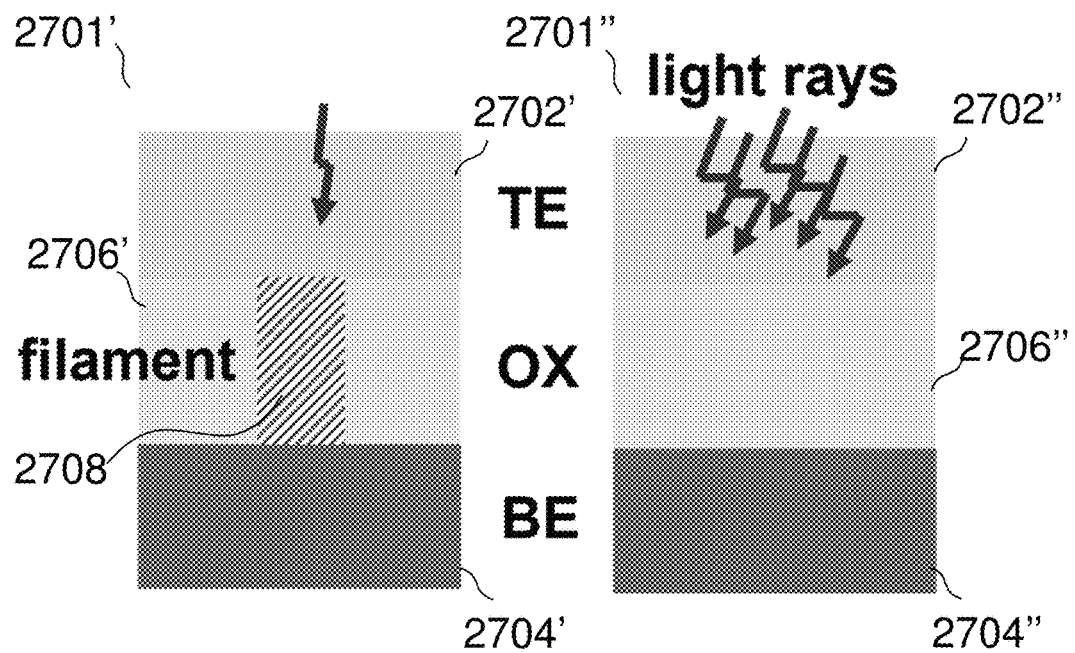
FIG. 27B is a schematic view showing a cross-sectional view of individual elements (pixel) or metal-insulator-metal (MIM) structures of the image sensor illustrated in FIG. 27A according to various embodiments.

FIG. 27B is a schematic view showing a cross-sectional view of individual elements (pixel) or metal-insulator-metal (MIM) structures 2701', 2701" of the image sensor 2700 illustrated in FIG. 27A according to various embodiments. Each element or structure 2701', 2701" may include a portion of the metal line 2702', 2702", a portion of the metal line 2704', 2704", and a portion of the oxide layer 2706', 2706" between the portion of the metal line 2702', 2702" and the portion of the metal line 2704', 2704". Conducting filaments such as filament 2708 may be formed by electrical forming processing in metal-insulator-metal (MIM) structures 2701', 2701" before imaging is executed according to various embodiments. Upon exposure to light, the resistance of each breakdown region may be modulated differently, depending on the amount of light each receives. For instance, as shown in FIG. 27B, a little light enters structure 2701' and the breakdown region is not restored, i.e. filament 2708 is not removed. Accordingly, the resistance between the top electrode (TE) portion 2702' and the bottom electrode (BE) portion 2704' may be low. On the other hand, a much larger amount of light may enter another sensing element 2701" and the breakdown region is completely restored. The resistance between the top electrode (TE) portion 2702" and the bottom electrode (BE) portion 2704" may be larger in this case. Electrical read-out of each sensing element's resistance may be performed after light exposure to reconstruct the digital image.

In other words, before the image capture step, each sensing element 2704', 2704" may be set into the same default state by electrically inducing a soft breakdown to the oxide 2706', 2706" sandwiched between the top electrodes 2702', 2704' and bottom electrodes 2702", 2704" through appropriate voltage pulses applied. The time needed to complete this step for each sensing element 2704', 2704" may be in the range of several tens of nanoseconds, as is already shown in other studies aimed at engaging a similar structure for non-volatile memory applications. As such a step may be simultaneously carried out on all the sensing elements 2704', 2704", the overall time needed may be extremely short and may not be noticeable to the user. Following this, exposure to the light coming from a lens system may take place. As a result of the spatial variation in the light intensity, the breakdown oxide 2706', 2706" in each sensing element 2701', 2701" may be restored by a different degree. As illustrated in FIG. 27B, the breakdown oxide 2706" in a sensing element 2701" exposed to a stronger light may be more completely restored as compared to the sensing element 2701' exposed to a weaker light. Following the light exposure step, the resistance of each sensing element 2701', 2701" may be "read" using appropriate voltage biases applied to the electrodes 2702', 2704', 2702", 2704". The resultant spatial distribution of the resistance may then form the captured digital image. In a manner similar to that already being adopted in the CMOS image sensor, a different color filter may be placed on top of the transparent electrode 2702', 2702" of each sensing element 2701', 2701" for achieving color imaging. This may be followed by an antireflection coating layer for enhancing light transmission to the sensing element 2701', 2701".

Figure 27C:
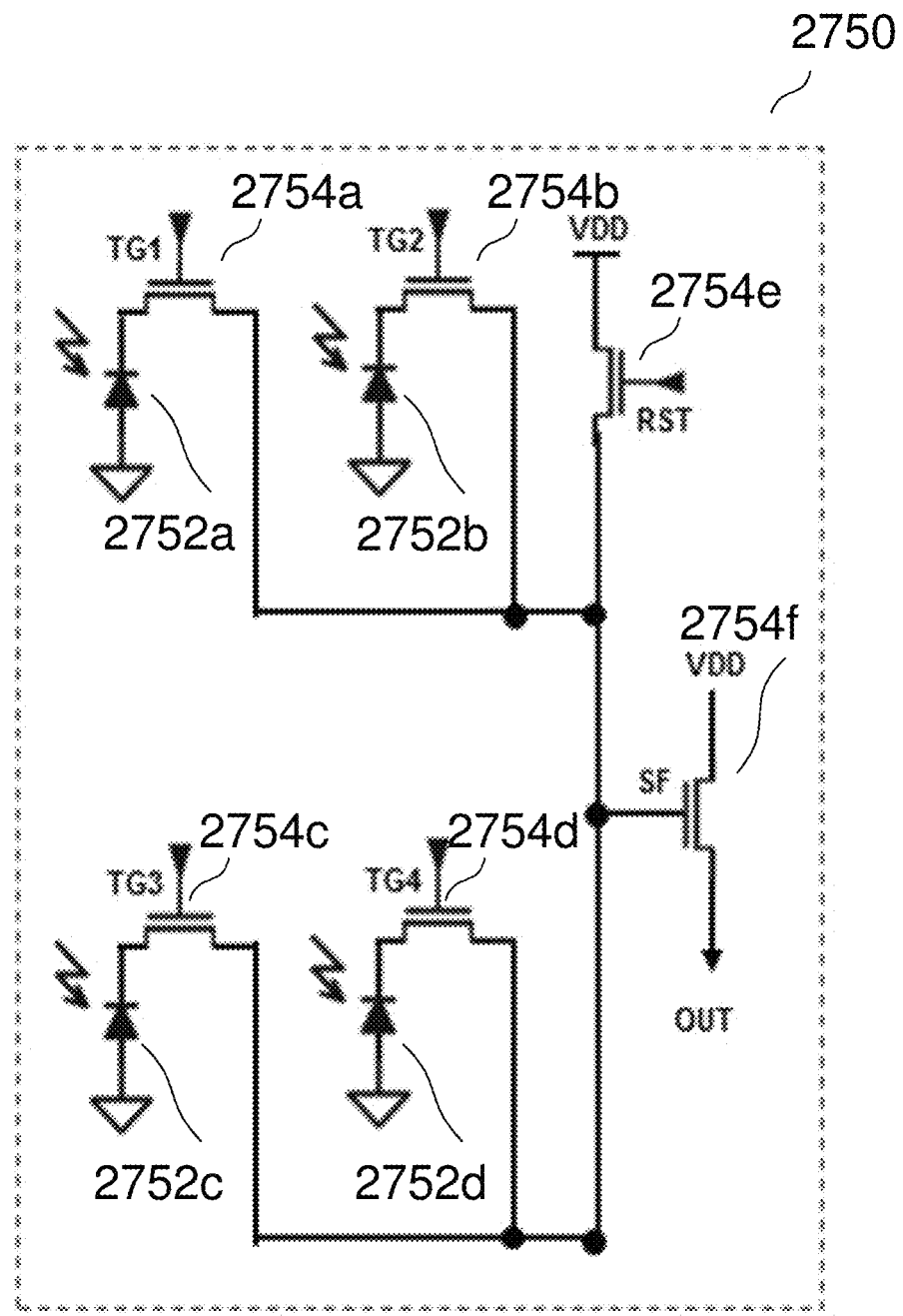
FIG. 27C shows a schematic diagram of a complementary metal oxide semiconductor (CMOS) image sensor with basic configuration block including four photodiodes (pixels) and six control transistors.

FIG. 27C shows a schematic diagram of a complementary metal oxide semiconductor (CMOS) image sensor 2750 with basic configuration block including four photodiodes (pixels) 2752a-d and six control transistors 2754a-f. The final image sensor array may be obtained by repeating the basic configuration block two-dimensionally to achieve the required resolution. Evidently, the basic configuration block for the CMOS image sensor 2750 is much more complicated as compared to that for the oxide image sensor according to various embodiments. In the former, the operation of four photodiodes 2752a-d may require six control transistors 2754a-f. One also has to minimize crosstalk between photodiodes 2752a-d in adjacent blocks by ensuring an adequate spacing between them or specially fabricating an oxide-filled trench isolation structure between them. Such measures may limit scalability and the move towards higher image resolution. Moreover, the fabrication of the CMOS image sensor 2750 may be restricted to the front-end-of-line, as the control transistors 2754a-f would need to possess good electrical characteristics.

Figure 27D:
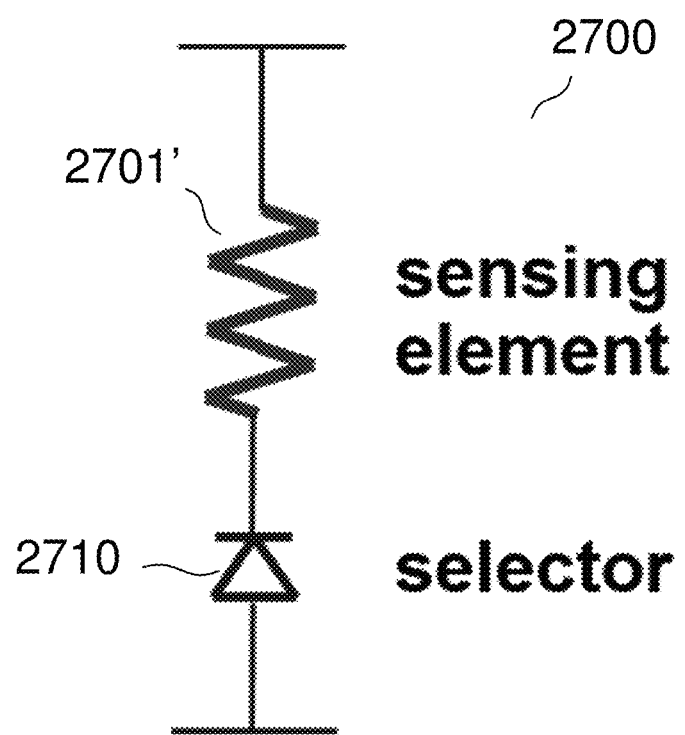
FIG. 27D is a schematic of an image sensor with a sensing element in electrical connection with a selector according to various embodiments.

In contrast, the basic configuration block for the oxide image sensor 2700 may be much simpler, with each sensing element's operation controlled by one selector or diode (meant for eliminating parasitic leakage current from nearby elements). FIG. 27D is a schematic of an image sensor 2700 with a sensing element 2701' in electrical connection with a selector 2710 according to various embodiments. With current studies focusing on oxide-based selectors, it may eventually be possible to realize the entire image sensor using only back-end-of-line processing.

For various embodiments of the image sensor 2700, as light sensing takes place within a nanoscale breakdown region in the oxide, individual sensing elements (e.g. 2701', 2701") may be made small and spaced far apart (relative to the size of the sensing element). This may help overcome the crosstalk issue that the CMOS image sensor 2750 currently faces. In the CMOS image sensor 2750, the minimum spacing between individual photodiodes may be limited by the wavelength of red light (~700-800 nm). Given that the total depth of the photodiode must be sufficiently deep (~1.5 µm) in order for a substantial part of the red light to be absorbed, a spacing below the minimum may result in diffraction and distortion of the image. At present, the spacing between the photodiodes in a CMOS image sensor 2750 is about 1 µm. In contrast, the oxide layer 2706 in the proposed oxide image sensor 2700 may be only several nanometers in thickness. Thus, the minimum spacing between sensing elements may be reduced below the wavelength of red length without suffering from any significant diffraction effect. This could help to improve the resolution of the image sensor 2700.

To-date, the inventors have found $SiO_2$, $HfO_2$ and $ZrO_2$ dielectrics to exhibit light-sensing capability. These dielectric materials are already deployed in IC manufacturing and may be fully compatible with the mainstream fabrication technology.

Gate Oxide Reliability Rejuvenation

The gate oxide is a critical component of the metal oxide field effect transistor (MOSFET), the basic building block of nearly all ICs. Under continuous electrical stimulation, breakdown of the gate oxide after some time of IC operation. Gate oxide breakdown causes parametric drifts to occur in the MOSFET, which in turn impact circuit operation. Depending on the extent of such drifts (which in turn depends on the degree of gate oxide breakdown), circuit functionality failure may occur. The negative photoconductivity phenomenon may be exploited for restoring soft-breakdown gate oxide to its pre-breakdown state, since exposure to light may permanently eradicate the conducting filament formed during the breakdown.

Actual implementation of the gate oxide reliability rejuvenation method may include a light-emitting diode (LED) integrated on-chip next to the circuit of interest. During normal operation, the LED is turned off. Upon the detection of a gate oxide breakdown event, the LED is turned on for the required period of time for the purpose of restoring the breakdown oxide region.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. An image sensor comprising:
   a plurality of first electrodes for electrically coupling to a first supply voltage;
   a plurality of second electrodes for electrically coupling to a second supply voltage;
   an oxide dielectric layer between the plurality of first electrodes and the plurality of second electrodes, the oxide dielectric layer comprising a plurality of oxide dielectric elements, each respective oxide dielectric element configured to form a conductive filament upon a potential difference between the first supply voltage and the second supply voltage exceeding a threshold level, thereby decreasing a resistance of the respective oxide dielectric element;
   a detector; and
   a lens system for directing the optical light to the plurality of sensor elements;
   wherein the plurality of first electrodes is configured to allow the optical light to pass through the plurality of first electrodes to the oxide dielectric layer; and
   wherein the detector is configured to detect an increase in the resistance of the respective oxide dielectric element upon the respective oxide dielectric element receiving the optical light.

2. The image sensor according to claim 1,
   wherein each respective oxide dielectric element is a portion of the oxide dielectric layer between a portion of a corresponding second electrode and a portion of a corresponding first electrode over the portion of the corresponding second electrode.

3. The image sensor according to claim 1, further comprising:
   a plurality of selectors, each of the plurality of selectors electrically coupled to a sensor element.

4. The image sensor according to claim 1, further comprising:
a colour filter over the plurality of sensor elements.

5. The image sensor according to claim 1, further comprising:
an antireflection coating layer over the plurality of sensor elements.

6. A method of forming an image sensor, the method comprising:
forming a plurality of first electrodes for electrically coupling to a first supply voltage;
forming a plurality of second electrodes for electrically coupling to a second supply voltage;
forming an oxide dielectric layer between the plurality of first electrodes and plurality of second electrodes, the oxide dielectric layer comprising a plurality of oxide dielectric elements, each respective oxide dielectric element configured to form a conductive filament upon a potential difference between the first supply voltage and the second supply voltage exceeding a threshold level, thereby decreasing a resistance of the respective oxide dielectric element;
providing a detector; and
forming a lens system for directing the optical light to the plurality of sensor elements;
wherein the plurality of first electrodes is configured to allow the optical light to pass through the plurality of first electrodes to the oxide dielectric layer; and
wherein the detector is configured to detect an increase in the resistance of the respective oxide dielectric element upon the respective oxide dielectric element receiving the optical light.

7. The method according to claim 6,
wherein the plurality of first electrodes is formed extending in parallel to one another along a first direction in a first plane; and
wherein the plurality of second electrodes is formed extending in parallel to one another along a second direction in a second plane parallel to the first plane, the second direction perpendicular to the first direction.

8. The method according to claim 6,
wherein each of the plurality of first electrodes is transparent.

9. The method according to claim 6,
wherein each of the plurality of first electrodes comprises a transparent conductive oxide.

10. The method according to claim 6,
wherein each of the plurality of oxide dielectric elements comprises any one oxide selected from a group consisting of zirconium oxide, silicon oxide, hafnium oxide, aluminium oxide, yttrium oxide, scandium oxide, zinc oxide, a bismuth based oxide, and any combination thereof.

11. A method of operating an image sensor, the method comprising:
electrically coupling a plurality of first electrodes to a first supply voltage;
electrically coupling a plurality of second electrodes to a second supply voltage;
forming a conductive filament in each respective oxide dielectric element of the oxide dielectric layer between the plurality of first electrodes and the plurality of second electrodes to decrease a resistance of the respective oxide dielectric element, by applying a potential difference between the first supply voltage and the second supply voltage that exceeds a threshold voltage across the respective oxide dielectric element; and
detecting, by using a detector, an increase in the resistance of the respective oxide dielectric element upon the respective oxide dielectric element receiving an optical light to sense the optical light which passes through the plurality of first electrodes to the oxide dielectric layer;
wherein the optical light is directed to the plurality of sensor elements by a lens system.

* * * * *